(12) United States Patent
Liu et al.

(10) Patent No.: US 9,698,153 B2
(45) Date of Patent: Jul. 4, 2017

(54) VERTICAL NAND AND METHOD OF MAKING THEREOF USING SEQUENTIAL STACK ETCHING AND SELF-ALIGNED LANDING PAD

(71) Applicant: SANDISK TECHNOLOGIES INC., Plano, TX (US)

(72) Inventors: Jin Liu, Milpitas, CA (US); Yanli Zhang, San Jose, CA (US); Murshed Chowdhury, Fremont, CA (US); Raghuveer S. Makala, Campbell, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/080,269

(22) Filed: Mar. 24, 2016

(65) Prior Publication Data

US 2016/0204117 A1    Jul. 14, 2016

Related U.S. Application Data

(63) Continuation-in-part of application No. 14/207,012, filed on Mar. 12, 2014, now Pat. No. 9,515,080,
(Continued)

(51) Int. Cl.
*H01L 27/00* (2006.01)
*H01L 27/1157* (2017.01)
(Continued)

(52) U.S. Cl.
CPC .... *H01L 27/1157* (2013.01); *H01L 21/28273* (2013.01); *H01L 21/8221* (2013.01);
(Continued)

(58) Field of Classification Search
CPC ....... H01L 2224/32145; H01L 27/0688; H01L 27/11556; H01L 27/11582;
(Continued)

(56) References Cited

U.S. PATENT DOCUMENTS 7,177,191 B2    2/2007    Fasoli et al.
7,221,588 B2    5/2007    Fasoli et al.
(Continued)

FOREIGN PATENT DOCUMENTS

EP         1398831 A2    3/2004
WO     WO02/15277 A2    2/2002
(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Ngan Ngo
(74) *Attorney, Agent, or Firm* — The Marbury Law Group PLLC

(57) ABSTRACT

Alignment between memory openings through multiple tier structures can be facilitated employing a temporary landing pad. The temporary landing pad can have a greater area than the horizontal cross-sectional area of a first memory opening through a first tier structure including a first alternating stack of first insulating layers and first spacer material layers. An upper portion of a first memory film is removed, and a sidewall of an insulating cap layer that defines the first memory opening can be laterally recessed to form a recessed cavity. A sacrificial fill material is deposited in the recessed cavity to form a sacrificial fill material portion, which functions as the temporary landing pad for a second memory
(Continued)

opening that is subsequently formed through a second tier structure including second insulating layers and second spacer material layers. A memory stack structure can be formed through the first and second tier structures.

11 Claims, 59 Drawing Sheets

Related U.S. Application Data which is a continuation of application No. PCT/US2014/023276, filed on Mar. 11, 2014, application No. 15/080,269, which is a continuation-in-part of application No. 14/611,785, filed on Feb. 2, 2015, now Pat. No. 9,230,987.

(60) Provisional application No. 61/776,953, filed on Mar. 12, 2013.

(51) Int. Cl.
| | |
|---|---|
| H01L 27/11582 | (2017.01) |
| H01L 21/28 | (2006.01) |
| H01L 21/822 | (2006.01) |
| H01L 27/11551 | (2017.01) |
| H01L 27/06 | (2006.01) |
| H01L 27/11524 | (2017.01) |
| H01L 27/11578 | (2017.01) |
| H01L 29/66 | (2006.01) |
| H01L 29/788 | (2006.01) |
| H01L 29/792 | (2006.01) |
| H01L 27/11556 | (2017.01) |

(52) U.S. Cl.
CPC .... *H01L 27/0688* (2013.01); *H01L 27/11524* (2013.01); *H01L 27/11551* (2013.01); *H01L 27/11556* (2013.01); *H01L 27/11578* (2013.01); *H01L 27/11582* (2013.01); *H01L 29/66825* (2013.01); *H01L 29/66833* (2013.01); *H01L 29/7889* (2013.01); *H01L 29/7926* (2013.01); *H01L 2224/32145* (2013.01)

(58) Field of Classification Search
CPC ......... H01L 27/11551; H01L 27/11524; H01L 27/11578; H01L 27/1157; H01L 21/8221
See application file for complete search history.

(56) References Cited

U.S. PATENT DOCUMENTS

| | | | |
|---|---|---|---|
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,349,681 B2 | 1/2013 | Alsmeier et al. | |
| 8,394,716 B2 | 3/2013 | Hwang et al. | |
| 8,445,347 B2 | 5/2013 | Alsmeier | |
| 8,614,126 B1 | 12/2013 | Lee et al. | |
| 8,658,499 B2 | 2/2014 | Makala et al. | |
| 8,741,761 B2 | 6/2014 | Lee et al. | |
| 8,828,884 B2 | 9/2014 | Lee et al. | |
| 8,847,302 B2 | 9/2014 | Alsmeier et al. | |
| 8,878,278 B2 | 11/2014 | Alsmeier et al. | |
| 8,884,357 B2 | 11/2014 | Wang et al. | |
| 8,946,023 B2 | 2/2015 | Makala et al. | |
| 9,397,111 B1* | 7/2016 | Chowdhury | ........ H01L 27/1157 |
| 9,576,967 B1* | 2/2017 | Kimura | ............... H01L 27/1157 |
| 2006/0003531 A1 | 1/2006 | Chang et al. | |
| 2006/0258076 A1 | 11/2006 | Mizushima et al. | |
| 2007/0210338 A1 | 9/2007 | Orlowski | |
| 2007/0252201 A1 | 11/2007 | Kito et al. | |
| 2008/0067583 A1 | 3/2008 | Kidoh et al. | |
| 2008/0169496 A1 | 7/2008 | Keller et al. | |
| 2009/0026561 A1 | 1/2009 | Reichenbach et al. | |
| 2009/0097309 A1 | 4/2009 | Mizukami et al. | |
| 2009/0121271 A1 | 5/2009 | Son et al. | |
| 2009/0242967 A1 | 10/2009 | Katsumata et al. | |
| 2010/0044778 A1 | 2/2010 | Seol | |
| 2010/0059811 A1 | 3/2010 | Sekine et al. | |
| 2010/0109065 A1 | 5/2010 | Oh et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0171162 A1 | 7/2010 | Katsumata et al. | |
| 2010/0181610 A1 | 7/2010 | Kim et al. | |
| 2010/0207195 A1 | 8/2010 | Fukuzumi et al. | |
| 2010/0213458 A1 | 8/2010 | Prall | |
| 2010/0320528 A1 | 12/2010 | Jeong et al. | |
| 2011/0002178 A1 | 1/2011 | Hwang et al. | |
| 2011/0057251 A1 | 3/2011 | Higashi | |
| 2011/0065270 A1 | 3/2011 | Shim et al. | |
| 2011/0076819 A1 | 3/2011 | Kim et al. | |
| 2011/0133606 A1 | 6/2011 | Yoshida et al. | |
| 2011/0151667 A1 | 6/2011 | Hwang et al. | |
| 2011/0163449 A1 | 7/2011 | Kelly et al. | |
| 2011/0266606 A1 | 11/2011 | Park et al. | |
| 2011/0287612 A1 | 11/2011 | Lee et al. | |
| 2011/0312174 A1 | 12/2011 | Lee et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0003800 A1 | 1/2012 | Lee et al. | |
| 2012/0049268 A1 | 3/2012 | Chang et al. | |
| 2012/0052674 A1 | 3/2012 | Lee et al. | |
| 2012/0068242 A1 | 3/2012 | Shin et al. | |
| 2012/0100700 A1 | 4/2012 | Kim | |
| 2012/0104484 A1 | 5/2012 | Lee | |
| 2012/0140562 A1 | 6/2012 | Choe et al. | |
| 2012/0153376 A1 | 6/2012 | Alsmeier et al. | |
| 2012/0170369 A1 | 7/2012 | Kim et al. | |
| 2012/0241842 A1 | 9/2012 | Matsuda | |
| 2012/0256247 A1 | 10/2012 | Alsmeier et al. | |
| 2012/0261638 A1 | 10/2012 | Sills et al. | |
| 2012/0267701 A1 | 10/2012 | Chae et al. | |
| 2012/0276719 A1 | 11/2012 | Han et al. | |
| 2012/0327715 A1 | 12/2012 | Lee et al. | |
| 2013/0044531 A1 | 2/2013 | Baek et al. | |
| 2013/0059422 A1 | 3/2013 | Lee et al. | |
| 2013/0207178 A1 | 8/2013 | Lee et al. | |
| 2013/0237025 A1 | 9/2013 | Yang | |
| 2013/0248974 A1 | 9/2013 | Alsmeier | |
| 2013/0264631 A1 | 10/2013 | Alsmeier et al. | |
| 2013/0313627 A1 | 11/2013 | Lee et al. | |
| 2013/0313717 A1 | 11/2013 | Holmes et al. | |
| 2014/0008714 A1 | 1/2014 | Makala et al. | |
| 2014/0241060 A1* | 8/2014 | Ha | ........................ G11C 16/04 365/185.11 |
| 2014/0264525 A1 | 9/2014 | Takahashi et al. | |
| 2014/0273373 A1 | 9/2014 | Makala et al. | |
| 2015/0206587 A1* | 7/2015 | Hasegawa | ........... H01L 27/0694 365/185.17 |
| 2015/0279855 A1* | 10/2015 | Lu | ....................... H01L 27/1157 257/66 |

FOREIGN PATENT DOCUMENTS

| | | | |
|---|---|---|---|
| WO | WO2008/118433 A1 | 10/2008 | |

(56) References Cited

FOREIGN PATENT DOCUMENTS

| WO | WO2009/085078 A1 | 7/2009 |
|---|---|---|
| WO | WO2012/003301 A2 | 1/2012 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Li et al., "Sacrificial Polymers for Nanofluidic Channels in Biological Applications", Nanotechnology 14 (2003) 578-583.
International Search Report and Written Opinion, International Application No. PCT/US2014/023276, issued Jun. 30, 2014 (13 pages).
International Search Report and Written Opinion, International Application No. PCT/US2014/020290, issued Jun. 25, 2014.
Office Action, Non Final Rejection for U.S. Appl. No. 14/585,912, dated Apr. 7, 2016, 30 pages.

\* cited by examiner

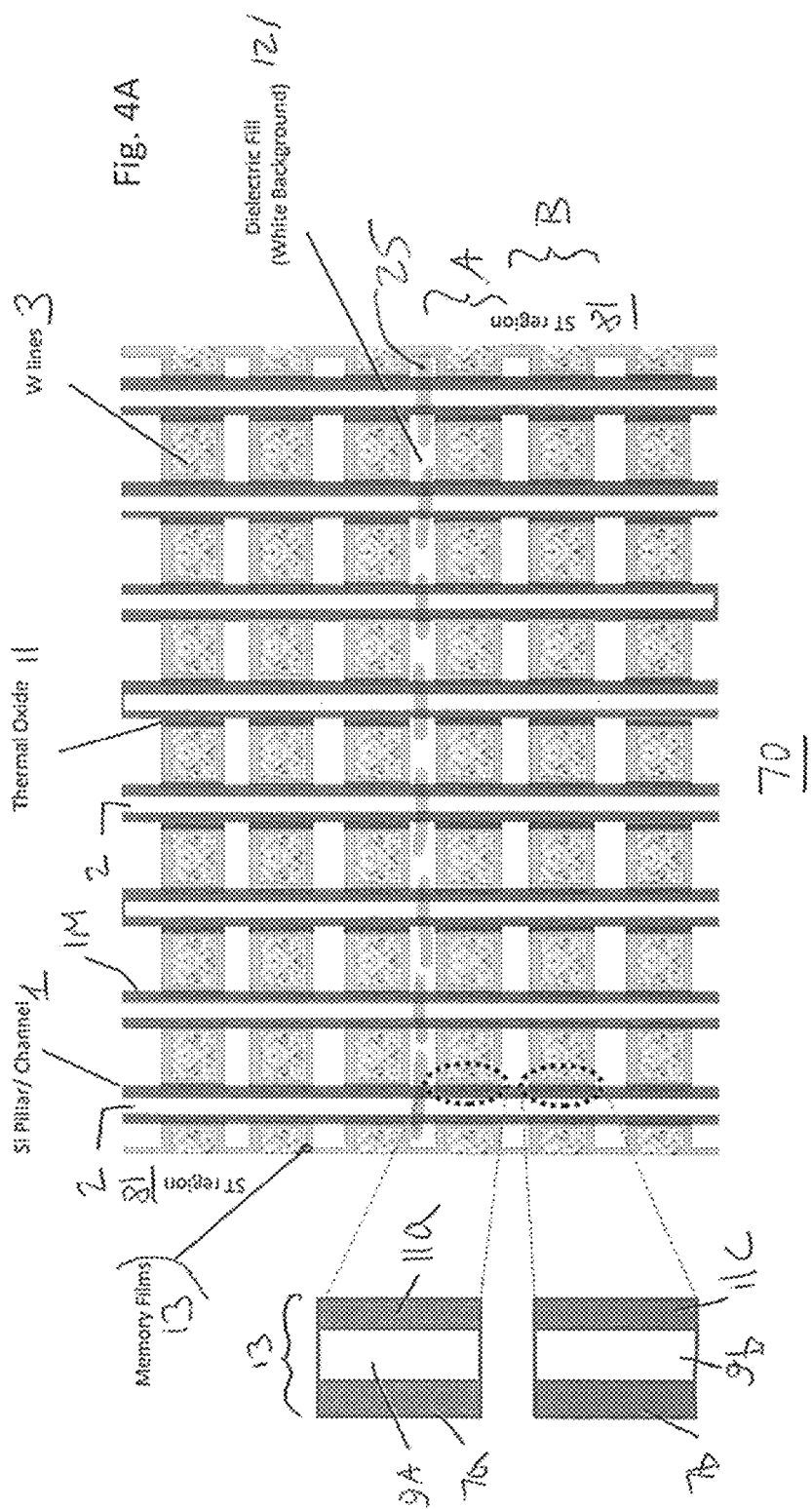

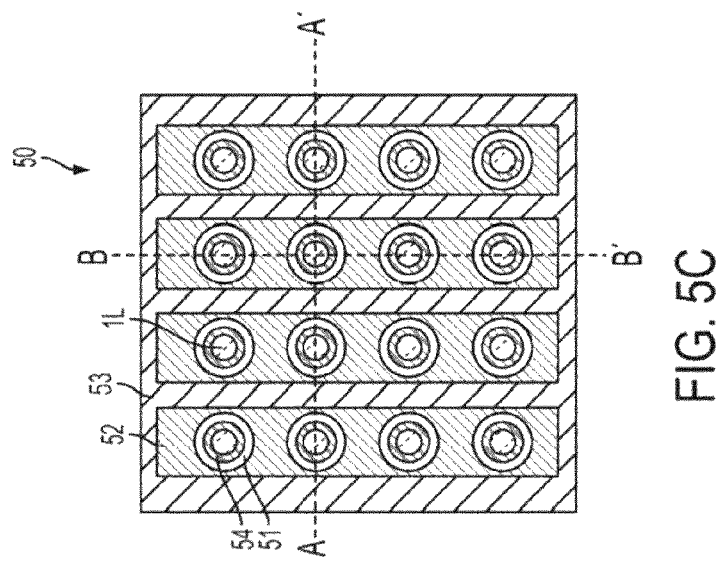
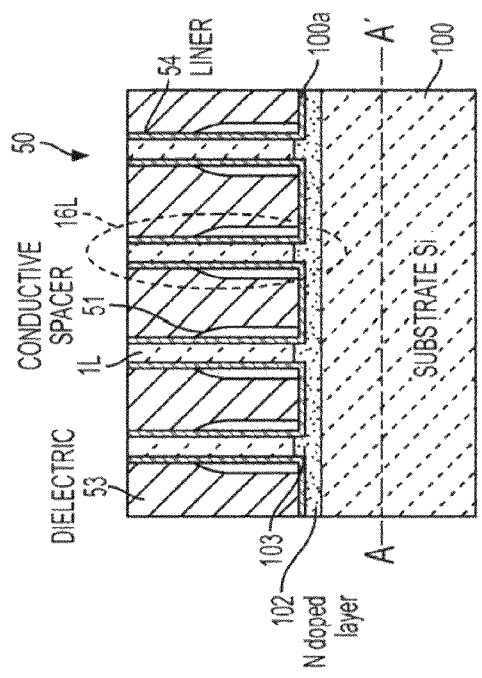
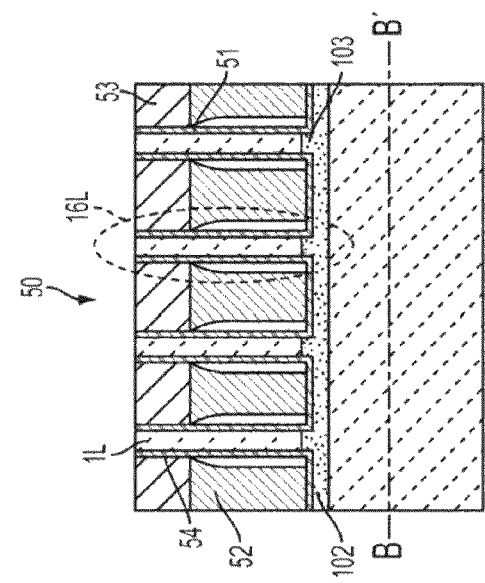
FIG. 5A
FIG. 5B
FIG. 5C

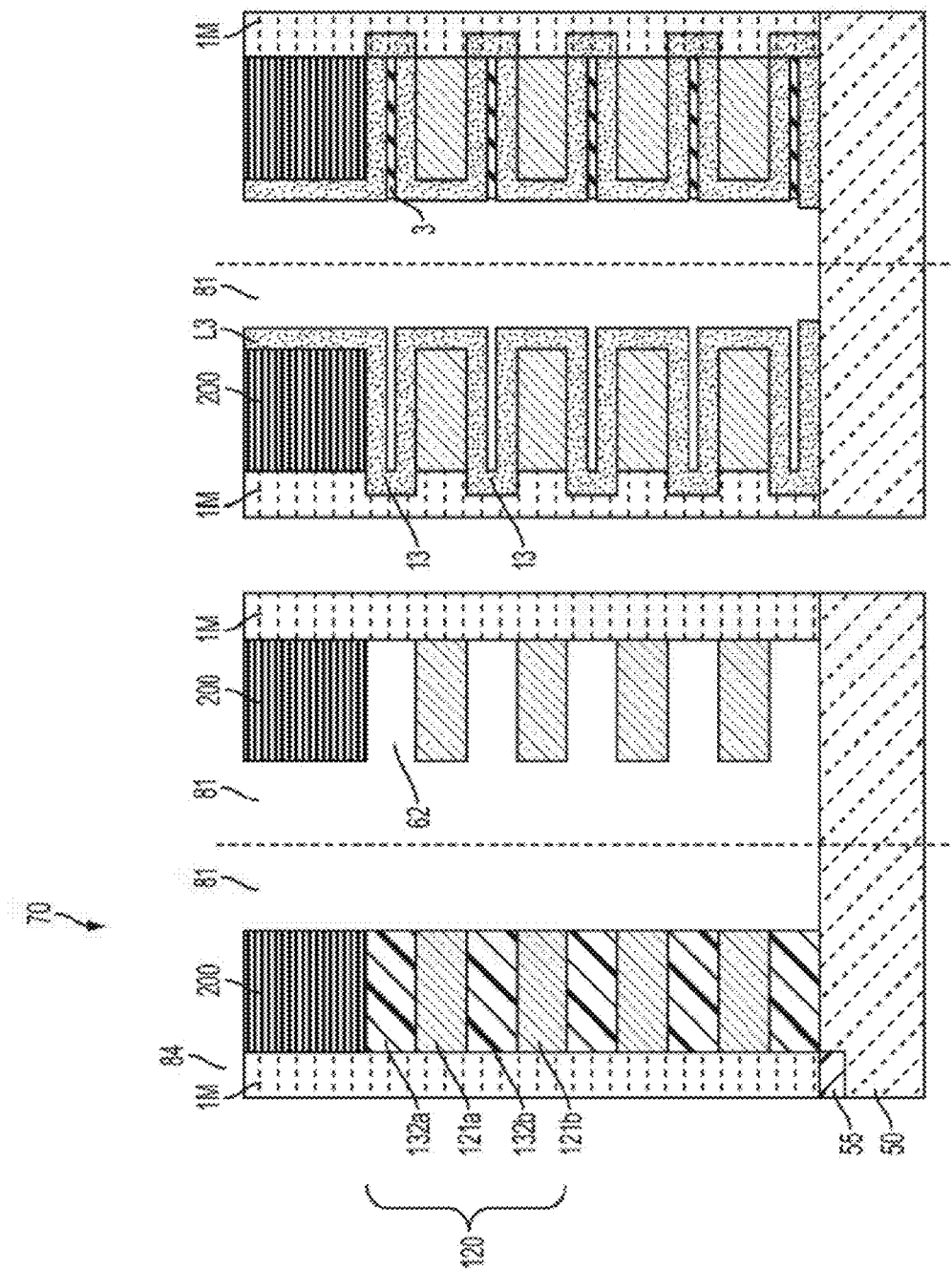

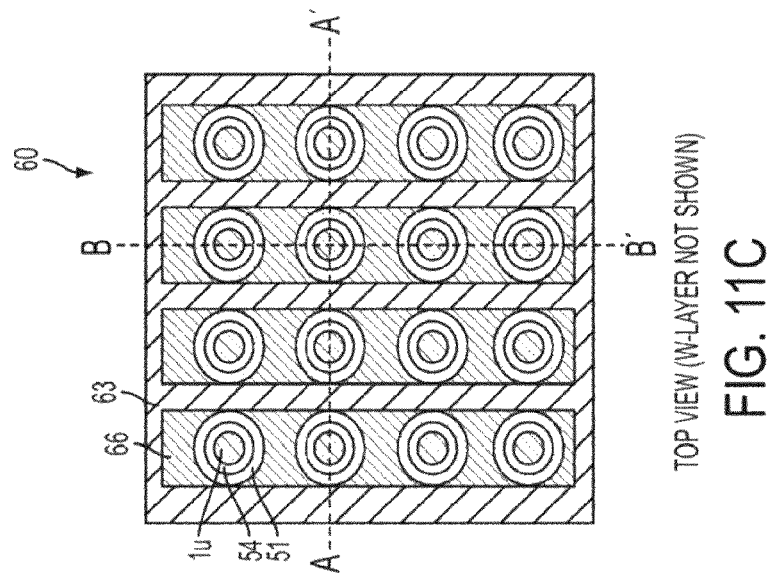
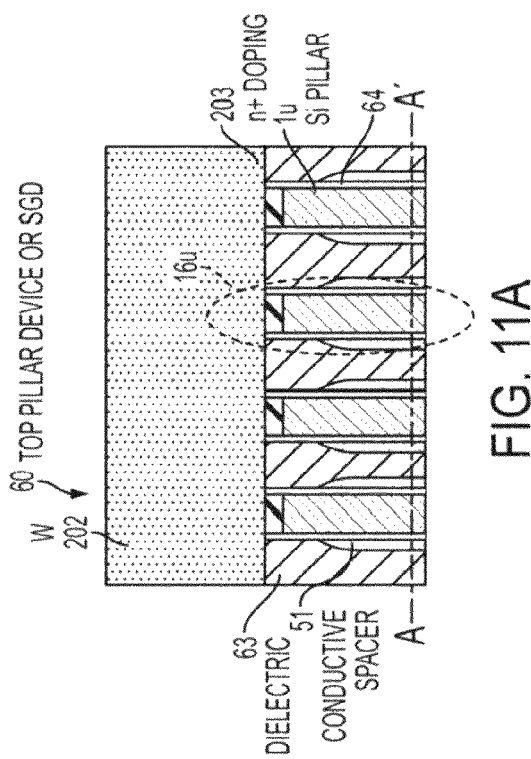
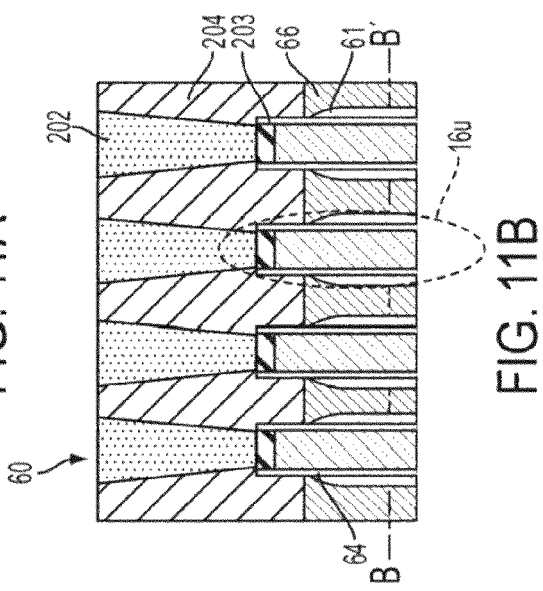
FIG. 11A
FIG. 11B
FIG. 11C

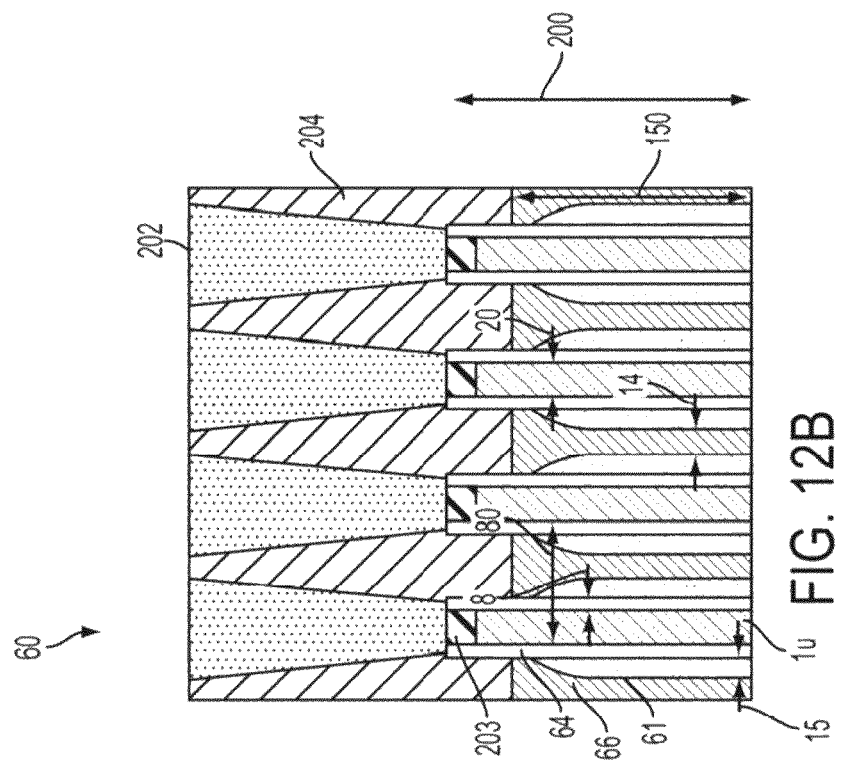
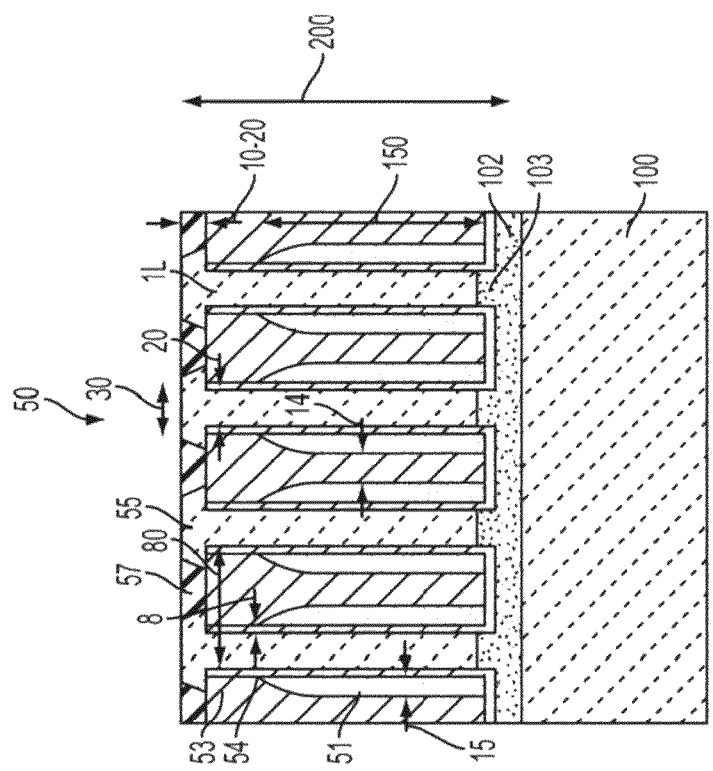
FIG. 12A
FIG. 12B

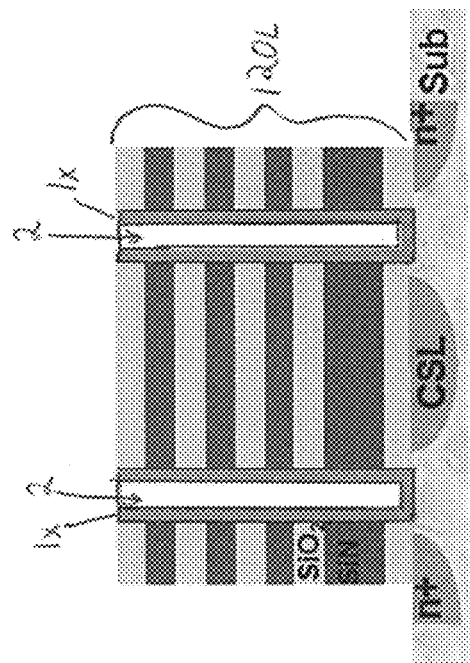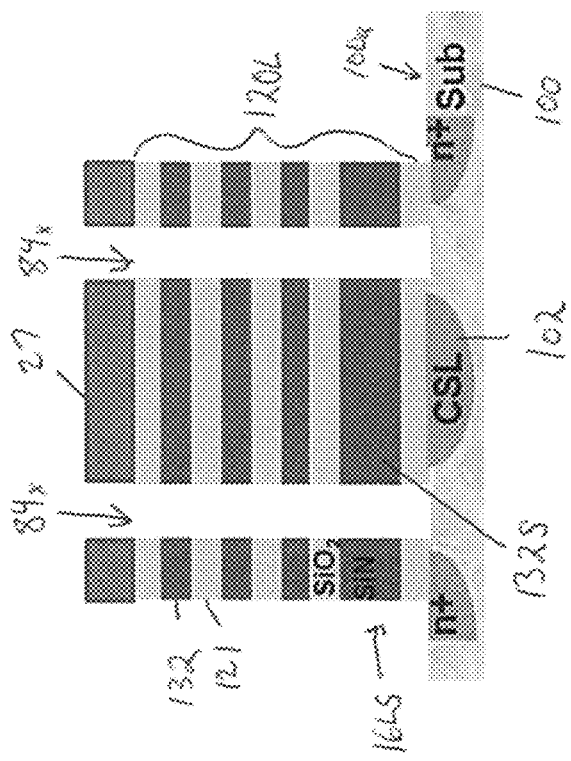
Fig. 15A
Fig. 15B

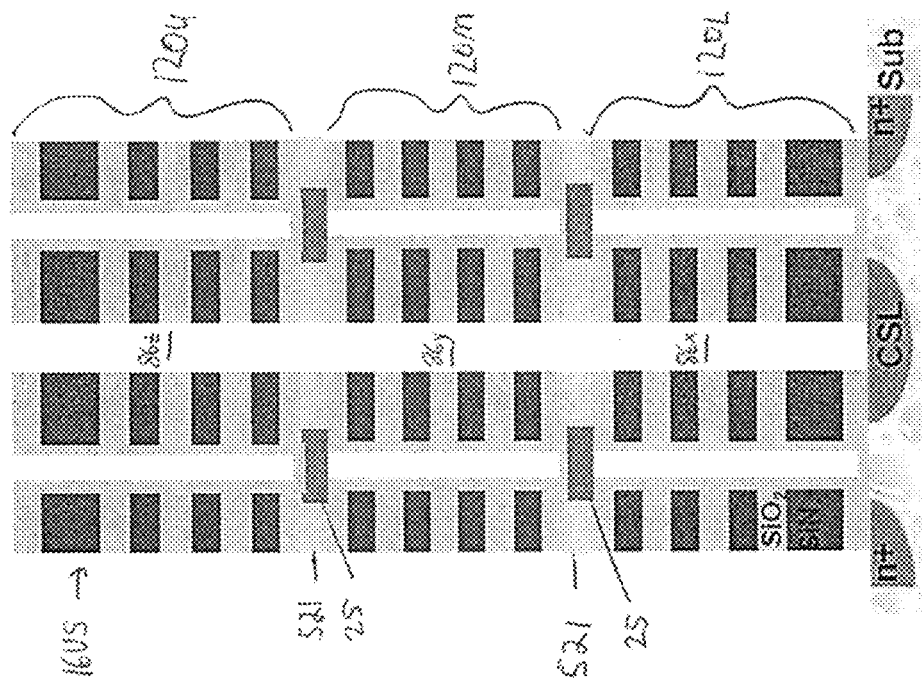
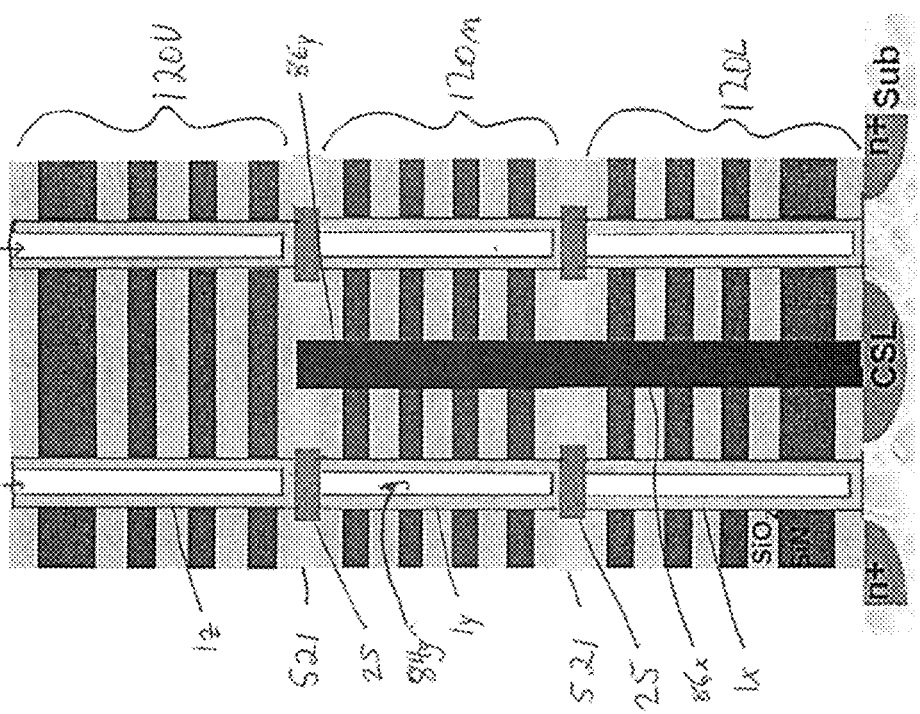

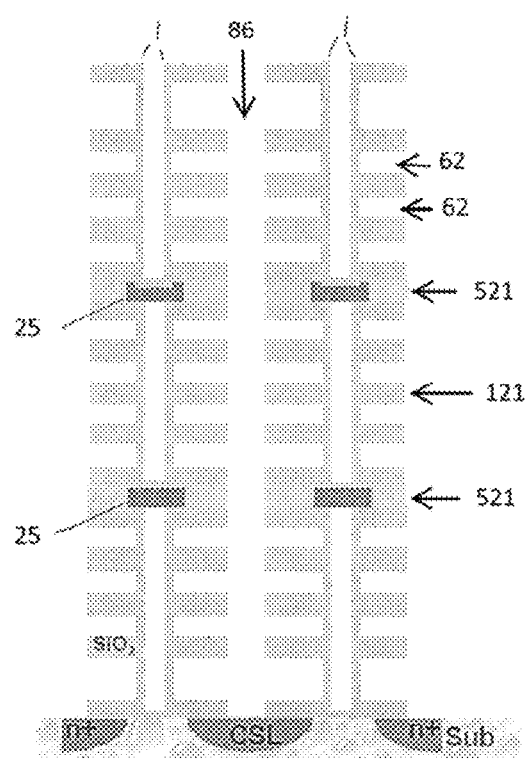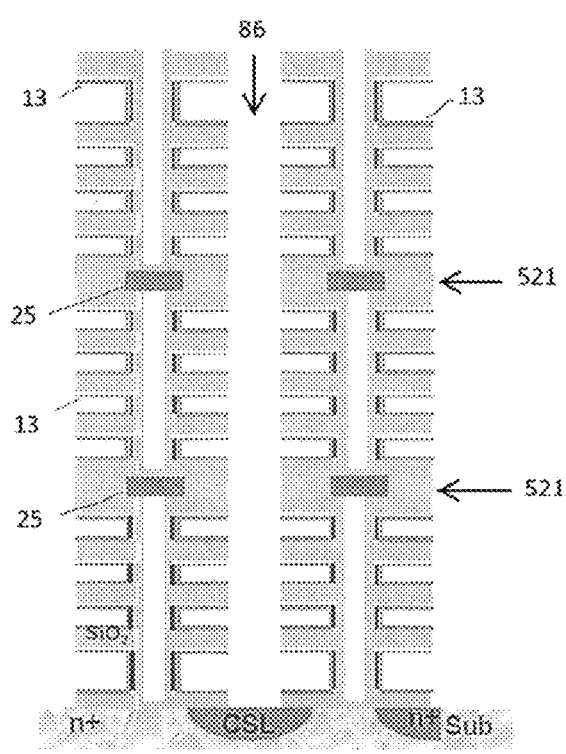

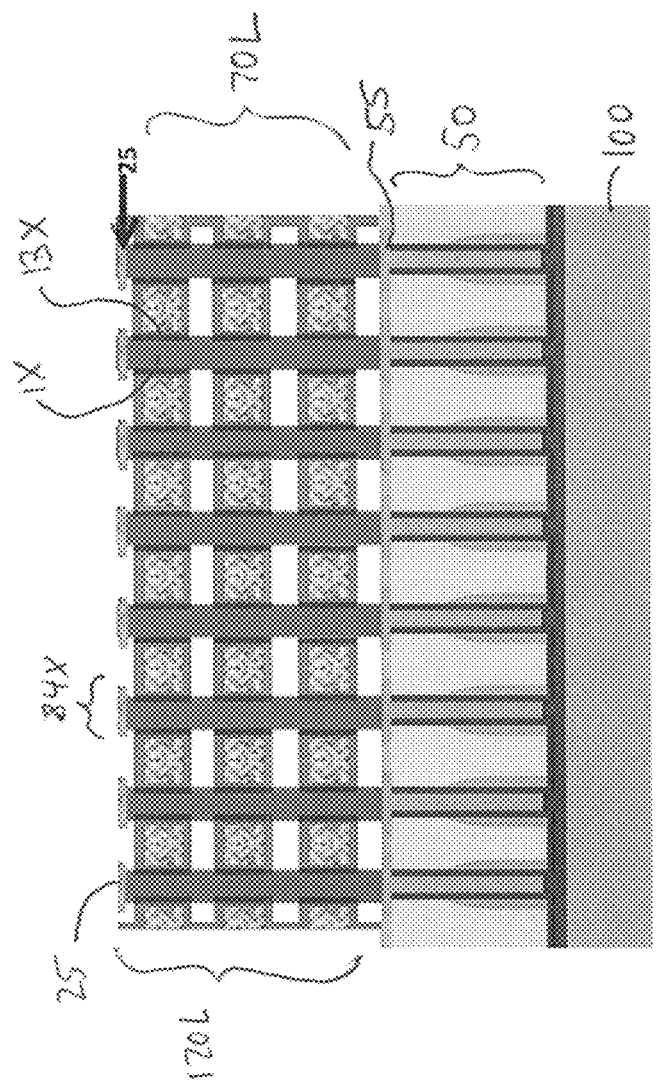

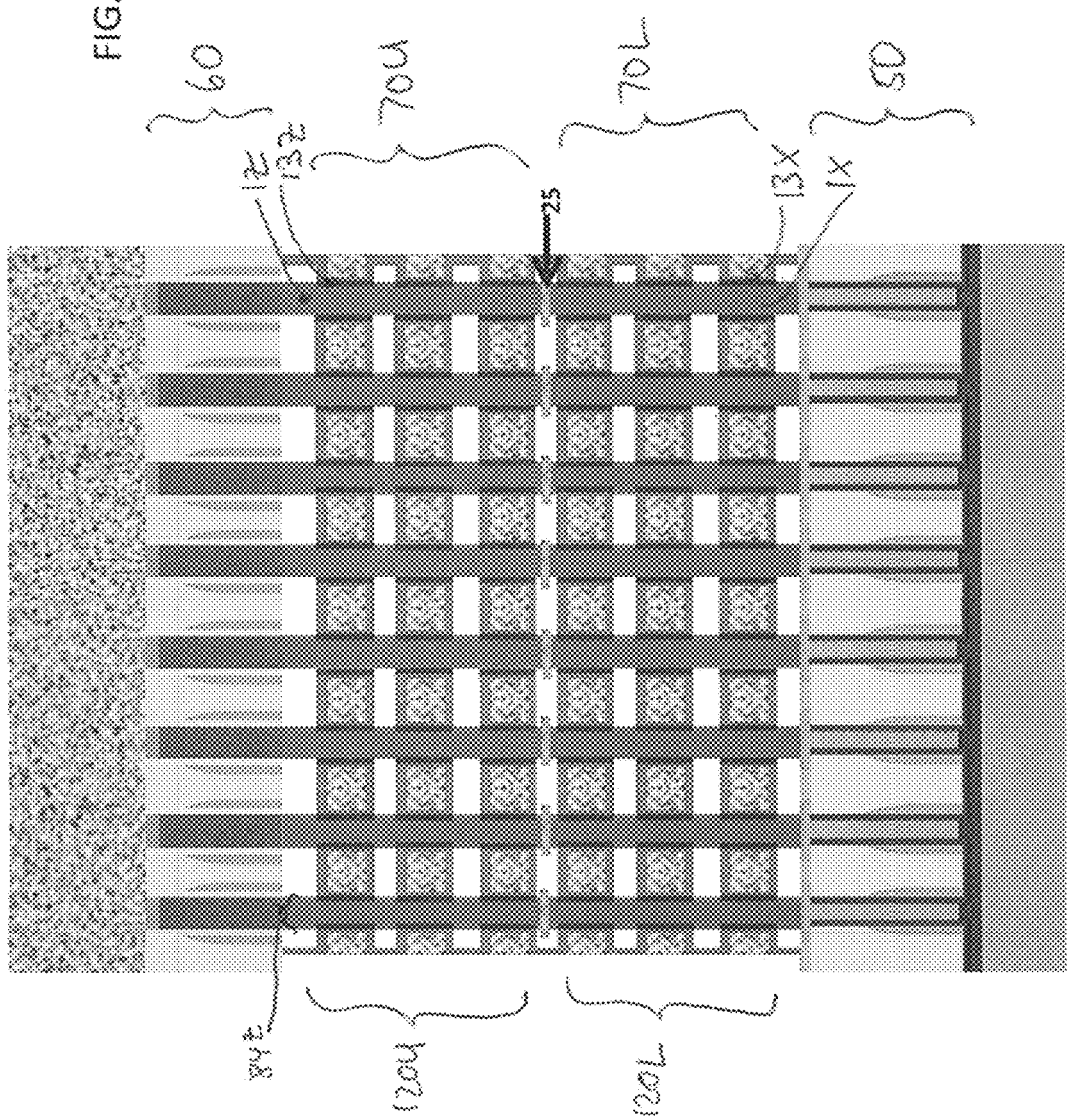

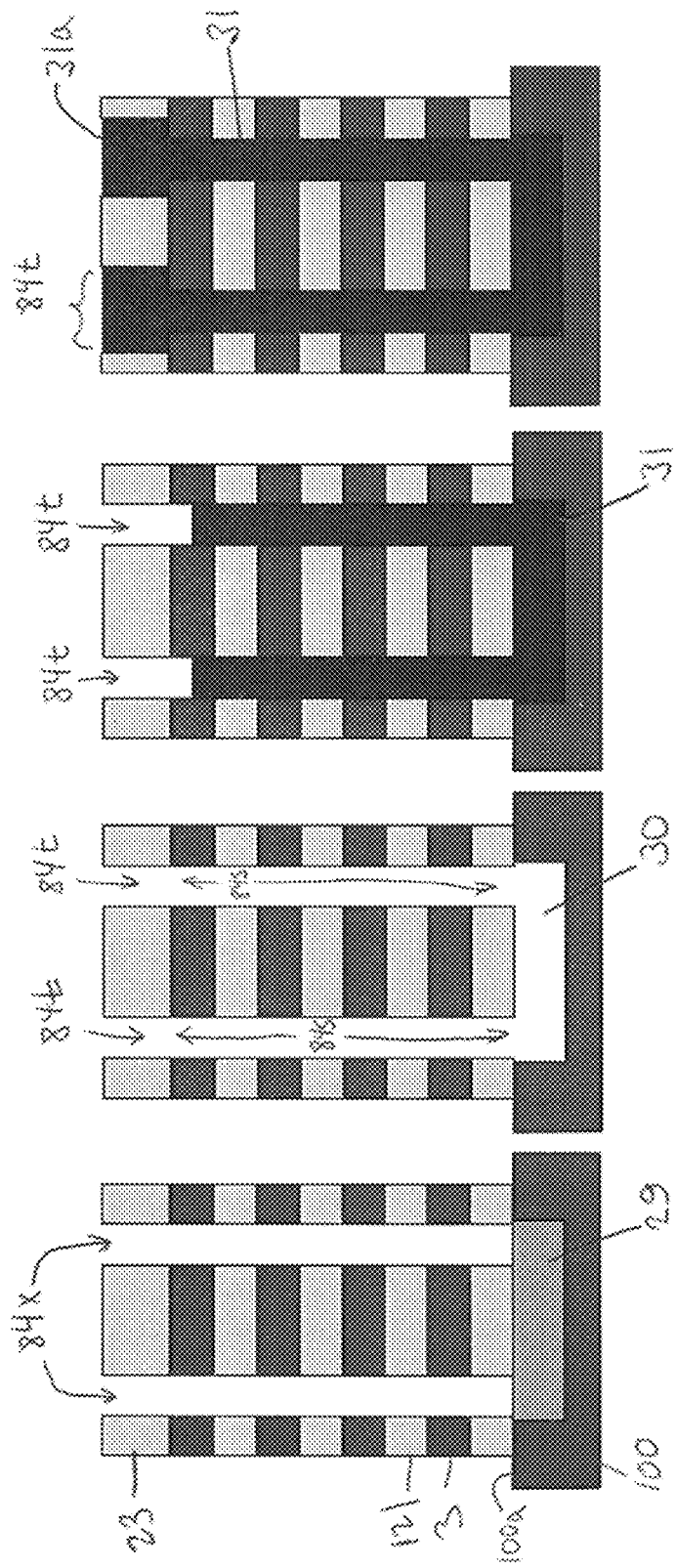

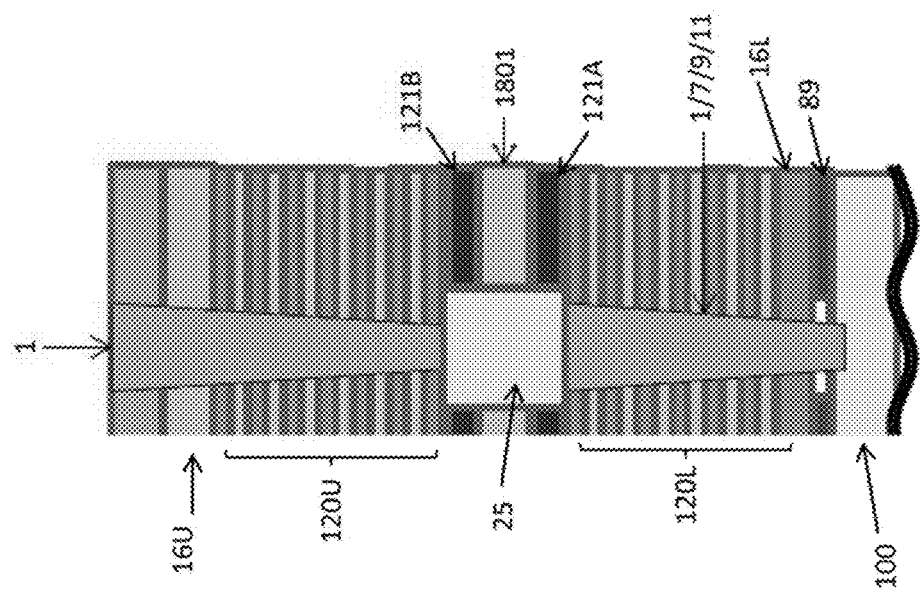

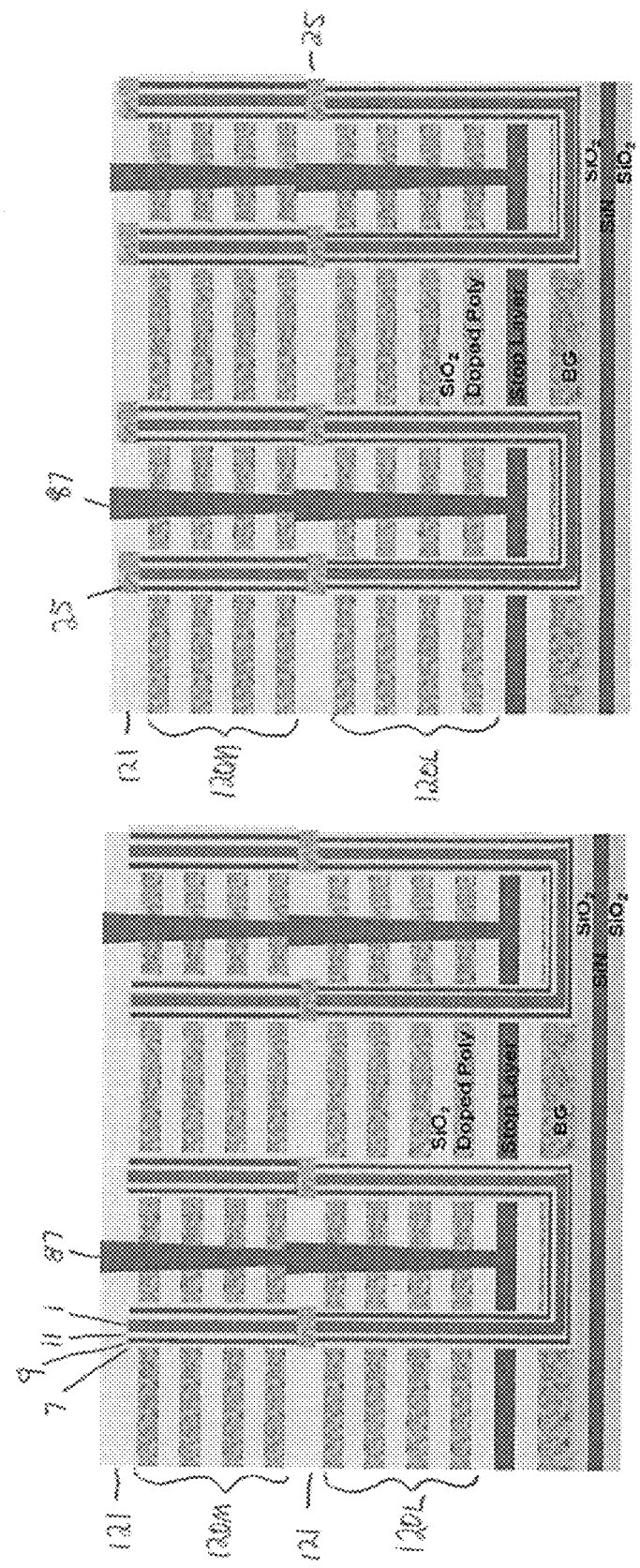

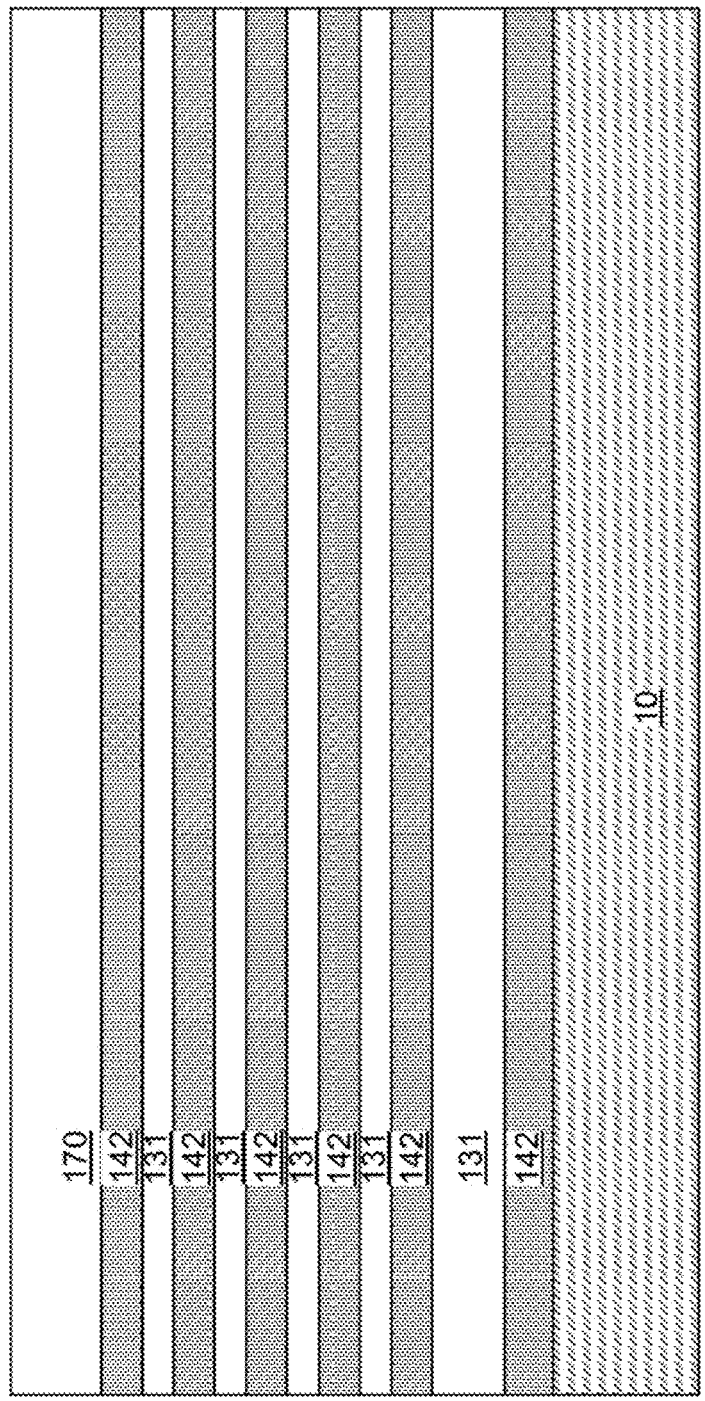

VERTICAL NAND AND METHOD OF MAKING THEREOF USING SEQUENTIAL STACK ETCHING AND SELF-ALIGNED LANDING PAD

RELATED APPLICATIONS

This application is a continuation-in-part application of U.S. patent application Ser. No. 14/207,012 filed on Mar. 12, 2014, which is a continuation of PCT International Application Serial No. PCT/US14/23276 filed in Mar. 11, 2014, which claims benefit of U.S. Provisional Patent Application Ser. No. 61/776,953, filed on Mar. 12, 2013, and this application is a continuation-in-part application of U.S. patent application Ser. No. 14/611,785 filed on Feb. 2, 2015, the entire contents of all of the above applications is incorporated herein by reference in their entirety.

FIELD

The present disclosure relates generally to the field of semiconductor devices and specifically to three dimensional vertical NAND strings and other three dimensional devices and methods of making thereof.

BACKGROUND

Examples of prior art three dimensional vertical NAND strings are illustrated in FIGS. 1A and 1B. The device shown in FIG. 1A is known in the art as terabit cell array transistor ("TCAT") array. It includes damascened metal gate SONOS type cells in the vertical NAND flash string formed by a gate replacement process (see Jang, et al., "Vertical cell array using TCAT (Terabit Cell Array Transistor) technology for ultra high density NAND flash memory," 2009 Symposium on VLSI Technology Digest of Technical Papers, pages 192-193, Jun. 16 2009, Honolulu, Hi., incorporated herein by reference in its entirety).

The device shown in FIG. 1B is known in the art as Pipe-shaped Bit Cost Scalable ("P-BiCS") flash memory (see Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pages 136-137, Jun. 16 2009, Honolulu, Hi., incorporated herein by reference in its entirety).

SUMMARY

According to an aspect of the present disclosure, a monolithic three-dimensional memory device is provided, which comprises: a first tier structure located over a top surface of a substrate and comprising a first alternating stack of first insulating layers and first electrically conductive layers; an insulating cap layer overlying the first tier structure; a second tier structure located over the insulating cap layer and comprising a second alternating stack of second insulating layers and second electrically conductive layers; and a memory stack structure comprising a first memory film located within the first tier structure, a second memory film located within the second tier structure, and a semiconductor channel that extends through the second tier structure, the insulating cap layer, and the first tier structure, wherein the semiconductor channel contacts the insulating cap layer.

According to another aspect of the present disclosure, a method of forming a monolithic three-dimensional memory device comprises forming a first memory opening through a first stack of first insulating layers and second layers and through an insulating cap layer located over the first stack, forming a first sacrificial material in a bottom part of the first memory opening, widening a top part of the first memory opening such that it has a larger width than the bottom part of the first memory opening, forming a second sacrificial material in the top part of the first memory opening, forming a second stack of second insulating layers and third layers over the insulating cap layer, forming a second memory opening through the second alternating stack, removing the first and second sacrificial material from the first memory opening through the second memory opening, and forming a semiconductor channel which extends through the bottom part of the first memory opening, the top part of the first memory opening and the second memory opening.

In one embodiment, the step of forming the first memory opening through the first stack of first insulating layers and second layers and through the insulating cap layer located over the first stack comprises forming the first memory opening through a first alternating stack of first insulating layers and first spacer material layers and through the insulating cap layer. In one embodiment, the step of forming the first sacrificial material in the bottom part of the first memory opening comprises forming a sacrificial pillar structure. In one embodiment, the step of widening the top part of the first memory opening such that it has the larger width than the bottom part of the first memory opening comprises forming a recess cavity laterally protruding farther than a sidewall of the first memory opening at an upper portion of the first memory opening. In one embodiment, the step of forming the second sacrificial material in the top part of the first memory opening comprises forming a temporary landing pad by filling the recess cavity with a disposable fill material. In one embodiment, the step of forming the second stack of second insulating layers and third layers over the insulating cap layer comprises forming a second alternating stack of second insulating layers and second spacer material layers over the insulating cap layer. In one embodiment, the step of removing the first and second sacrificial material from the first memory opening through the second memory opening comprises removing the sacrificial pillar structure and the temporary landing pad from underneath the second memory opening to form a laterally protruding cavity. In one embodiment, the step of forming the semiconductor channel which extends through the bottom part of the first memory opening, the top part of the first memory opening and the second memory opening comprises forming the semiconductor channel in the first memory opening, the laterally protruding cavity, and the second memory opening.

According to another aspect of the present disclosure, a method of forming a monolithic three-dimensional memory device, comprises forming a first memory opening through a first alternating stack of first insulating layers and first spacer material layers and through an insulating cap layer, forming a first memory film in the first memory opening, forming a recess cavity laterally protruding farther than a sidewall of the first memory opening at an upper portion of the first memory opening, forming a temporary landing pad by filling the recess cavity with a disposable fill material, forming a second alternating stack of second insulating layers and second spacer material layers over the insulating cap layer, forming a second memory opening through the second alternating stack, forming a second memory film in the second memory opening prior to removing the temporary landing pad, removing the temporary landing pad from underneath the second memory opening to form a laterally protruding cavity, and forming a semiconductor channel in the first memory opening, the laterally protruding cavity, and the second memory opening.

According to another aspect of the present disclosure, a method of forming a monolithic three-dimensional memory device, comprises forming a first memory opening through a first stack of first insulating layers and second layers and through an insulating cap layer located over the first stack, forming a first memory film in the first memory opening, filling the first memory opening, forming a second stack of second insulating layers and third layers over the insulating cap layer after forming the first memory film in the first memory opening, forming a second memory opening through the second stack to expose the first memory opening, forming a second memory film in the second memory opening, and forming a semiconductor channel in the second memory opening.

BRIEF DESCRIPTION OF THE DRAWINGS

FIG. 4A is a side cross sectional views of a NAND memory device of an embodiment of the disclosure.

FIGS. 5A and 5B are perpendicular side cross sectional views along lines A-A' and B-B' in FIG. 5C of a lower select gate device level of the NAND memory device of an embodiment of the disclosure. FIG. 5C is a top cross sectional view of the device of FIGS. 5A and 5B.

FIGS. 7, 8, 9 and 10 are side cross sectional views of steps in the method of making the memory device levels of the NAND memory device of an embodiment of the disclosure.

FIGS. 11A and 11B are perpendicular side cross sectional views along lines A-A'and B-B' in FIG. 11C of an upper select gate device level of the NAND memory device of an embodiment of the disclosure. FIG. 11C is a top cross sectional view of the device of FIGS. 11A and 11B.

FIGS. 12A and 12B are side cross sectional views of respective lower and upper select gate device level of the NAND memory device of an embodiment of the disclosure.

FIGS. 15A to 15K are side cross sectional views of steps in the method of making the NAND memory device shown in FIG. 2A.

FIGS. 16A to 16B are side cross sectional views of steps in the method of making the NAND memory device shown in FIG. 3A.

FIGS. 17A to 17H are side cross sectional views of steps in a method of overcoming misalignment of memory stacks in making a NAND memory device with at least two memory stacks.

FIG. 18G is a cross sectional view of an alternative NAND memory device with a current boosting layer according to an embodiment.

FIGS. 20A to 20J are side cross sectional views of steps in the method of making the NAND memory device shown in FIG. 2B.

FIG. 21 is a vertical cross-sectional view of an exemplary structure after formation of a first alternating stack of first insulating layers and first spacer material layers according to an embodiment of the present disclosure.

DETAILED DESCRIPTION

Figure 1B:
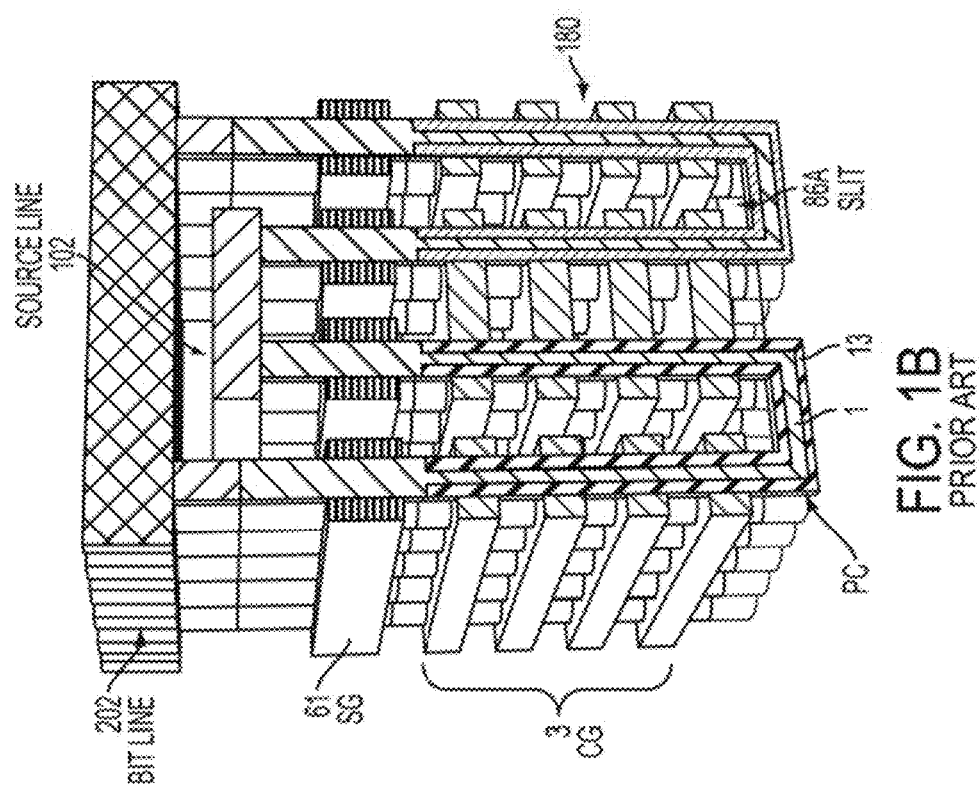
FIG. 1B is a perspective cross sectional view of another prior art NAND memory device.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Three dimensional (3D) vertical NAND devices (i.e., devices in which at least a part of the channel extends perpendicular to the major substrate surface) requires etching of deep, high aspect ratio memory openings or holes for formation of the vertical channel due to a high number of stacked memory layers surrounding the vertical channels. The terms "memory hole" and "memory opening" are used interchangeably herein. A memory layer includes a control gate and associated charge storage region (e.g., a dielectric isolated floating gate, an ONO stack, etc.) and at least a portion of two dielectric isolation layers located above and below each control gate.

However, the hard mask thickness used during high aspect ratio etching limits of the maximum number of stacked memory layers in the vertical NAND because the amount of hard mask thickness consumed increases during memory opening etching with increasing amount of memory layers stacked in the memory structure. For example, for a 1500 nm thick hard mask, at most 35 memory layers may be etched using reactive ion etching (RIE) to form the memory opening before all of the hard mask thickness is consumed by the etching. Increasing the hard mask thickness to increase the number of stacked memory levels is also not highly desirable because an increase in the hard mask thickness undesirably increases the aspect ratio of the opening.

Furthermore RIE energy also limits the number of stacked memory layers in the vertical NAND. The reactive ions are scattered within the high aspect memory opening during the etching, which leads to a decrease in the RIE energy. For a sufficiently deep, high aspect ratio opening, the RIE energy will eventually be reduced to an extent at which the RIE process loses the capability to etch the memory opening. Therefore, with a smaller RIE energy, a lower number of memory layers can be etched at the same time. However, increasing the RIE energy is also not highly desirable because it leads to increased back sputtering effects which may lead to control gate to control gate (i.e., word line to word line) shorts. Therefore, the RIE energy also limits the number of stacked memory layers in the vertical NAND.

The present inventors realized that the number of stacked memory layers in a vertical NAND may be increased if the portions of each memory openings are etched sequentially. Due to the limited depth of the opening in sequential etching, the high etching aspect etching ratio challenges noted above may be decreased.

In the sequential memory opening etching method, a lower portion of the memory stack is formed over a substrate. This portion includes only a part of the memory layers that will be used in the vertical NAND. The lower portions of the memory openings are etched in the lower portion of the memory stack. Then, at least one additional portion of the memory stack is formed over the lower portion of the memory stack. The at least one additional portion of the memory stack contains additional memory levels. Then, additional portions of the memory openings are then etched in the at least one additional portion of the memory stack.

If the stack contains two portions, then the at least one additional portion comprises an upper portion of the stack and the additional portions of the memory openings comprise upper portions of the memory openings. If the stack contains more than two portions, then the above process may be repeated several times. In this case, the at least one additional portion comprises one or more middle portions and an upper portion of the stack and the additional portions of the memory openings comprise one or more middle portions and upper portions of the memory openings.

The separate etching of memory opening portions in each portion of the stack may be conducted with separate hard masks. Thus, each hard mask used during each etching step may be relatively thin and the hard mask thickness does not limit the total number of memory layers in the stack. Likewise, because each RIE step of each memory opening portions forms an opening that has a limited depth, the RIE energy also does not limit the total number of memory layers in the stack.

However, because the different portions of the memory openings are etched during different etching steps using different lithography steps and different hard mask layers, it may be difficult to align the different portions of each memory opening (i.e., lower portion, upper portion and optionally one or more middle portions) to form a continuous memory opening through the entire stack due to photolithography misalignment issues, especially if each memory opening has more than two portions (i.e., the stack is etched three or more times to form a memory opening). The misalignment of the memory opening portions may lead to channel discontinuity which results in an open NAND string.

The present inventors realized that the memory opening alignment challenges may be reduced or avoided by adding a landing pad between the memory stack portions. The landing pad is wider (e.g., had a larger diameter) than the channel in the horizontal direction. The landing pad may be 10-100% wider, such as 25-75% wider than the channel (i.e., for disc shaped pads and cylindrical channels, the pad diameter is larger than the channel diameter by 10-100%). For example, for a 25-150 nm, such as a 45-50 nm diameter cylindrical channel, the pad diameter (i.e., width) may be 30-300 nm, such as 55-100 nm. The pad may be 20-50 nm, such as 30-40 nm thick. Thus, the landing pad connects adjacent channel portions in adjacent memory opening portions of the same memory opening even if the memory opening portions are misaligned with respect to each other.

Use of reactive ion etching to form the memory openings may result in memory openings that narrow towards the bottom of the opening. This is especially true when etching deep openings that have a high aspect ratio. As illustrated in the FIGS. and discussed in more detail below, the landing pads contact the upper, widest portion of the memory openings. In an embodiment, the landing pad is wider than the widest portion of the memory openings. In some embodiments, the memory openings include a blocking dielectric layer, a charge storage region and a tunnel dielectric in addition to the channel. In these embodiments, the landing pad in preferably has a larger width than a widest portion of the channel, tunnel dielectric, charge storage region and blocking dielectric layer.

The landing pad may comprise any suitable semiconductor or electrical conductor material, such as silicon, metal, metal alloy, etc. Preferably, the landing pad is made of the same semiconductor material as the channel of the vertical NAND. For example, the landing pad may comprise a polysilicon landing pad if the channel is a polysilicon channel. A semiconductor landing pad may be intrinsic or have the same conductivity type (e.g., p or n) as the channel. The semiconductor landing pad may be heavier doped than the channel (e.g., heavily doped landing pad and lightly doped channel), have the same doping concentration as the channel or may be lighter doped than the channel. In other words, the pad resistivity may be less than, greater than or the same as the resistivity of the channel material. Alternatively, the landing pad may comprise a metal (e.g., Ti, W, etc.) or conductive metal alloys (e.g., TiN, WN, a metal silicide, such as titanium, tungsten, nickel, cobalt or platinum silicide, etc.).

The landing pad may be formed over each channel portion (except over the upper most channel portion if desired) during the same deposition step as the channel deposition step or during subsequent deposition step. Then, the next overlying channel portion is formed on the landing pad.

Since the landing pad adds an amount of resistance to the vertical NAND string, the landing pad may also be considered a resistor built into the vertical channel of the vertical NAND string. The impact of the increase in resistance on the vertical NAND read performance due to the presence of the resistor should not be great.

For example, for a heavily doped landing pad/resistor comprising heavily doped polysilicon (e.g., 1019 cm-3 doping concentration) having a thickness is 30 nm, the resistance value is 1.35 kOhm. If the stack includes five landing pads per channel or ten landing pads per U-shaped channel in a P-BiCS vertical NAND, then the total resistance is 13.5 kOhm for a 50 nm diameter memory opening. If a 400 nA read current is used in the NAND string, then the bit line voltage needs to increase by only 5 mV due to the ten additional series resistors/landing pads. Likewise, an additional thermal budget (e.g., MONOS anneal) may be added due to the presence of the landing pads. However, the thermal budget impact on the NAND string characteristics should be manageable.

Vertical NAND devices containing a landing pad/built-in resistor may have any suitable configuration. FIGS. 2A through 4B illustrate various non-limiting, exemplary VNAND devices containing a landing pad/built-in resistor.

Figure 2D:
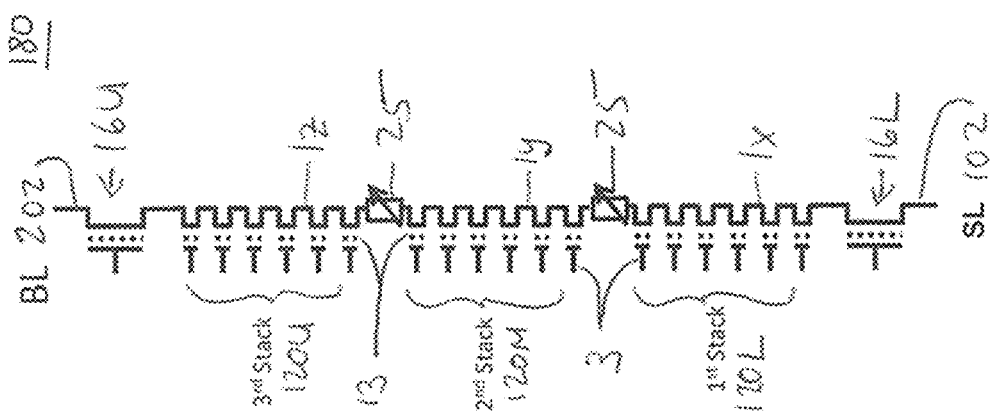
FIGS. 2D and 2E are schematic circuit diagrams of the devices of FIGS. 2A and 2B, respectively.
Figure 2A:
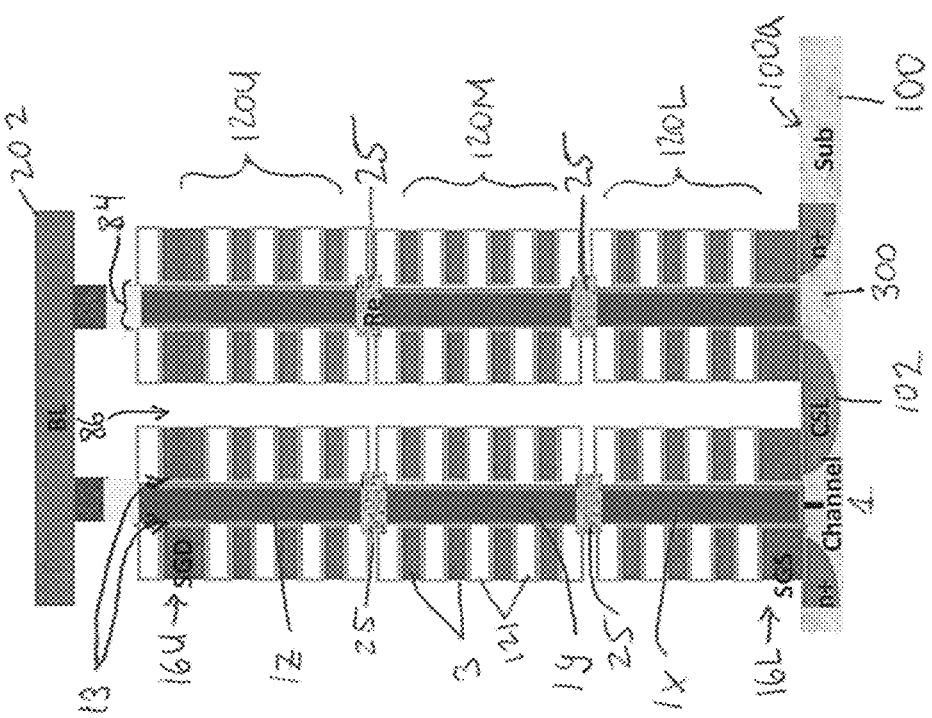
FIGS. 2A, 2B, 3A and 3B are side cross sectional views of a NAND memory device of embodiments of the disclosure.
Figure 2B:
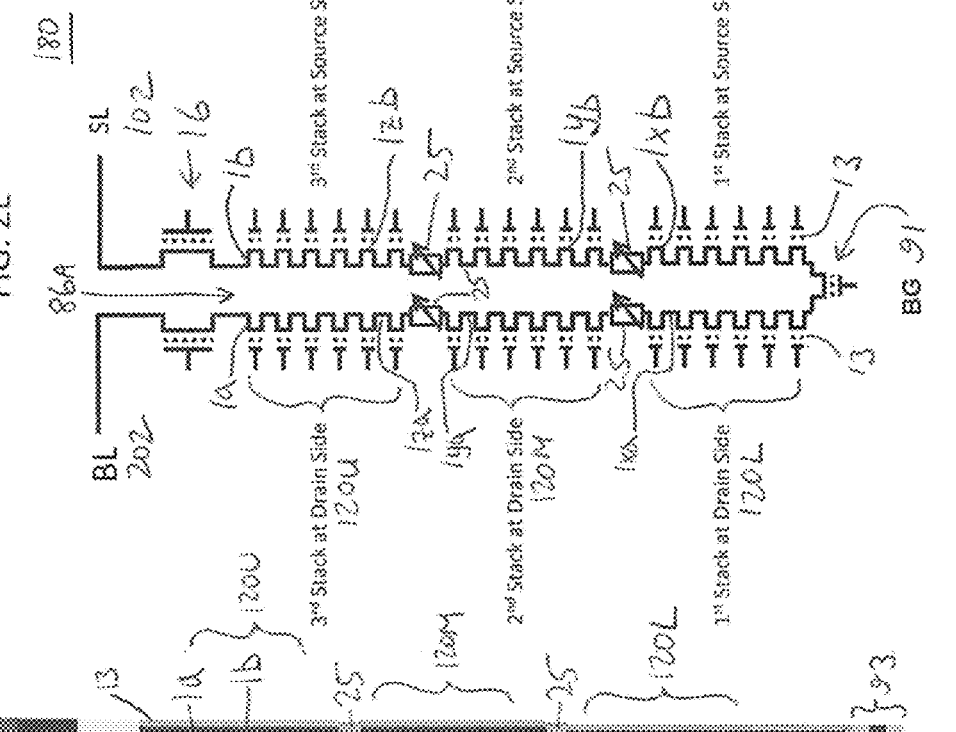
Figure 2E:
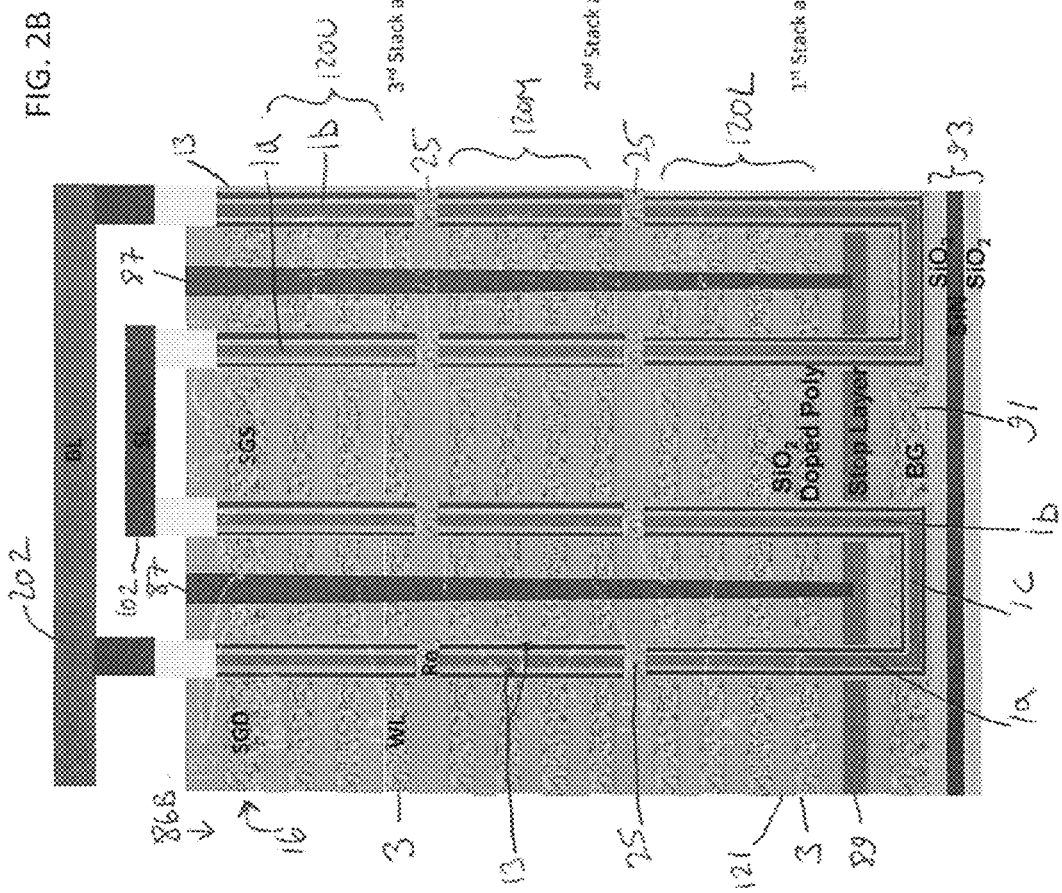
Figure 2C:
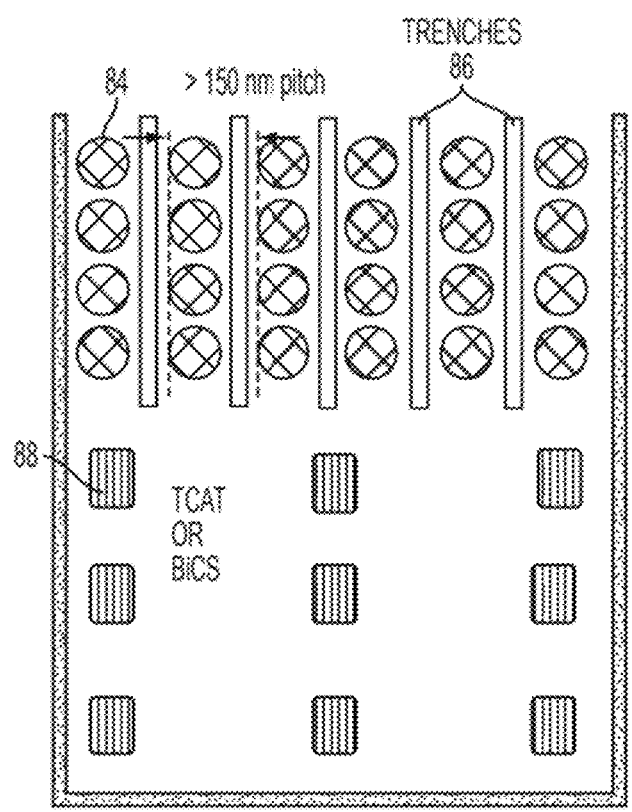
FIG. 2C is a top cross sectional view of NAND memory devices of FIGS. 2A and 2B.

FIGS. 2A and 2D illustrate a vertical NAND containing a landing pad/built-in resistor having a single vertical channel having a pillar type configuration. FIGS. 2B and 2E illustrate a vertical NAND containing a landing pad/built-in resistor having a U-shaped (e.g., pipe shaped) channel having a "P-BiCS" type configuration. FIG. 2C illustrates a top view of the devices in FIGS. 2A and 2B. FIGS. 3A through 4B illustrate a vertical NAND containing a landing pad/built-in resistor having a compact vertical NAND ("CVNAND") type configuration, which will be described in more detail below. The CVNAND device is also described in more detail in U.S. patent application Ser. No. 13/754,293, filed on Jan. 30, 2013 and incorporated herein by reference in its entirety.

In an embodiment, the NAND string 180 illustrated in FIGS. 2A-4B may be formed with a vertical channel. In one aspect, the vertical channel 1 has a solid, rod shape as shown in FIGS. 2A, 2B, 3B, 3A and 4B. In this aspect, the entire channel comprises a semiconductor material. In another aspect, the vertical channel has a hollow cylinder shape as shown in FIG. 4A. In this aspect, the vertical channel includes a non-semiconductor core 2 surrounded by a semiconductor channel 1 shell. The core may be unfilled or filled with an insulating material, such as silicon oxide or silicon nitride.

In some embodiments, the monolithic three dimensional NAND string 180 comprises a semiconductor channel 1 having at least one end portion extending substantially perpendicular to a major surface 100a of a substrate 100, as shown in FIGS. 2A, 2D, 3A and 3B. For example, the semiconductor channel 1 may have a pillar shape and the entire pillar-shaped semiconductor channel extends substantially perpendicularly to the major surface 100a of the substrate 100. In these embodiments, the source/drain electrodes of the device can include a lower electrode 102 (e.g., a heavily doped semiconductor region source electrode in the major surface 100a of a semiconductor substrate 100) provided below the semiconductor channel 1 (optionally in contact with a doped source region 103), and an upper electrode 202 (e.g., bit line) formed over the doped drain region 203 in the semiconductor channel 1, as shown in FIG. 2A. The lower electrode 102 contacts a metal interconnect outside of the view shown in FIGS. 2A and 3A or contacts metal wires of circuitry under the array. Thus, the drain/bit line electrode 202 contacts the pillar-shaped semiconductor channel 1 (via the drain region 203) from above, and the source electrode 102 contacts the pillar-shaped semiconductor channel 1 from below (e.g., via source region 103). For example, the device shown in FIGS. 2A and 2D contains two levels of landing pads 25, which divide the channel and the stack into three portions: lower portion of the stack 120L containing the lower portions 1xa, 1xb of the wings 1a, 1b; middle portion of the stack 120M containing the middle portions 1ya, 1yb of the wings 1a, 1b; and upper portion of the stack 120U containing the upper portions 1za, 1zb of the wings 1a, 1b.

Alternatively, as shown in FIG. 2B, the NAND string may have a U shape (also known as a "pipe" shape) with two vertical channel wing portions connected with a horizontal channel connecting the wing portions. In one aspect, the U shaped or pipe shaped channel may be solid, as in the solid rod shaped vertical channel NAND as shown in FIG. 2B. In another aspect, the U shaped or pipe shaped channel may be hollow cylinder shaped, (similar to the hollow cylinder pipe shaped vertical channel NAND as shown in FIG. 4A). The U-shaped pipe channel may be filled or unfilled. Separate front side and back side methods for fabricating both single vertical channel and U shaped channel NAND strings are taught in U.S. Pat. No. 8,187,936, hereby incorporated by reference in its entirety for teaching of the separate front and back side processing methods.

The two wing portions 1a and 1b of the U-shape semiconductor channel may extend substantially perpendicular to the major surface of the substrate, and a connecting portion 1c of the U-shape semiconductor channel 1 connects the two wing portions 1a, 1b extends substantially perpendicular to the major surface of the substrate. The wing portions 1a, 1b of the channel 1 contain the built-in landing pads/resistors 25. For example, the device shown in FIGS. 2B and 2E contains two levels of landing pads 25, which divide the channel and the stack into three portions: lower portion of the stack 120L containing the lower portions 1xa, 1xb of the wings 1a, 1b; middle portion of the stack 120M containing the middle portions 1ya, 1yb of the wings 1a, 1b; and upper portion of the stack 120U containing the upper portions 1za, 1zb of the wings 1a, 1b.

In these embodiments, one of the source or drain electrodes 202 (e.g., bit line) contacts the first wing portion of the semiconductor channel from above, and another one of a source or drain electrodes (e.g., source line) 102 contacts the second wing portion of the semiconductor channel 1 from above. An optional body contact electrode 91 may be disposed over or in the substrate to provide body contact to the connecting portion of the semiconductor channel 1 from below. The NAND string's select or access transistors 16 are shown in FIGS. 2B and 2E. These transistors and their operation are described in U.S. Pat. No. 8,187,936, which is incorporated by reference for a teaching of the select transistors. The device of FIGS. 2B and 2E is described in more detail below with reference to the method of making the P-BiCS type vertical NAND, as shown in FIGS. 17A-17H.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, indium antimonide, or other compound semiconductor materials, such as III-V or II-VI semiconductor materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 in FIG. 4A may comprise any electrically insulating material, such as silicon oxide, silicon nitride, silicon oxynitride, or other insulating materials.

Each monolithic three dimensional NAND string 180 further comprises a plurality of control gate electrodes 3, as shown in FIGS. 2A, 2B, 3A, 3B and 4A-4B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A, as shown in FIGS. 2A, 2B, 3A and 4A. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof.

Each channel 1 shown in FIGS. 2A-4B contains one or more landing pads/built-in resistors 25 described above. Preferably, each landing pad 25 is located in a vertical position of the channel between control gates 3 (i.e., having one control gate above and one control gate below). Thus, the landing pad is located between the first device level (e.g., level A) and the second device level (e.g., level B). A lower portion of the semiconductor channel (e.g., 84x) located in the first device level contacts a bottom surface of the landing pad 25. A middle or upper portion (e.g., 84y) of the semiconductor channel located in the second device level contacts a top surface of the same landing pad 25.

Figures 17E, 17F, 17G, 17H:
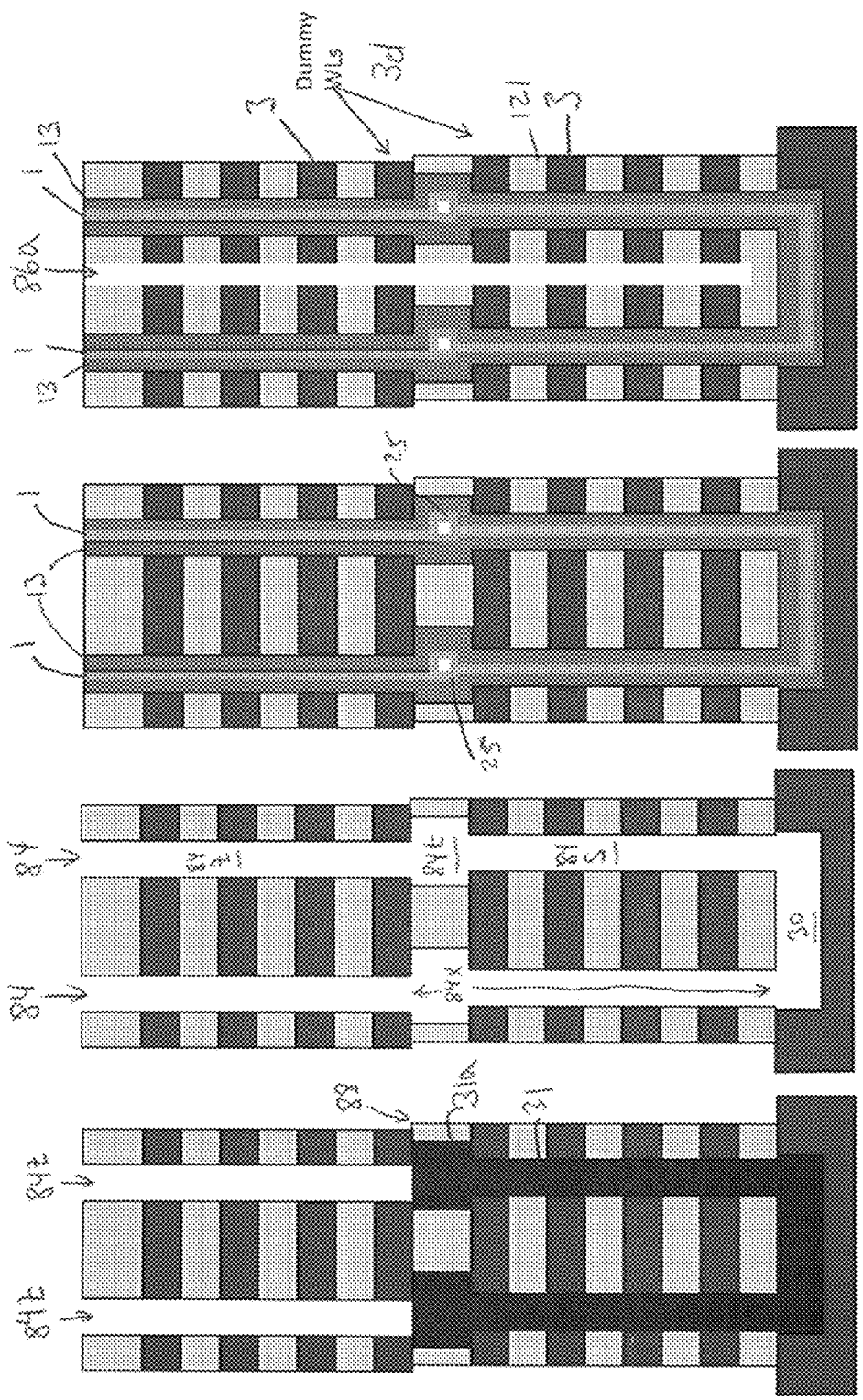

The landing pad 25 may extend horizontally beyond the memory hole 84 diameter or width to be located over and under adjacent control gates 3 inside the dielectric fill material 121 Thus, the landing pad 25 may extend into the insulating layer 121 between the first 3a and the second 3b control gate electrodes 3. The fill material 121 isolates the landing pad 25 from direct contact with the control gate electrodes 3. Alternatively, the landing pad 25 may be relatively thick and contact dummy control gate electrodes 3d, as shown in FIGS. 17G and 17H. Dummy control gate electrodes 3d (i.e., dummy word lines) are not connected to outside control circuitry and are not provided with a current or voltage during NAND operation.

Figure 3A:
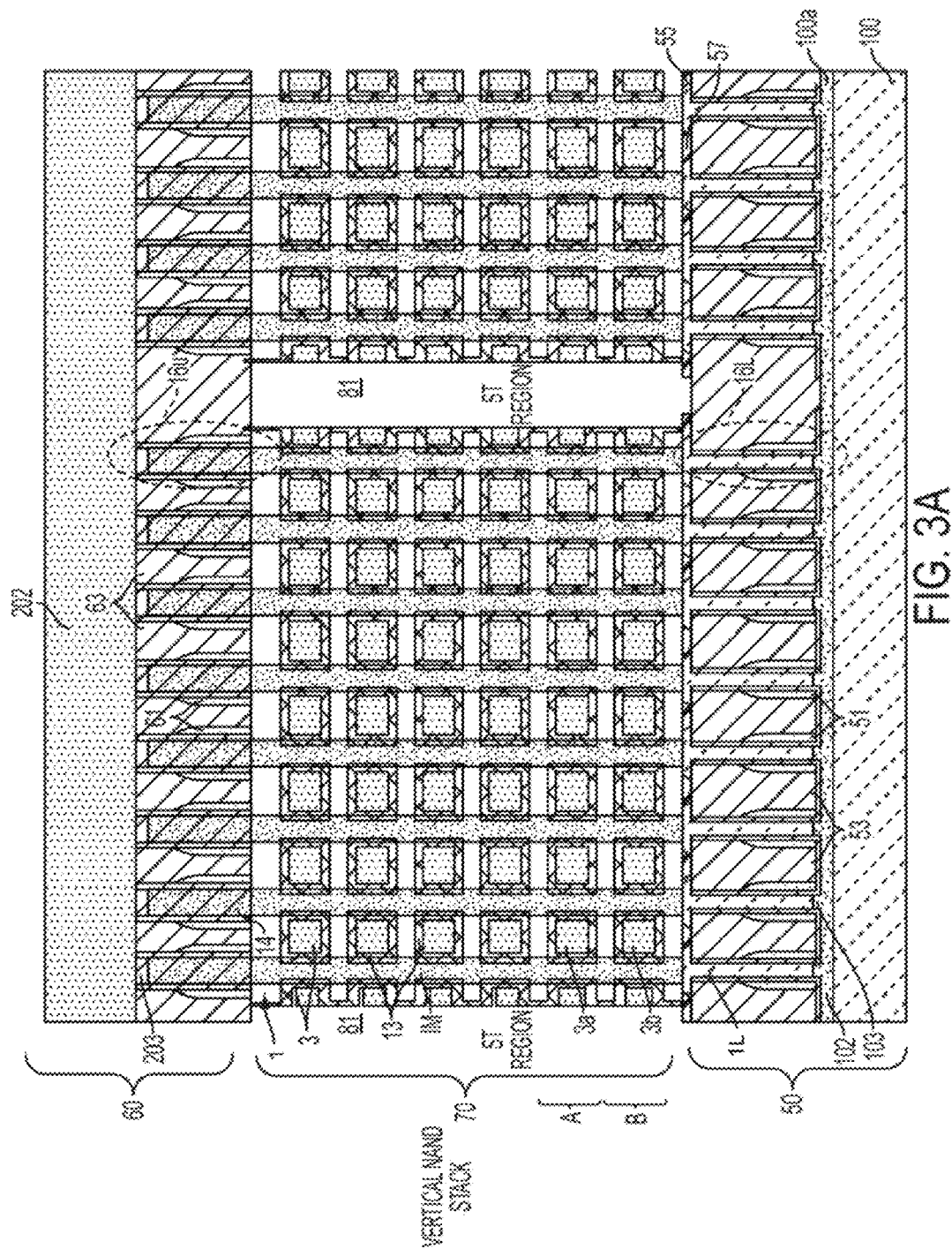

A blocking dielectric layer 7 is located adjacent to and may be surrounded by the control gate(s) 3. The blocking dielectric layer 7 may comprise a continuous layer or a plurality of blocking dielectric layer segments located in contact with a respective one of the plurality of control gate electrodes 3. For example, a first dielectric segment 7a located in device level A and a second dielectric segment 7b located in device level B are in contact with control electrodes 3a and 3b, respectively, as shown in FIG. 4A. In some embodiments, at least a portion of each of the plurality of blocking dielectric layer segments 7 surrounds the top, bottom, and two edge portions of a control gate electrode 3 between two adjacent NAND strings, as shown in FIGS. 3A and 4A.

The NAND devices also comprise one or more charge storage regions 9 located between the channel 1 and the blocking dielectric layer 7. The charge storage regions 9 may comprise a continuous vertical charge storage layer adjacent to plural control gate electrodes 3, as shown in FIGS. 2A and 2B or the plurality of discrete charge storage regions 9 comprise at least a first discrete charge storage segment 9a located in the device level A and a second discrete charge storage segment 9b located in the device level B, as shown in FIG. 4A.

A tunnel dielectric 11 is located between the charge storage region(s) 9 and the semiconductor channel 1. The blocking dielectric layer 7 and the tunnel dielectric 11 may be independently selected from any one or more same or different electrically insulating materials, such as silicon oxide, silicon nitride, silicon oxynitride, or other insulating materials.

The charge storage region(s) 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate(s), conductive nanoparticles, or a charge storage dielectric layer or segment (e.g., silicon nitride or another dielectric). For example, in some embodiments, the charge storage regions comprise silicon nitride, where the silicon oxide blocking dielectric layer 7, the nitride charge storage region 9 and the silicon oxide tunnel dielectric 11 form oxide-nitride-oxide (ONO) memory film 13 of the NAND string shown in FIGS. 2A, 2B, 3A and 4A. Alternatively, the blocking dielectric layer may comprises a tri-layer ONO dielectric, such that the memory film 13 comprises ONO (11)-N (9)-O (7).

Figure 4B:
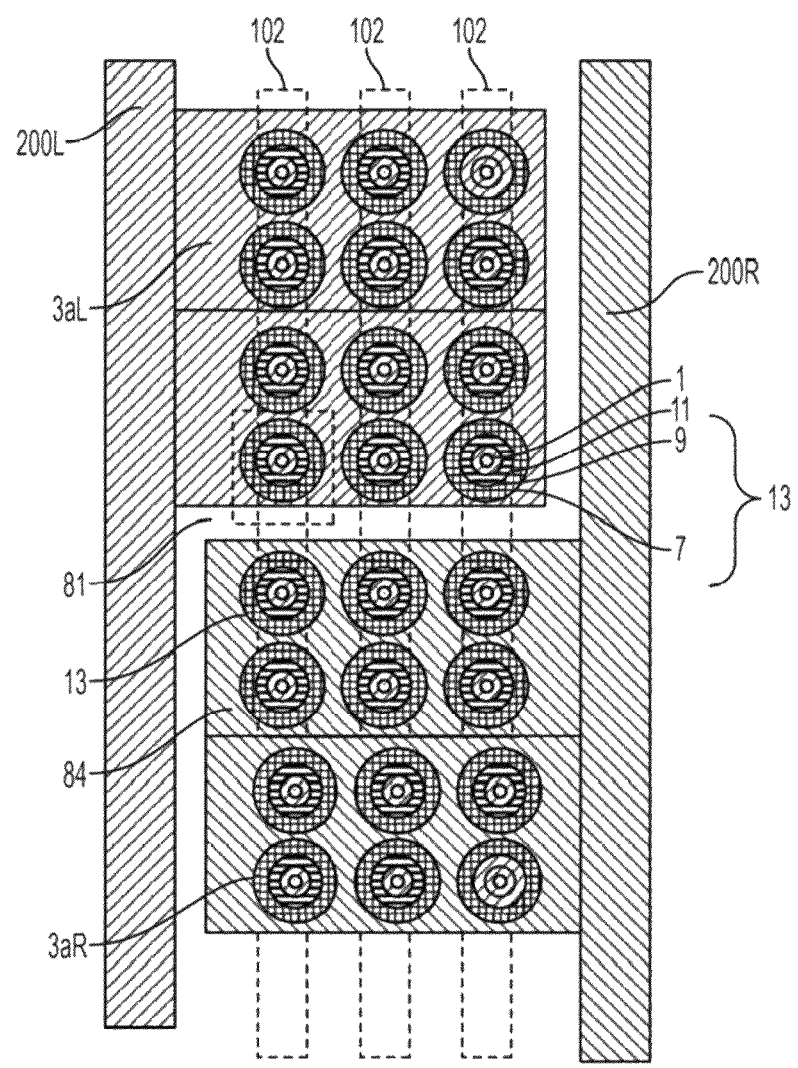
FIG. 4B is a top cross sectional view of the device of FIG. 4A.

As shown in FIG. 4B, the tunnel dielectric 11 comprises a cylinder which surrounds the semiconductor channel 1, the charge storage region 9 comprises a cylinder which surrounds the tunnel dielectric, and the blocking dielectric layer 7 comprises a cylinder which surrounds the charge storage region. The first 3a and the second 3b control gate electrodes 3 surround the blocking dielectric layer in each NAND string.

The CVNAND configuration shown in FIGS. 3A-4B provides a denser memory design than the configurations shown in FIGS. 2A and 2B, respectively, for the following reasons. For example, as shown in FIG. 2A, each pillar NAND string 180 is separated from adjacent strings by a word line cut or trench 86. The bottom source select gate (SGS) device 16L in FIG. 2A requires a cut space or trench 86 between the lower select gate electrodes which are built from the bottom of the stack metal layer. Furthermore, the source line 102 formation process and p-well 300 contact requires additional space in the device of FIG. 2A.

Likewise, as shown in FIGS. 2B and 2E, each U-shaped P-BiCS NAND string 180 contains a dielectric 87 filled slit trench 86A between the select and control gates 3 and the wings or arms of the U-shaped channel 1 which extends between upper source line 102 and bit line 202. Furthermore, as shown in FIG. 2B, adjacent U-shaped NAND strings 180 are also separated by a word line cut or trench 86B not to lose active holes and to reduce word line Rs. The top view of the filled memory holes 84 (i.e., containing the NAND string channels 1 and a film 13 comprising tunnel dielectric, charge storage region and blocking dielectric layer) and the trenches 86 in vertical pillar and P-BiCS type devices is illustrated in FIG. 2C. The control gates are omitted from FIG. 2C for clarity and the supporting columns 88 which prevent the device levels from collapsing on each other during removal of sacrificial material are shown in the bottom of the FIG. The trenches result in a higher than desired pitch between adjacent filled memory holes (e.g., a pitch of about 150 nm) and reduces the array efficiency by more than 50%.

The word line (i.e., control gate) trenches or cuts 86 in an array of vertical NAND strings may be eliminated to increase the device density and reduce the filled memory hole 84 pitch. Embodiments include monolithic three dimensional NAND strings and methods of making three dimensional NAND devices (e.g., CVNAND devices) having at least one 3×3 array of vertical NAND strings in which the control gate electrodes are continuous in the array and do not have an air gap or a dielectric filled trench 86 in the array. The NAND device is formed by first forming a lower select gate level having separated lower select gates, then forming plural memory device levels containing a plurality of NAND string portions, and then forming an upper select gate level over the memory device levels having separated upper select gates.

Figure 3B:
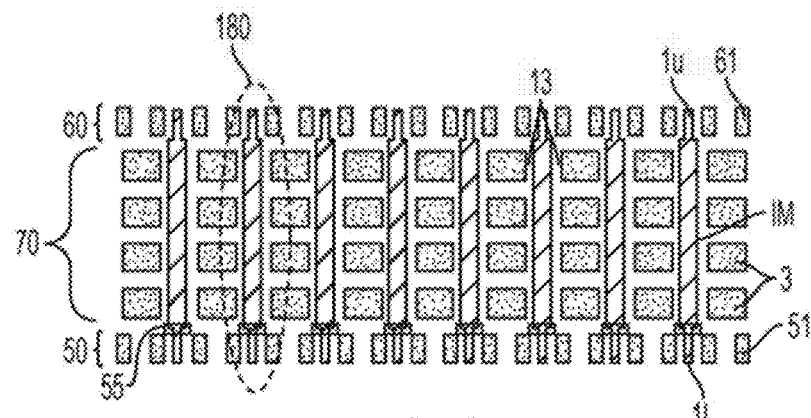
Figure 3C:
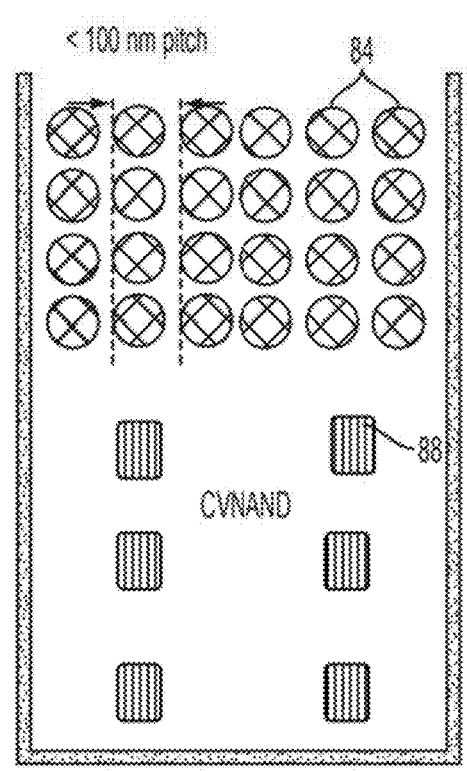
FIG. 3C is a top cross sectional view of the device of FIGS. 3A and 3B.

Embodiments of the compact vertical NAND (i.e., CVNAND) device are shown in FIGS. 3A, 3B, 33C, 4A and 4B. FIG. 3A schematically illustrates a side cross sectional view of the entire CVNAND device, including the lower 50 and upper 60 select gate device levels located below and above the memory device levels 70 shown in FIG. 4A. FIG. 3B schematically illustrates a side cross sectional view of the memory levels 70 and select gate device levels 50, 60 of one CVNAND array and FIG. 33C schematically illustrates the top view location of the filled memory holes 84 and supporting pillars 88. FIG. 4A illustrates a side cross sectional view of the memory device levels 70 (i.e., levels containing the control gate electrodes/word lines) in one NAND string array. FIG. 4B schematically illustrates the top cross sectional view of the relationship between the continuous control gate electrodes 3 and the filled memory holes 84 in each array block.

As shown in FIGS. 3A, 4A and 4B the first control gate electrode 3a and the second control gate electrode 3b are continuous in the array, such that these electrodes do not have an air gap or a dielectric filled trench in the array. As shown in FIG. 4B, the control gate electrodes 3 when viewed from the top comprise a "mesh" which is continuous except for the memory holes 84 which are completed filled with the channel 1, an optionally the tunnel dielectric 11, charge storage region 9, blocking dielectric layer 7 and optional insulating fill 2. In other words, the control gate electrodes 3 may be considered to be a mesh in which all openings are filled FIG. 4B shows two control gate electrodes 3aL and 3aR (i.e., left and right electrodes) located in the first device level A. Each electrode forms a continuous mesh around an exemplary 4×3 array of filled memory holes 84. Each electrode 3aL and 3aR contacts a respective word line 200L and 200R of an array block. An array block includes plural arrays (e.g., plural 4×3 arrays) which are connected by their respective control gate electrodes (e.g., 3aL) to a common word line (e.g., 200L). Only one array is shown as being connected to each word line via a respective control gate electrode in FIG. 4B for clarity. However, it should be understood that the pattern shown in FIG. 4B repeats along the word lines. Thus, each array is located in a respective array block, where the left control gate electrode 3aL in one block in device level A is separated from the right control gate electrode 3aR in the same level A in an adjacent array block by an air gap (if the slit trench 81 is not filled) or a dielectric filled trench 81. The same configuration is used in the other memory levels shown in FIGS. 4A and 3A.

The CVNAND string's select or access transistors 16L, 16U are shown in FIGS. 3A, 3B, 5, 6 and 11. As shown in FIGS. 3A and 5A-5C, a lower select gate electrode 51 is located adjacent to a lower portion 1L of the pillar-shaped semiconductor channel 1 below the control gate electrodes 3 (e.g., 3a, 3b) in the lower select gate electrode level 50. Level 50 may be a source select gate level and electrode 51 may be a source side select gate electrode. Each lower select gate electrode 51 is separated from adjacent lower select gate electrodes 51 in the array in level 50 by an air gap or a dielectric filled trench 53.

Furthermore, as shown in FIGS. 3A and 11A-C, an upper select gate electrode 61 is located adjacent to an upper portion 1U of the pillar-shaped semiconductor channel 1 above the first 3a and the second 3b control gate electrodes. Electrode 61 may comprise a drain side select gate electrode located in the drain upper select gate level 60. Each upper select gate electrode 61 is separated from adjacent upper select gate electrodes 61 in the array in level 60 by an air gap or a dielectric filled trench 63.

In one non-limiting embodiment, each semiconductor channel 1 comprises a first portion 1U adjacent to the upper select gate electrode 61, a second portion 1L adjacent to the lower select gate electrode 51, a third (i.e., middle or memory) portion 1M located at least in the first (A) and the second (B) device levels between the first and the second portions, and an optional, additional landing pad portion 55 located between the second 1L and the third 1M channel 1 portions.

In one embodiment shown in FIG. 3B, the third (middle) portion 1M of the channel 1 has a larger diameter or width than the first (upper) 1U and the second (lower) 1L channel 1 portions because these three portions are formed in separate process steps as described below. The thinner upper 1U and lower 1L channel 1 portions allow the space for the air gap or a dielectric filled trench 53, 63 to be added between adjacent upper 61 and lower 51 select gates in respective levels 60 and 50. In contrast, since the control gates 3 are continuous and do not require air gap or trench adjacent to the middle (memory) portions 1M of the channel 1, the channel portions 1M may be thicker than channel portions 1U and 1L.

Finally, as shown in FIGS. 3A, 3B, 5 and 6 and as will be explained in more detail below, the channel 1 may optionally contain additional landing pad portions 55 between the lower select gate level 50 and the memory levels 70 and between the memory level 70 and the upper select gate level 60. The landing pad portion has a larger diameter or width than the second 1L and the third 1M portions of the channel 1.

FIGS. 5A-5C illustrate a lower select gate level 50 of the CVNAND device. FIG. 5C shows a top view and FIGS. 5A and 5B illustrate side cross sectional views along lines A-A' and B-B' in FIG. 5C. The lower select gate level 50 is located over the substrate 100. The lower select gate level 50 includes the lower portions 1L of the plurality of semiconductor channels 1 (containing source regions 103 on the bottom), and a plurality of lower source electrodes 102. Each lower source electrode is electrically connected to each of the plurality of lower portions 1L of the semiconductor channels through a respective source region 103. Level 50 also includes the plurality of lower select gate electrodes 51, located adjacent to a gate dielectric 54 contacting the lower portion 1L of each semiconductor channel 1. The channel 1L, gate dielectric 54 and select gate 51 form the lower (source) select transistor 16L of each NAND string. Strip shaped lower select gate lines 52 connect the select gates 51 in rows to input/outputs (not shown), as shown in FIGS. 5B and 5C. Level 50 is formed before the layers of the memory level 70 are formed over level 50 to allow the select gates 50 to be separated.

Figure 6A:
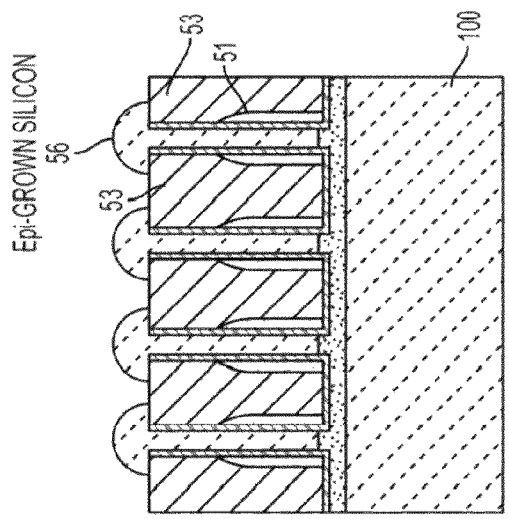
FIGS. 6A, 6B, 6C and 6D are side cross sectional views of steps in the method of making the lower select gate device level of the NAND memory device of an embodiment of the disclosure.

FIGS. 6A-6D illustrate steps in forming this level 50 shown in FIG. 5A. As shown in FIG. 6A, the lower portions 1L of the channel 1 may be formed by etching a silicon substrate 100 to form silicon pillars 1L using any suitable lithography and etching technique. Alternatively, pillars 1L may be grown in openings in a mask located over the substrate 100. In this case, the select gate device level 50 is lifted up over the substrate 100 surface 100a, so that the select transistors 16L have polysilicon channels 1L and CMOS devices may be formed in single crystal silicon substrate 100 under the NAND array. This option is less preferred.

This is followed by oxidizing the pillars 1L to form a silicon oxide gate dielectric 54 on pillar sidewall(s) and on exposed portion of substrate 100 surface 100a. Alternatively, the gate dielectric may be deposited on the pillars 1L and the surface 100A of the substrate 100 by CVD or other suitable methods. In this case, the dielectric 54 may comprise materials other than silicon oxide.

Finally, the upper surface 100A of the substrate 100 is doped (e.g., by ion implantation) to form the source regions 103 and the source electrode 102 (i.e., buried doped source line in substrate 100). The buried source line 102 in the substrate 100 is made by a high dose implant. Alternatively, an optional a buried metal mesh (e.g., tungsten, etc.) may be provided in addition to or instead of the buried implanted lines 102 as the source electrode(s). Source regions 103 may be formed by angled ion implantation (e.g., phosphorus or arsenic implant into a p-type silicon substrate) into the base of the pillars 1L. The implantation may be conducted before or after the dielectric 54 formation or after the select gate 51 formation as it is described below.

Figure 6B:
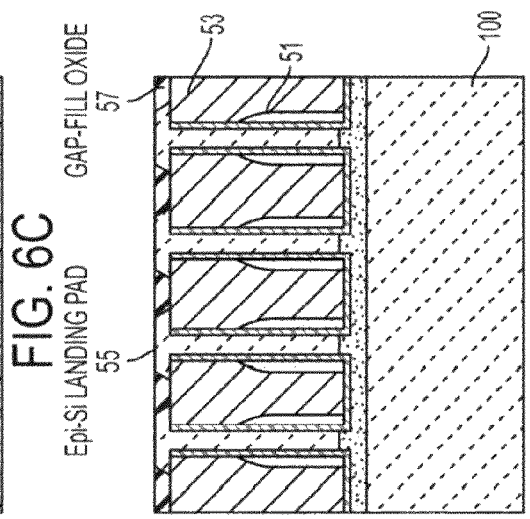

Next, as shown in FIG. 6B, during a step of forming the lower select gate level 50, each lower select gate electrode 51 is separated from adjacent lower select gate electrodes in the array by an air gap or a dielectric filled trench 53. This may be done by forming the select gate 51 layer over the dielectric 54 covered lower portions 1L of the channel 1 followed by anisotropically etching the select gate layer to leave discreet, separated sidewall spacer shaped select gates 51 on the gate dielectric 54 covered lower portions 1L of the channel. The space between the spacer gates 51 may be left as an air gap or filled with an dielectric fill 53. Alternatively, select gates 51 may be formed by depositing a conductive layer and patterning it by lithography and etching into discreet gates 51. If desired, portions of the gates 51 of transistors 16L may be silicided.

The select gate lines 52 are then formed to connect the discreet select gates into rows. The lines 52 may be formed by depositing one or more conductive layers and then performing lithography and etching to form the strip shaped lines 52. The lines 52 are separated from each other in the A-A direction but not in the B-B direction in FIG. 5C.

Figure 6C:
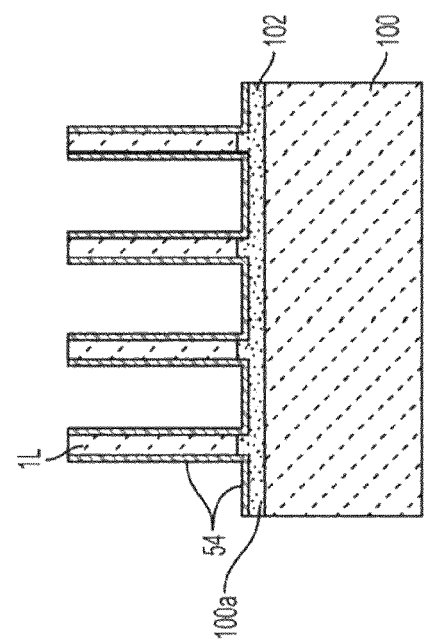
Figure 6D:
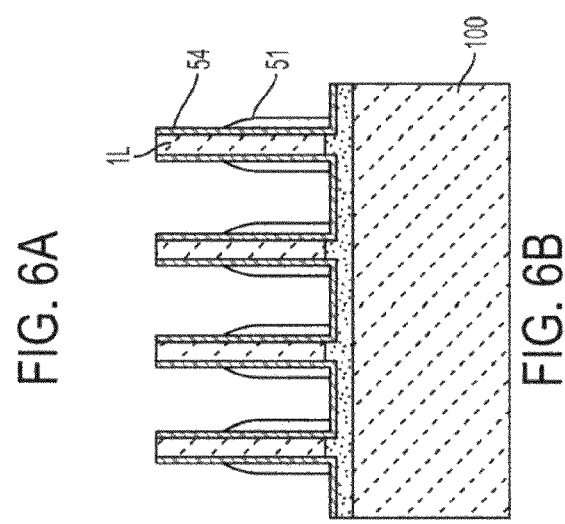

Then, as shown in FIGS. 6C-6D, the optional semiconductor landing pad 55 may epitaxially grown over each lower portion 1L of the plurality of semiconductor channels 1 exposed in the dielectric filled trenches 53 in the lower select gate level 50, such that the landing pad has a larger width or diameter than an underlying lower portion of the channel.

The landing pad 55 formation may comprise epitaxially growing a "mushroom head" shaped overgrown silicon 56 on exposed portions 1L of the channels 1. This silicon overgrowth 56 is then covered by an insulating gap fill layer (e.g., silicon oxide or nitride). The silicon mushroom head 56 and the gap fill layer are then planarized (e.g., by CMP) to form planar landing pads 55 on each pillar 1L separated by an insulating gap fill 57, as shown in FIG. 6D.

FIGS. 7-10 illustrate a method of making the lower portion of the memory device levels 70 of FIGS. 4A and 3A after the step of forming a lower select gate level 50 according to an embodiment of the disclosure. The memory device levels 70 comprise a plurality of NAND string portions.

Referring to FIG. 7, a stack 120 of alternating layers 121 (121a, 121b, etc.) and 132 (132a, 132b etc.) is formed over the completed lower select gate device level 50 which is located over major surface of the substrate 100. Layers 121, 132 may be deposited over the substrate by any suitable deposition method, such as sputtering, CVD, PECVD, MBE, etc. The layers 121, 132 may be 6 to 100 nm thick. The stack 120 may be covered with an optional cap layer of insulating material 200 different from materials 121 and 132.

In this embodiment, the first layers 121 comprise an electrically insulating material, such as silicon oxide, silicon nitride, high-k dielectric (e.g., organic or inorganic metal oxide), etc. The second layers 132 are sacrificial layers. Any sacrificial material that can be selectively etched compared to material 121 may be used for layers 132, such as conductive or insulating or semiconducting material. For example, the sacrificial material for layers 132 may be silicon nitride when material of layers 121 is silicon oxide.

The deposition of layers 121, 132 is followed by etching the stack 120 to form a plurality of memory holes 84. An at least a 3×3, such as an at least 6×6 array of memory holes 84 may be formed in locations where vertical channels of NAND strings will be subsequently formed.

The middle semiconductor channel 1 portions 1M are then formed on the landing pads 55 exposed in the memory holes 84. The channel portions 1M may be filled with insulating fill 2 (as shown in FIG. 4A) or may comprise a solid rod (as shown in FIGS. 3A and 7).

Preferably, the channel 1 portions 1M material comprises lightly doped p-type or n-type (i.e., doping below 1017 cm-3) silicon material (e.g., polysilicon). An n-channel device is preferred since it is easily connected with n+ junctions (i.e., source 103 and drain 203 n+ doped regions having a doping concentration between 1017 cm-3 and 1021 cm-3). However, a p-channel device may also be used. Other semiconductor materials (e.g., SiGe, SiC, Ge, II-VI, etc.) may also be used.

The semiconductor channel 1 may be formed by any desired methods. For example, the semiconductor channel material 1 may be formed by depositing semiconductor (e.g., polysilicon) material in the holes 84 and over the stack 120 (e.g., by CVD), followed by a step of removing the upper portion of the deposited semiconductor layer by chemical mechanical polishing (CMP) or etchback using top surface of the stack 120 as a polish stop or etch stop.

In some embodiments, a single crystal silicon or polysilicon vertical channel 1 may be formed by metal induced crystallization ("MIC", also referred to as metal induced lateral crystallization) without a separate masking step. The MIC method provides full channel crystallization due to lateral confinement of the channel material in the hole 84.

In the MIC method, an amorphous or small grain polysilicon semiconductor (e.g., silicon) layer can be first formed in the holes 84 and over the stack 120, followed by forming a nucleation promoter layer over the semiconductor layer. The nucleation promoter layer may be a continuous layer or a plurality of discontinuous regions. The nucleation promoter layer may comprise any desired polysilicon nucleation promoter materials, for example but not limited to nucleation promoter materials such as Ge, Ni, Pd, Al or a combination thereof.

The amorphous or small grain semiconductor layer can then be converted to a large grain polycrystalline or single crystalline semiconductor layer by recrystallizing the amorphous or small grain polycrystalline semiconductor. The recrystallization may be conducted by a low temperature (e.g., 300 to 600 C) anneal.

The upper portion of the polycrystalline semiconductor layer and the nucleation promoter layer can then be removed by CMP or etchback using top surface of the stack 120 as a stop, resulting in the structure as shown in FIG. 7. The removal may be conducted by selectively wet etching the remaining nucleation promoter layer and any formed silicide in the top of layer following by CMP of the top of silicon layer using the top of the stack 120 as a stop.

Following formation of the channel 1 portions 1M, at least one slit trench 81 (also shown in FIG. 4B) is formed in the stack 120. The openings 81, 84 may be formed by forming a mask (e.g., a photoresist mask) by photolithography followed by etching unmasked areas. The slit trench opening 81 may be in the shape of a cut traversing more than one NAND string as illustrated in FIG. 4B. The slit trenches 81 allow back side access to the vertical NAND strings located in memory holes 84 for the control gate 3 formation in the "gate last" process.

Next, as shown in FIG. 8, the sacrificial material 132 is selectively etched compared to the first layer 121 material to form recesses 62. The recesses 62 may be formed by selective, isotropic wet or dry etching which selectively etches the sacrificial material 132 compared to the first layer insulating material 121 through the slit trenches 81. The recess 62 extends to the channel 1 portions 1M. Preferably, the entire layers of first sacrificial material 132 between the first layers 121 are removed up to the channel 1 portions 1M.

The memory film 13 is then formed in the recesses 62 as shown in FIG. 9. This includes forming a tunnel dielectric 11 in the recesses over the channel portions 1M located in the memory openings 84, forming a charge storage region 9 over the tunnel dielectric, and forming a blocking dielectric layer 7 over the charge storage region in the recesses 62. The blocking dielectric layer 7 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 7 may have a thickness of 6 to 20 nm. The charge storage region 9 may comprise a silicon nitride layer deposited by any suitable method, such as ALD, CVD, etc., and have a thickness of 3 to 20 nm. The tunnel dielectric may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide). The tunnel dielectric may be deposited by any suitable method, such as ALD, CVD, etc. Alternatively, the tunnel dielectric may be formed by thermally oxidizing the exposed sidewalls of the middle portions 1M of the channel 1 exposed in the recesses 62.

The control gates 3 are then formed on the blocking dielectric layer in the remaining portions of the recesses 62 through the slit trench(es) 81, as shown in FIG. 10. The control gates 3 are preferably metal or metal alloy gates, such as tungsten gates, formed by MOCVD or other suitable methods. Finally, if desired, the slit trenches 81 between array blocks may be filled with a dielectric fill material or they may be left unfilled as air gap trenches. This completes the lower portion of the memory device levels 70.

Then, a landing pad/built-in resistor 25 is formed over the channel 1M, as will be described below with respect to FIG. 16A. The process of FIGS. 7-10 is repeated again one or more times to form one or more upper portions of the memory levels 70 over the completed lower portion of the memory levels 70, as shown in FIG. 16B, and described in more detail below.

FIGS. 11A-11C illustrate the upper select gate level 60 of the device. FIG. 11C shows a top cross sectional view (along lines A-A and B-B in FIGS. 11A and 11B, respectively, with bit line 202 not shown) and FIGS. 11A and 11B illustrate side cross sectional views along lines A-A' and B-B' in FIG. 11C. The upper select gate level 60 is formed over the plurality of memory device levels 70, preferably after levels 70 are completed and preferably without using the stack 120 layers. The upper select gate level 60 comprises upper portions 1U of the plurality of semiconductor channels 1, and a plurality of upper drain electrodes (e.g., bit lines) 202. Each upper source or drain electrode 202 is electrically connected to each of the plurality of upper portions 1U of the semiconductor channels via the drain regions 203. Level 60 also includes a plurality of upper select gate electrodes 61. Each upper select gate electrode 61 is located adjacent to a gate dielectric 64 contacting the upper portion 1U of each semiconductor channel 1. The channel portion 1U, gate dielectric 64 and select gate 61 form the upper (drain) select transistor 16U of each NAND string. The upper select gate lines 66 separated from each other by insulating fill 63 connect the select gates 61 in rows.

The upper select gate level 60 may be formed in the same manner as the lower select gate level 50, except as follows. First, the upper portions 1U (i.e., the channels of the upper select gate transistors 16U) of the channels 1 are grown on the respective middle portions 1M of the channels. Thus, portion 1U may comprise polycrystalline semiconductor (e.g., polysilicon) or recrystallized, nearly single crystal silicon (e.g., recrystallized by the MIC process).

Second, rather than forming landing pads 55, the tops of the pillars 1U are doped with a dopant of the opposite conductivity type (e.g., n-type) than that of the channel 1 portion 1U (e.g., p-type) to form drain regions 203. This may be performed by ion implanting P or As into exposed portions of silicon pillars 1U. Third, as shown in FIG. 11B, the bit lines 202 are formed by a damascene process in rail shaped trenches in a dielectric layer 204 or by forming the dielectric layer 204 around bit line 202 rails. Otherwise, the upper select gate electrodes 61 may be formed by a sidewall spacer process on gate dielectric 64 covered silicon channels 1L of the upper select gate transistors 16U in the same matter as the lower select gate electrodes 51. If desired, portions of the gates 61 and/or the drain 203 of transistors 16U may be silicided.

FIGS. 12A and 12B illustrate exemplary dimensions (in nanometers) of the select transistors 16 and elements of levels 50 and 60, respectively, in units of nanometers. The above configuration provides a dense array for larger block sizes. The CVNAND scales below 5 nm effective half pitch (F/n), where F is the minimum feature size and n is the number of device levels.

The above described NAND device may be programmed and read by conventional NAND techniques. However, since the select gates for each NAND string are separated, the erase operation of the above device may be advantageously performed by a gate induced drain leakage (GIDL) process through the lower select gate source transistor 16L in the lower select gate device level 50. The effective GIDL erase allows erasing of very tall stacks by optimizing the bottom SGS transistor 16L with respect to GIDL current (during erase) and off/leakage currents (during inhibit). This also provides an effective erase from source line 102 side only, which allows optimization of off current and leakage current (during inhibit and read) for top SGD transistor 16U. This allows the device to open up an inhibit window and reduce read current leakage for non selected blocks. It is believed that sub block erase could become effective compared to prior art three dimensional NAND.

Figure 13A:
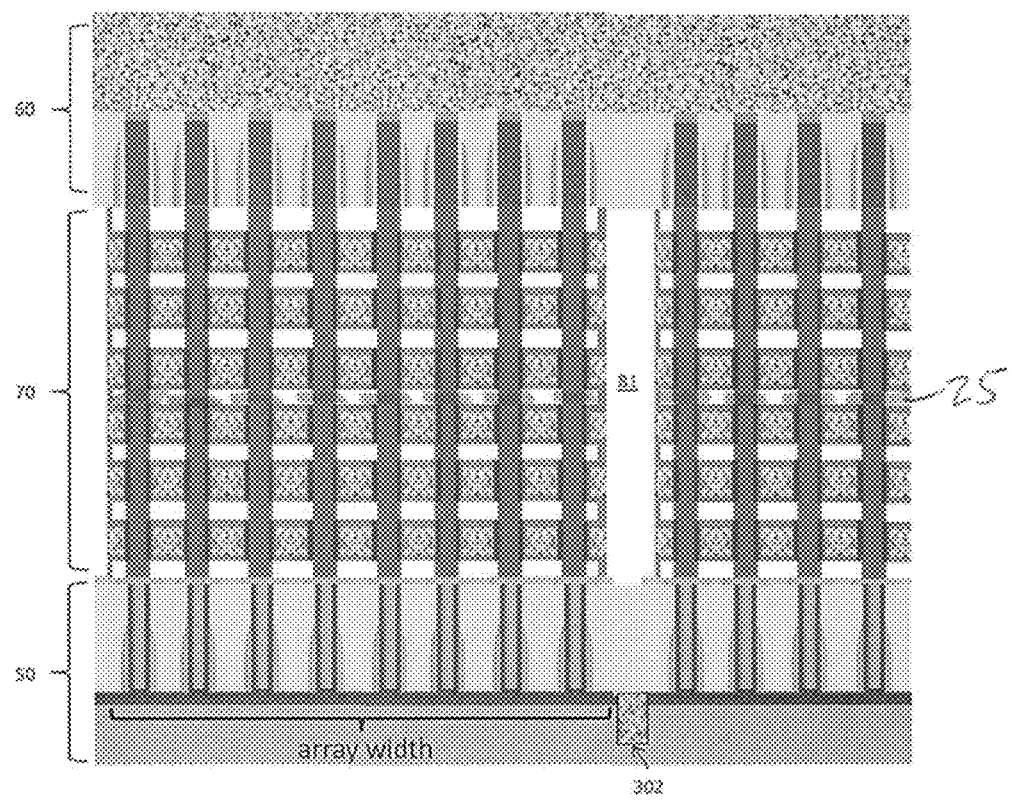
FIGS. 13A and 13B are side cross sectional views of NAND memory devices of other embodiments of the disclosure.
Figure 13B:
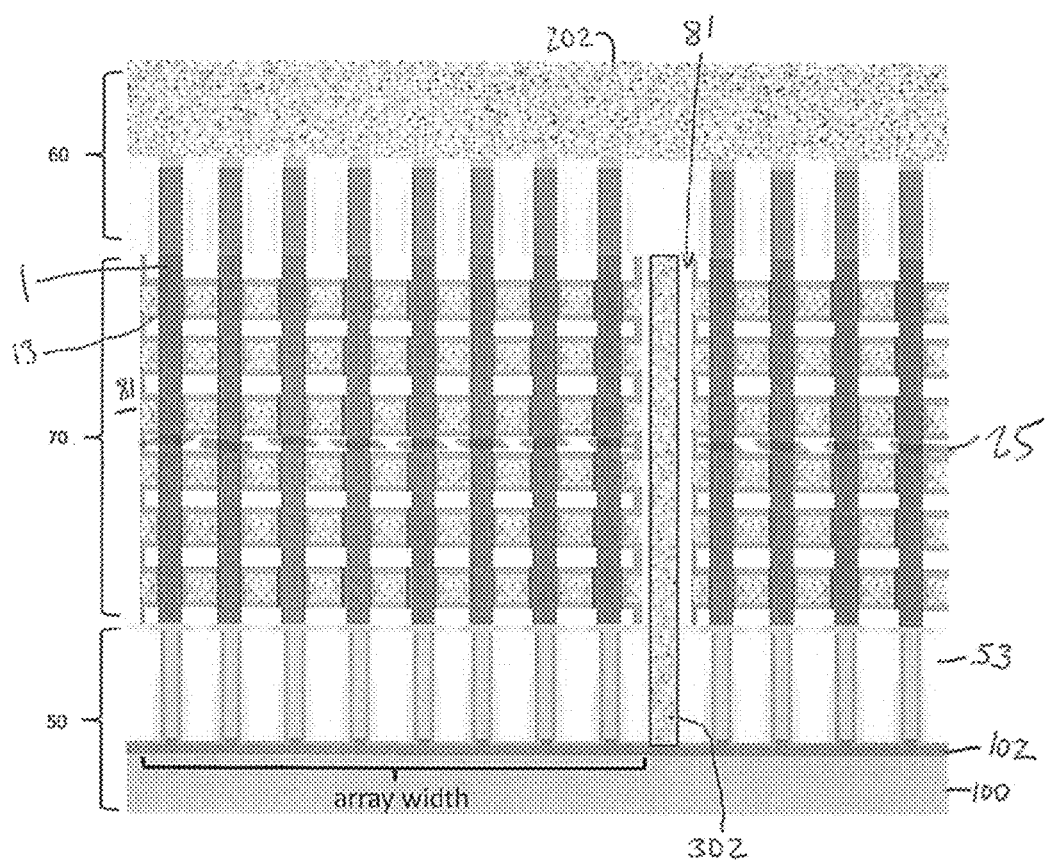

FIGS. 13A and 13B are side cross sectional views of a NAND memory device of embodiments of the disclosure. The devices shown in FIGS. 13A and 13B are similar to the device shown in FIG. 3A above, except that the devices shown in FIGS. 13A and 13B contain a local interconnect (source contact) 302. The local interconnect 302 may extend below the array in the embodiment of FIG. 13A (e.g., the local interconnect may extend in and out of the page under the array in the view of FIG. 13A). Alternatively, the local interconnect 302 may extend in the slit trenches 81 in the embodiment of FIG. 13B. The local interconnect 302 may comprise any suitable conductive material, such as tungsten, aluminum, copper, etc.

In the embodiment of FIG. 13B, the local interconnect 302 comprises a vertical pillar which electrically contacts the lower electrode 102 (e.g., the heavily doped semiconductor region source electrode in the major surface of the semiconductor substrate 100 or another electrode located over the substrate). The upper portion of the local interconnect 302 is in electrical contact with a source line.

In the present embodiment, the slit trenches 81 and the local interconnect 302 extend through the memory device levels 70 and through the dielectric trench fill material 53 to an exposed upper surface of the lower electrode 102. Preferably, the sidewalls of the slit trenches 81 are coated with an insulating layer 304, such as silicon oxide (see FIGS. 14D and 14E), and the local interconnect is formed in the middle of the slit trenches 81 between the insulating layer 304 portions.

As shown in FIG. 13B, the width of the array of vertical NAND strings is defined by the space between adjacent trenches 81, at least one or more of which can be filled with the local interconnect 302. The local interconnect 302 may contact a common lower electrode 102 of adjacent arrays of strings to provide source side erase for the strings in plural arrays of NAND strings at the same time.

The local interconnect may be formed by etching the trenches 81 as described above all the way to the lower electrode 102, forming the insulating layer 304 in the trenches 81 and filling the remaining central space in the trenches with the conductive material of the local interconnect 302. The portions of the conductive layer of the local interconnect 302 and/or insulating layer 304 which extends out of the trenches 81 may be removed by planarization, such as CMP. In the alternative embodiment of FIG. 13A, the local interconnect is formed under the array prior to formation of the array.

Figure 14C:
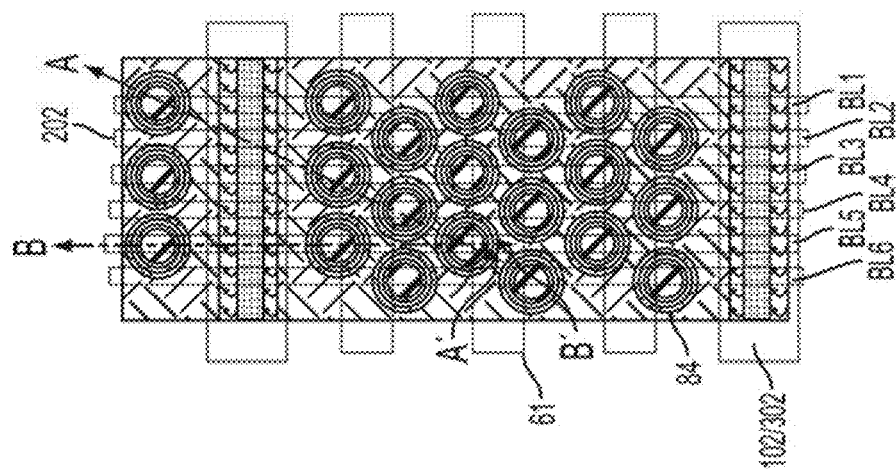
FIG. 14A is a top cross sectional view of the prior art device and FIGS. 14B and 14C are a top cross sectional views of NAND memory devices according to embodiments of the disclosure.
Figure 14B:
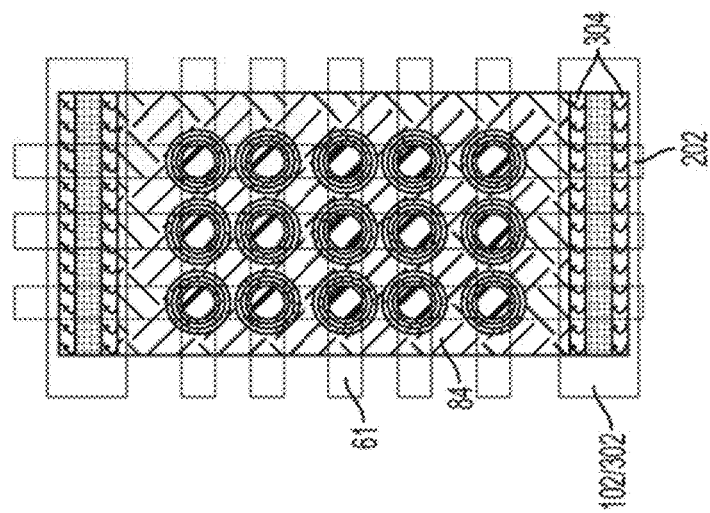
Figure 14A:
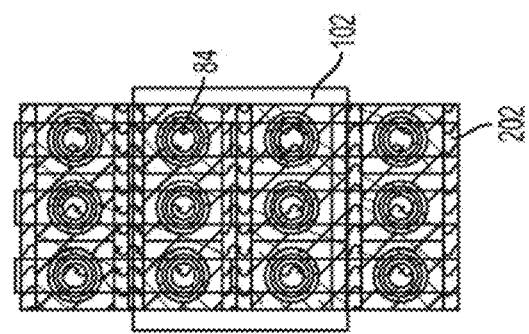

FIG. 14A is a top cross sectional view of the prior art BiCS NAND device shown in FIGS. 1B and 2B. FIGS. 14B and 14C are a top cross sectional views of the CVNAND memory devices according to embodiments of the disclosure.

As shown in FIG. 14B, the filled memory holes 84 (i.e., holes 84 containing the pillar channel 1 and memory film 13) are arranged in a square or rectangular layout with the memory holes located at corners of an imaginary rectangle or square, similar to the BiCS layout in FIG. 14A. The upper select gates 61, bit lines 202 and local interconnect 302 extending to the lower electrode 102 are also shown in FIG. 14B.

FIG. 14C illustrates an alternative embodiment in which the filled memory holes 84 (i.e., the NAND string channel 1 and memory film 13) are arranged in a substantially hexagonal pattern. This pattern comprises a repeating unit pattern of seven filled memory holes 84 having a central hole 84 surrounded by six other holes 84 arranged in a hexagonal layout around the central hole 84. In other words a central semiconductor channel 1 and memory film 13 unit is surrounded by six other semiconductor channel and memory film units arranged in a hexagonal layout around the central semiconductor channel and memory film unit. The hexagonal pattern has three axes of symmetry, in the same plane, about a point the array. The three axes are separated by substantially 60 degrees from one another. Hence, the memory holes 84 are arranged on a hexagonal grid which is also known as hexagonal tiling, bitruncated hexagonal tiling, or omnitruncated hexagonal tiling. Advantageously, hexagonal packing of the takes only about 87% of the area typically used by the same number of cells using standard rectangular layout shown in FIG. 14A.

The memory holes 84 in the hexagonally tiled configuration of FIG. 14C are staggered along each select gate 51, 61 when viewed from the top. The hexagonally tiled configuration of FIG. 14C provides a relaxed layout (i.e., larger pitch) for the select gates 51, 61 compared to the layout of FIGS. 14A and 14B. However, the density of the array with the hexagonally tiled configuration of FIG. 14C can be increased compared to the layout of FIGS. 14A and 14B, with the bit line 202 pitch reduced by a factor of 2 compared to the one in the layout of FIGS. 14A and 14B.

Figure 14D:
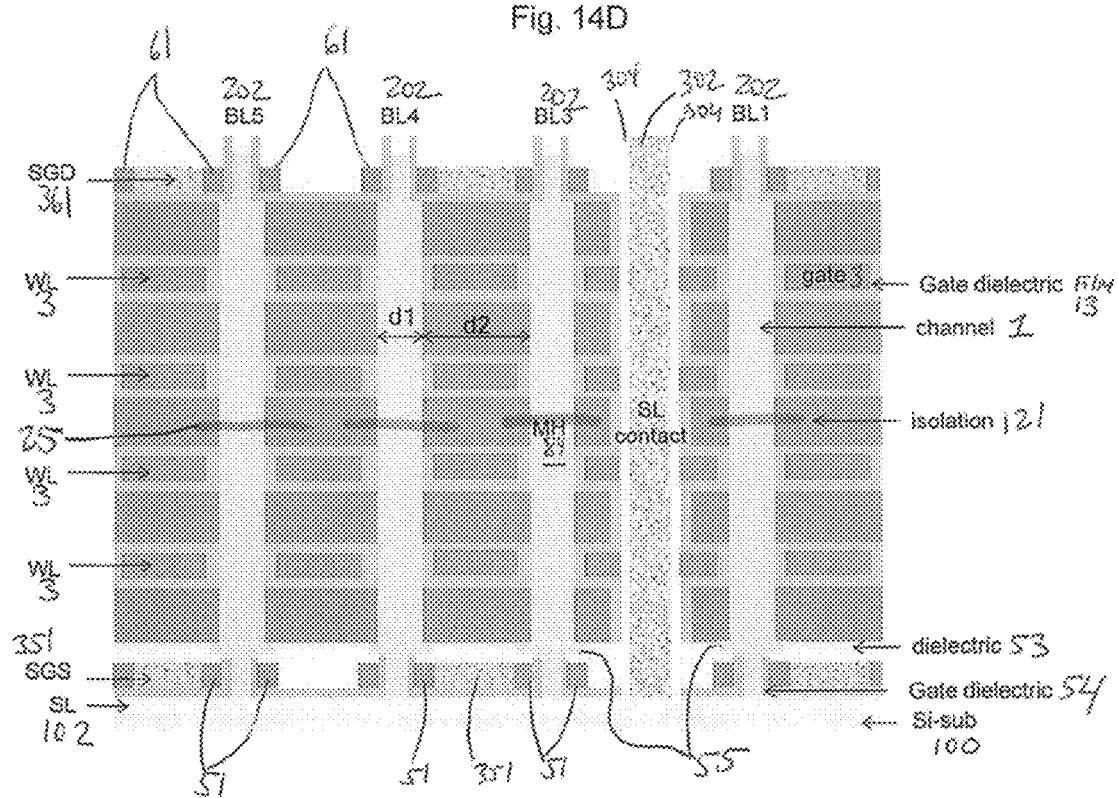
FIGS. 14D and 14E are respective side cross sectional views along lines A-A' and B-B' in FIG. 14C of a NAND memory device of an embodiment of the disclosure.
Figure 14E:
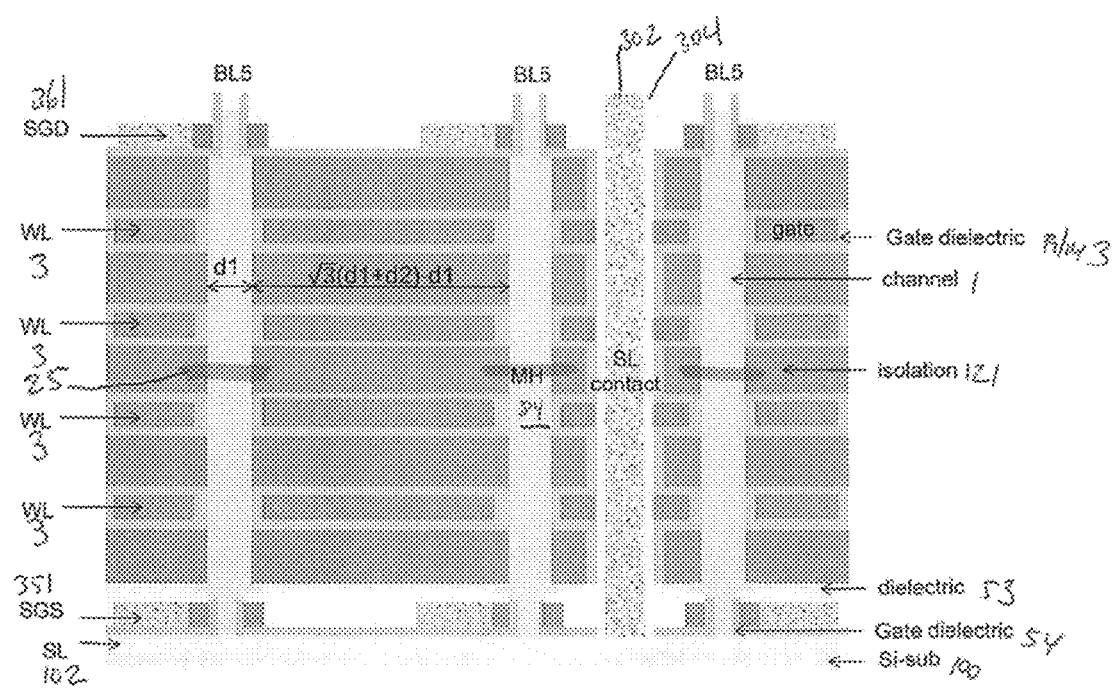

FIGS. 14D and 14E are respective side cross sectional views along lines A-A' and B-B' in FIG. 14C of the CVNAND memory device with the hexagonally tiled memory hole 84 configuration. Line A-A' is a diagonal line through filled memory holes 84 located on bit lines 1, 3, 4 and 5. Line B-B is a line along bit line 5. In the example shown in FIG. 14C, there are six bit lines (BL1, BL2, BL3, BL4, BL5 and BL6) and three select gates 61 which form a 6×3 hexagonally tiled array of eighteen NAND strings between adjacent local interconnects 302. Arrays having a configuration other than 6×3 may also be used as desired.

FIGS. 14D and 14E also illustrate the connector lines 351, 361 for the respective lower select gates 51 and upper select gates 61 of the respective SGS 16L and SGD 16U select transistors. The lines 351, 361 may comprise any suitable conductor, such as tungsten, and may connect the select gates to the driver/control circuits (not shown).

As shown in FIG. 14D, the diameter of each memory hole 84 is labeled d1 and the distance between adjacent memory holes 84 (along the diagonal line A-A' in FIG. 14C) is labeled d2. The distance between adjacent memory holes 84 (along a given bit line, BL5, along the vertical line B-B' in FIG. 14C) is $\sqrt{3}*(d1+d2)-d1$.

FIGS. 15A to 15H are schematic side cross sectional views of steps in the method of making the vertical pillar shaped channel type NAND memory device with one or more landing pads 25 shown in FIG. 2A. In this method, a lower portion of the channel 1 is formed in the respective lower portion of the memory opening 84 in the lower portion of the stack. This is followed by forming the landing pad 25, forming at least one additional portion of the stack, forming at least one additional portion of the memory opening to expose the landing pad 25 and forming at least one additional portion of the channel 1 in the memory opening in contact with the landing pad 25.

The method begins by forming the lower electrode 102, such as by implanting a heavily doped diffusion region 102 in the upper surface 100a of the substrate 100. For example, region 102 may comprise an n+ doped region in a p-type substrate 100, as shown in FIG. 15A. The conductivity types may be reversed if desired. Diffusion (doped) region 102 serves as a common source line of the lower select gate transistor to be formed in region 16LS containing a sacrificial layer 132S (e.g. a SiN layer).

The lower portion of the memory stack 120L is then formed over the upper surface 100a of the substrate 100. The stack contains alternating insulating layers 121, such as silicon oxide layers, and sacrificial layers 132, such as silicon nitride layers. A hard mask 27 is formed over the lower portion of the stack. The hard mask is patterned (e.g., by lithography) and is used as a mask to etch the lower portions of the memory openings 84x in the lower portion of the stack 120L. The etching may comprise an RIE or another suitable etching. The hard mask 27 may then be removed or retained in the device. Alternatively, the hard mask is consumed during the etching process.

Then, the lower portion of the channels 1x are formed in the lower portion of the memory openings 84x, as shown in FIG. 15B. The lower portion of the channels 1x may have a pipe shape as illustrated in FIG. 15B, the center of which may be filled with an insulating material 2. Alternatively, the memory openings 84x may be completely filled with semiconducting material to form the lower portions of the channels 1x. Any suitable formation method may be used, such as the method described above with respect to FIGS. 7-10.

Figure 15C:
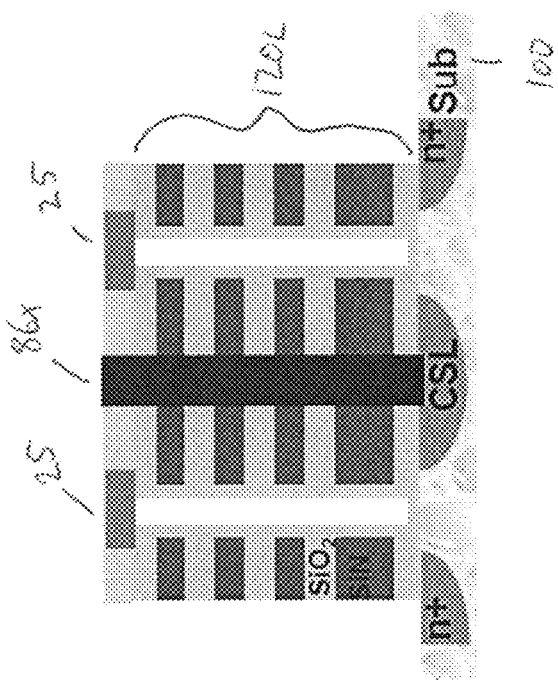

The landing pad 25 is then formed on top of the lower portion of the channel 1x, as shown in FIG. 15C. The landing pad 25 may be formed using any suitable method, such as the method described above for forming the additional landing pad 25 with respect to FIGS. 6C-6D.

For example, a semiconductor landing pad 25 may be epitaxially grown over the each lower portion of the channels 1x exposed in the lower portion of the stack 120L, such that the landing pad has a larger width or diameter than an underlying lower portion of the channel 1x. The landing pad 25 formation may comprise epitaxially growing a "mushroom head" shaped overgrown silicon on exposed lower portions of the channels 1x. This silicon overgrowth is then covered by an insulating gap fill layer (e.g., silicon oxide or nitride). The silicon mushroom head and the gap fill layer are then planarized (e.g., by CMP) to form planar landing pads 25 on each portion of the channel 1x separated by an insulating gap fill 521, as shown in FIG. 15C.

Alternatively, the landing pads 25 may be formed by depositing a conductive or a doped semiconductor layer over the lower portion of the stack 120L and then patterning the layer by lithography and etching to leave landing pads 25 having a larger width than that of the lower channel portion 1x. If the landing pads 25 are made of a doped semiconductor, then the landing pads 25 preferably have a higher doping concentration than the channel 1.

Figure 15D:
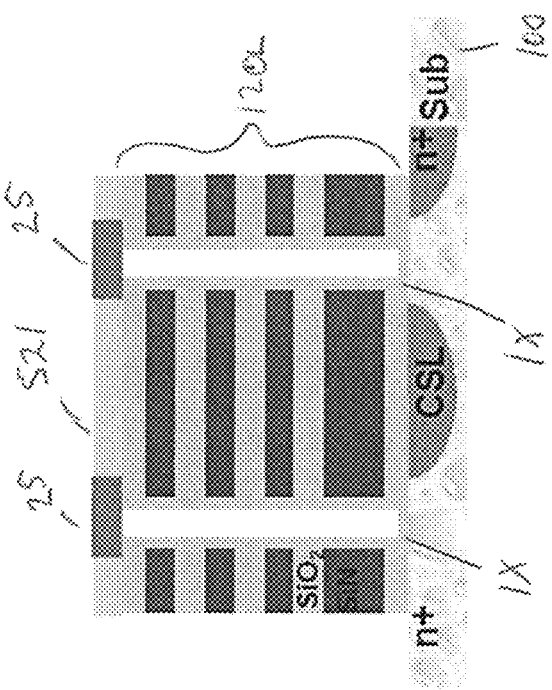

As illustrated in FIG. 15D, a lower portion of the word line cut or trench 86x may then be formed in the lower portion of the stack 120L. This cut or trench 86x may be formed by photolithography and etching. The cut or trench 86x may be filled with a sacrificial or insulating material to protect it during subsequent processing. Alternatively, the portion of the cut or trench 86x is omitted and the entire cut or trench 86 is formed in a single etching step after all of the memory levels are completed. This completes the lower memory level of the NAND device.

Then, the above process may be repeated one or more times to form one or more additional memory levels over the lower memory level. As shown in FIG. 15E, the process of FIGS. 15A-15D is repeated for the middle portion of the stack 120M. Specifically, the middle portion of the stack 120M is formed over the landing pads 25 and the lower portion of the stack 120L containing the lower portions of the channels 1x. Another hard mask is formed over the middle portion of the stack 120M, and the middle portions of the memory openings 84y are etched into the middle portion of the stack 120M to expose the landing pads 25, as shown in FIG. 15E. It should be noted that the lower 84x and middle 84y portions of each memory opening 84 may be partially or completely misaligned with each other, as long the landing pads 25 are exposed in respective middle portions of the memory openings 84y.

Then, the middle portion of the channels 1y are formed in the middle portions of the memory openings 84y, as shown in FIG. 15E. The landing pad 25 is then formed on top of the middle portion of the channel 1y. The landing pad 25 may be formed using any suitable method, such as the method described above. As illustrated in FIG. 15F, a middle portion of the word line cut or trench 86y may then be formed in the middle portion of the stack 120M. This cut or trench 86y may be formed by photolithography and etching, and optionally filled with a sacrificial or insulating material. This completes the middle memory levels.

If desired, one or more additional middle or upper portions of the memory levels are then formed over the middle memory levels. As shown in FIGS. 15E and 15F, the process of FIGS. 15A-15D is repeated for the upper portion of the stack 120U. Specifically, the upper portion of the stack 120U is formed over the landing pads 25 and the middle portion of the stack 120M containing the middle portions of the channels 1y. Another hard mask is formed over the upper portion of the stack 120U, and the upper portions of the memory openings 84z are etched into the upper portion of the stack 120U to expose the landing pads 25, as shown in FIG. 15E. It should be noted that the middle 84y and upper 84z portions of each memory opening 84 may be partially or completely misaligned with each other, as long the landing pads 25 are exposed in respective upper portions of the memory openings 84z.

Then, the upper portion of the channels 1z are formed in the upper portions of the memory openings 84z, as shown in FIG. 15E. The landing pad 25 is then formed on top of the upper portion of the channel 1z. The landing pad 25 may be formed using any suitable method, such as the method described above. The upper select transistor region 16US may also be formed during this step or during a separate step.

Figure 15I:
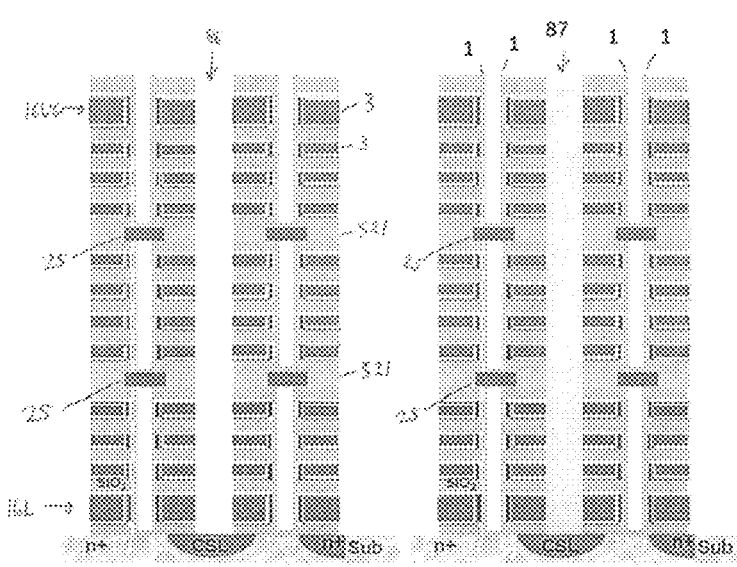
Figure 15J:
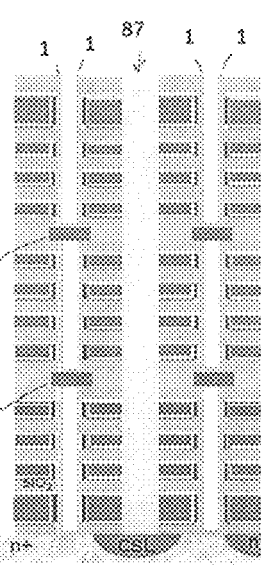

As illustrated in FIG. 15F, an upper portion of the word line cut or trench 86z is then formed in the upper portion of the stack 120U. This cut or trench 86z may be formed by photolithography and etching. If the cut or trench portions 86x, 86y were filled with a sacrificial material, then the sacrificial material is removed at this time and the cut or trench may be subsequently refilled with an insulating material. Alternatively, the entire cut or trench 86 is formed in a single etching step at this time through the entire stack 120 as illustrated in FIGS. 15I-15J.

The memory films and the control gate electrodes are then formed in the entire stack 120 using a back side process (similar to the process shown in FIGS. 8-10). First, as shown in FIG. 15G, the sacrificial material layers 132 (such as the silicon nitride layers), are removed from the stack 120 through the cut or trench 86 using a selective wet etch to leave recesses 62 between the insulating layer 121 in the stack 120. The memory film 13 (e.g., an ONO film) is then formed on the surface of the recesses 62 through the cut or opening 86, as shown in FIG. 15H. The control gate electrodes 3, such as metal (e.g. W or Ti) and/or metal nitride, (e.g. WN or TiN) are then formed in the recesses 62 on the memory films 13 through the cut or opening 86, as shown in FIG. 15I.

In an alternative embodiment, the back side process shown in FIGS. 15F-15I is performed on each portion of the stack between the channel and landing pad formation steps rather than on the entire stack. In this alternative method, after the lower portion of the channels 1x are formed in the lower stack portion 120L in FIG. 15B, the cut or trench 86x is formed in the lower portion of the stack 120L and sacrificial material layers 132 are removed to leave recesses 62. The recesses are then filled with the memory films 13 and the control gate electrodes 3. The cut or trench 86x may be filled with an insulating or sacrificial material and the landing pads 25 are then formed on the lower portion of the channels 1x. The process then continues as shown in FIG. 15E.

Then, after the middle portion of the channels 1y are formed in the middle stack portion 120M in FIG. 15E, the cut or trench 86y is formed in the middle portion of the stack 120M and sacrificial material layers 132 are removed to leave recesses 62. The recesses are then filled with the memory films 13 and the control gate electrodes 3. The cut or trench 86y may be filled with an insulating or sacrificial material and the landing pads 25 are then formed on the middle portion of the channels 1y. The process then continues as shown in FIGS. 15E-15H.

Then, after the upper portion of the channels 1z are formed in the upper stack portion 120U in FIG. 15H, the cut or trench 86z is formed in the upper portion of the stack 120L and sacrificial material layers 132 are removed to leave recesses 62. The recesses are then filled with the memory films 13, the control gate electrodes 3 as well as the lower 16LG and upper 16UG select gate electrodes in the respective regions in 16LS and 16US to form the lower 16L and upper 16U select gate transistors. The cut or trench 86z may be filled with an insulating material 87. This results in the device shown in FIG. 15J.

Figure 15K:
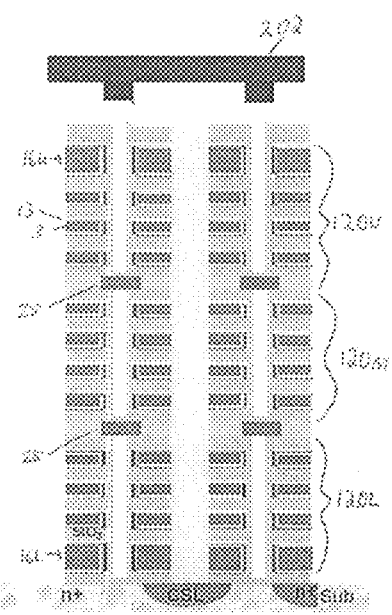

After the control gate electrodes 3 are formed, either by the method of FIGS. 15A-15J or by the alternative method described above, the bit line contact 202 is then formed in contact with the upper channel portion 1z as shown in FIG. 2A or 15K to complete the pillar shaped channel vertical NAND with landing pads 25.

A similar method may be used to form the CVNAND of FIGS. 3A-14E, as shown in FIGS. 16A and 16B. As shown in FIG. 16A, the lower portion of the memory levels 70L is formed over the lower select gate level 50, which is formed using the methods shown in FIGS. 5A-6D. The lower portion of the memory levels 70L includes the lower portion of the memory stack 120L. A hard mask is formed over the lower portion of the stack. The hard mask is patterned (e.g., by lithography) and is used as a mask to etch the lower portions of the memory openings 84x in the lower portion of the stack 120L. The etching may comprise an RIE or another suitable etching. The hard mask may then be removed or retained in the device. Alternatively, the hard mask is consumed during the etching process.

Then, the lower portions of the memory films 13x and the channel 1x are formed in the lower portions of the memory openings 84x as shown in FIG. 16A. Any suitable formation method may be used, such as the method described above with respect to FIGS. 7-10 or the front side method described below with respect to FIGS. 17A-17H. The landing pad 25 is then formed on top of the lower portion of the channel 1x. The landing pad 25 may be formed using any suitable method, such as the method described above. This completes the lower memory levels 70L of the NAND device.

Then, the above process may be repeated one or more times to form one or more additional memory levels 70U over the lower memory levels 70L. As shown in FIG. 16B, the process of FIG. 16A is repeated for the upper portion of the stack 120U. Specifically, the upper portion of the stack 120U is formed over the landing pads 25 and the lower portion of the stack 120L containing the lower portions of the channels 1x. Another hard mask is formed over the upper portion of the stack 120U, and the upper portions of the memory openings 84z are etched into the upper portion of the stack 120U to expose the landing pads 25. It should be noted that the lower 84x and upper 84z portions of each memory opening 84 may be partially or completely misaligned with each other, as long the landing pads 25 are exposed in respective upper portions of the memory openings 84z.

Then, the upper portions of the memory films 13z and the channel 1z are formed in the upper portions of the memory openings 84z as shown in FIG. 16B. The upper select transistor level 60 is then formed over the upper memory levels 70U using the method shown in FIGS. 11A-12B. A similar method to the one described in FIGS. 15A-15F and 16A-16B may be used to form other vertical NAND devices with landing pads, such as P-BiCS type devices.

FIGS. 17A through 17H illustrate another embodiment of making 3D vertical NAND devices. Specifically, FIGS. 17A-17H illustrate a method of overcoming misalignment of the memory holes in making NAND memory devices that have at least two memory stacks. In this embodiment method, lower portions of the memory openings 84x are formed in the lower portion of the stack 120L. This is followed by filling the lower parts 84s of the lower portions of the memory openings 84x with a sacrificial material 31, and widening the remaining exposed top parts 84t of the of the lower portions of the memory openings 84x where the landing pad 25 will be subsequently formed. The widened part 84t is then filled with a sacrificial material. Then, at least one additional portion of the stack 120U is formed over the lower portion of the stack 120L. At least one additional portion (e.g., the upper portions) of the memory openings 84z are formed in the additional portion of the stack 120U to expose the sacrificial material in part 84t of the lower portions of the memory openings 84x. Then, the sacrificial material is removed from the entire opening 84 and the entire memory films 13 are formed in the memory openings 84 followed by forming the entire channels 1 and the landing pads 25 in the memory openings 84 in the same growth step (e.g., CVD growth step). Thus, in this method, the entire channel 1 (including landing pads 25 built into the channel 1) is formed in one step rather than in plural steps by using the sacrificial material to temporarily fill the memory opening portion 84x.

As shown in FIG. 17A, a lower portion of the stack 120L of alternating layers 3, 121 is formed over the major surface 100a of the substrate 100. Layers 3, 121 may be deposited over the substrate by any suitable deposition method, such as sputtering, CVD, PECVD, MBE, etc. The layers 3, 121 may be 6 to 100 nm thick. The substrate 100 may contain a sacrificial material region 29, such as a carbon or other suitable material.

The lower portion of the stack 120L may be covered with an optional cap layer of insulating material 123. The cap layer 123 is preferably thicker than layers 3, 121. For example, layer 123 may be 50-200 nm thick, such as 60-75 nm thick. The cap layer may comprise a silicon oxide layer, such as a silicon oxide layer formed by CVD using a TEOS precursor.

In this embodiment, the first layers 121 comprise an electrically insulating material, such as silicon oxide, silicon nitride, high-k dielectric (e.g., organic or inorganic metal oxide), etc. The second layers 3 comprise control gate material layers rather than the sacrificial material layers 132. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof. Thus, the stacks 120 in the pillar shaped channel, P-BiCS and/or CVNAND type devices may comprise alternating insulating 121 and sacrificial 132 layers (in the "back-side" process where the sacrificial material layers 132 are removed from the stack and the memory films 13 and control gate electrodes 3 are formed in place of layers 132 through the back side cut and recesses) or alternating insulating 121 and control gate 3 material layers (in a process where the control gate material layers are part of the initial stack and the memory film is formed through the memory holes 84).

The deposition of layers 3, 121 is followed by etching the lower stack portion 120L to form a plurality of lower portions of the memory openings 84*x*. Then, as shown in FIG. 17B, the etch is continued into the sacrificial material region 29 to remove the sacrificial material and leave a connecting opening 30 which connects two adjacent lower portions of memory openings 84*x*. The openings 84*x* will eventually contain the two wing portions 1*a* and 1*b* of the U-shape semiconductor channel which extend substantially perpendicular to the major surface 100*a* of the substrate 100, and the connecting opening 30 will contain the connecting portion 1*c* of the U-shape semiconductor channel 1 which connects the two wing portions 1*a*, 1*b* and which extends substantially perpendicular (i.e., horizontally) to the major surface 100*a* of the substrate 100.

As shown in FIG. 17C, the lower parts 84*s* of the lower portions of the memory openings 84*x* and the connecting opening 30 are filled with a sacrificial material 31. The sacrificial material may comprise any material which may be selectively etched compared to the materials of layers 3 and 121 and the material of the substrate 100. For example, for a silicon substrate 100, polysilicon control gate material layers 3 and silicon oxide layers 121, the sacrificial material 31 may comprise carbon, such as amorphous carbon. However, any other material may also be used.

Then, as shown in FIG. 17D, the remaining exposed top parts 84*t* of the lower portions of the memory openings 84*x* are widened such that the top parts 84*t* have a larger width (e.g., larger diameter) than the bottom part 84*s*. Preferably, the width (e.g., diameter) of the top part 84*t* is the same as the intended width (e.g., diameter) of the landing pad 25 which will be subsequently formed in the top part 84*t*. The widening may be performed by isotropically etching the cap layer 123 without substantially etching the sacrificial material 31 in the lower parts 84*s* of the lower portions of the memory openings 84*x*. The widened top parts 84*t* are then refilled with the sacrificial material 31*a*. Material 31*a* may be the same or different from material 31. Material 31*a* may be recessed to the top of the cap layer 123 by CMP or etchback.

Then, at least one additional portion of the stack (e.g., the upper portion of the stack) 120U is formed over the lower portion of the stack 120L, as shown in FIG. 17E. The additional portion of the stack 120U may also comprise alternating layers 3 and 121 described above. At least one additional portion (e.g., the upper portions) of the memory openings 84*z* are formed in the additional portion of the stack 120U to expose the sacrificial material 31*a* in the top part 84*t* of the lower portions of the memory openings 84*x*. If desired, the upper portions of the memory openings 84*z* may be intentionally or unintentionally misaligned with the lower parts 84*s* of the lower portions of the memory openings 84*x*, as long as the upper portions of the memory openings 84*z* expose a portion of the sacrificial material 31*a* in the widened top parts 84*t* of the lower portions of the memory openings 84*x*.

As shown in FIG. 17F, the sacrificial material 31, 31*a* is removed from the entire memory opening 84 (i.e., from both parts 84*s* and 84*t*). This may be performed by selectively etching away the sacrificial material in the memory opening. This forms the continuous memory openings 84 that extend through both the lower 120L and upper 120U portions of the stack 120. Each memory opening 84 includes portions 84*z* and 84*x* (which is made up of parts 84*s* and 84*t*) and the connecting opening 30.

The entire memory films 13 are then formed in the memory openings 84 in the entire stack, as shown in FIG. 17G. The memory films 13 are formed as hollow cylinders around the sidewalls of the openings 84.

This is followed by forming the entire U-shaped channels 1 and the landing pads 25 in the memory openings 84 in the same growth step inside the hollow memory film 13 cylinder. The two wing portions 1*a* and 1*b* of the U-shape semiconductor channel 1 extend substantially perpendicular to the major surface 100*a* of the substrate 100 in portions 84*z*, 84*x* of the memory openings, and the connecting portion 1*c* of the U-shape semiconductor channel 1 which connects the two wing portions 1*a*, 1*b* extends substantially perpendicular (i.e., horizontally) to the major surface 100*a* of the substrate 100 in the connecting opening 30. In this embodiment, the landing pad 25 may be relatively thick and contact dummy control gates 3*d*, as shown in FIG. 17G. Dummy control gates 3*d* (i.e., dummy word lines) are not connected to outside control circuitry and are not provided with a current or voltage during NAND operation.

A slit trench or cut 86A is then formed between the select gates 3 and the wings or arms of the U-shaped channel 1, as shown in FIG. 17H. The slit trench or cut 86 may be etched until the etch stop layer 89 shown in FIG. 2B is reached during the etching. The trench or cut 86A may be filled with an insulating material 87, such as silicon nitride. The select gate transistors 16, the source line 102 and the bit line 202 are then formed above the device, as shown in FIG. 2B. Optionally, the substrate may include a body contact gate (e.g. bottom gate) 91 located adjacent to the connecting portion 1*c* of the U-shape semiconductor channel 1, as shown in FIG. 2B.

If desired, the substrate may comprise a silicon on insulator type substrate containing one or more insulating layers 93 (e.g., silicon oxide/silicon nitride/silicon oxide stack) over a silicon wafer, as shown in FIG. 2B.

Figure 1A:
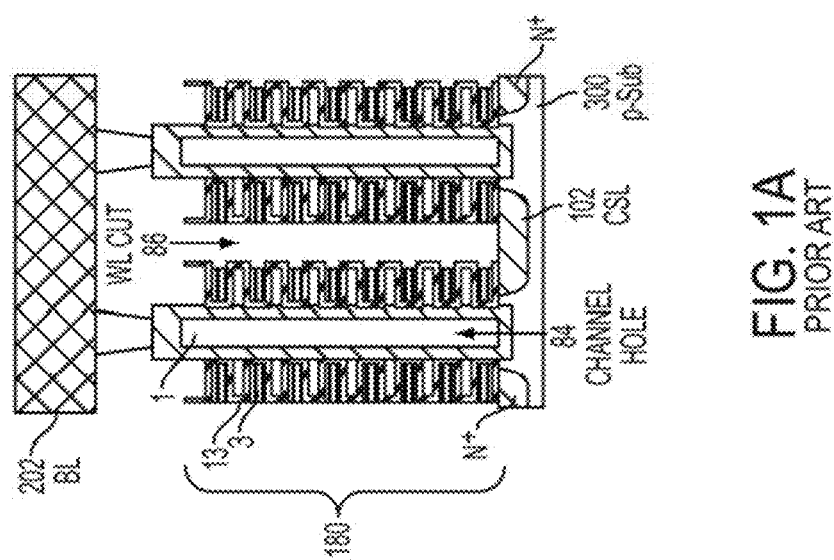
FIG. 1A is a side cross sectional views of a prior art NAND memory device.

In another embodiment of the present disclosure, the vertical NAND devices described above (e.g., pillar shaped channel, P-BiCS or CVNAND type devices) may have a channel 1 comprising a mixed metal oxide semiconductor material. The devices with the mixed metal oxide semiconductor channel may include the landing pads 25 and be made by the sequential stack etching process described above. Alternatively, the vertical NAND devices with the oxide semiconductor channel may exclude the landing pad and have the entire memory holes etched in one step (e.g., such as the devices shown in FIGS. 1A and 1B).

Any suitable mixed metal oxide semiconductor material may be used. For example, the mixed metal oxide semiconductor comprises at least one first transition metal and at least one second metal selected from Group IIIA of the Periodic Table of Elements. The mixed metal oxide semiconductor my comprise one first transition metal from Group IIB (also known as Group 12) of the Periodic Table of Elements and two metals selected from Group IIIA (also known as Group 13) of the Periodic Table of Elements. Preferably, the mixed metal oxide comprises indium gallium zinc oxide (stoichiometric InGaZnO4 or non-stoichiometric material). Other mixed metal oxide semiconductors, such as zinc tin oxide (stoichiometric ZnSnO3 or non-stoichiometric material) or indium zinc oxide may also be used. The mixed metal oxide channels have a low leakage current and may be deposited at a low temperature (e.g., below 300 C, such as 100-270 C) into high aspect ratio memory holes 84 using atomic layer deposition (ALD) or other suitable methods.

FIGS. 18A to 18F are side cross sectional views of steps in the method of making the NAND memory device according to another embodiment. This embodiment includes a lower stack 120L of alternating control gate electrodes 3 and dielectric fill material 121 provided over a substrate 100. In an embodiment, the device includes an etch stop layer 89 located between a top surface of the substrate 100 and the stack 120L. As discussed in the previous embodiment, an optional sacrificial material region 29 which may be used to form a horizontal portion of a U-shaped channel 1 may also be provided.

Figure 18B:
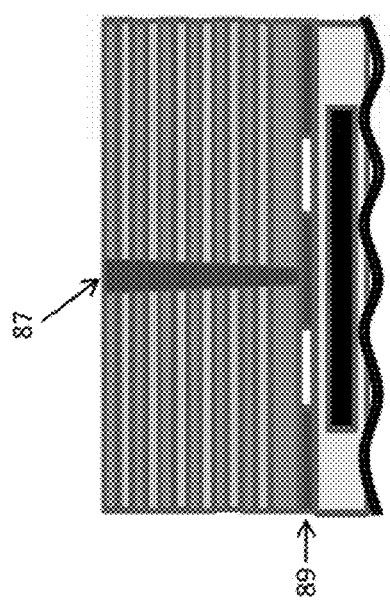
FIGS. 18A to 18F are side cross sectional views of steps in method of making the NAND memory device with a current boosting layer according to another embodiment.

Next, an optional slit trench may be etched to the etch stop layer 89 between the wings or arms of the U-shaped channel 1 and filled with a dielectric 87 as illustrated in FIG. 18B. Memory openings may then be etched through the stack 120 and the etch stop layer 89 to the sacrificial material region 29. The sacrificial material in sacrificial material region 29 is removed and the memory films (i.e. the blocking dielectric layer 7, charge storage regions 9, and tunnel dielectric 11) and channels 1 are formed in the memory openings as illustrated in FIG. 18C.

Figure 18D:
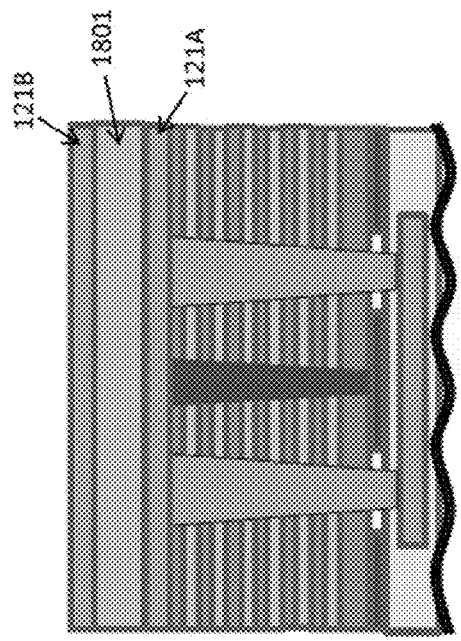
Figure 18A:
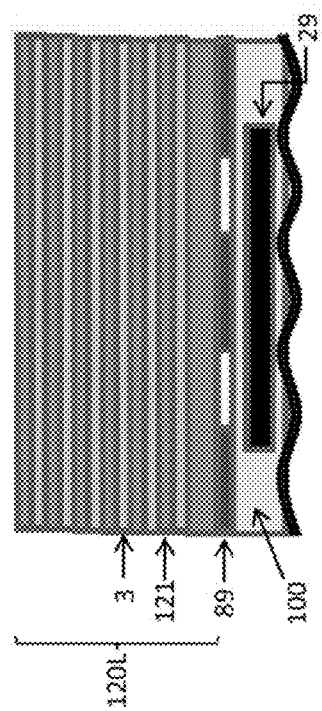
Figure 18C:
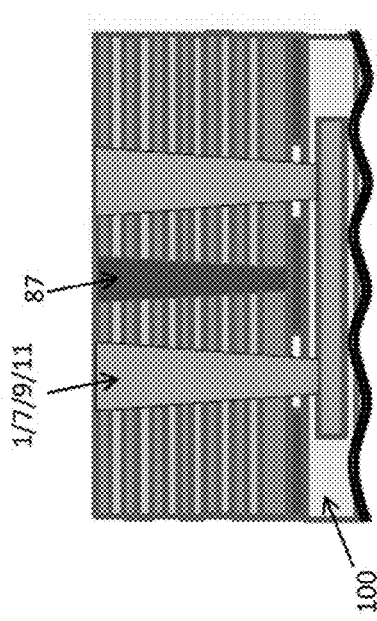

Next, as illustrated in FIG. 18D, a first insulating layer 121A, such as an oxide, is deposited over the stack 120L. A conducting or semiconducting current boosting layer 1801 is deposited over the insulating layer 121A. The current boosting layer 1801 may be a metal (e.g. tungsten or titanium), metal nitride, (e.g. WN or TiN), silicide or highly doped polysilicon (e.g., dopant concentration of at least 1018 cm-3). A second insulating layer 121B (e.g., silicon oxide) is then deposited over the current boosting layer 1801. As illustrated in FIG. 18E, a mask, such as a photoresist mask, may be applied to the surface of the second insulating layer 121B and patterned. Portions of the second insulating layer 121B, the current boosting layer 1801 and the first insulating layer 121A located over the memory holes may be removed by etching. A conducting or semiconducting material may then be deposited in the etched portion of the mask to form thick landing pads 25. That is, landing pads 25 may have a thickness greater than the thickness of the current boosting layer 1801 (e.g. 10-200% thicker, such as 50-100% thicker). The thick landing pads 25 are in electrical contact with both the current boosting layer 1801 and the channel 1. Alternatively, the current boosting layer 1801 may be thicker or the same thickness as the landing pads 25. Current flow in the NAND device can be boosted by applying a voltage to the current boosting layer 1801.

Figure 18F:
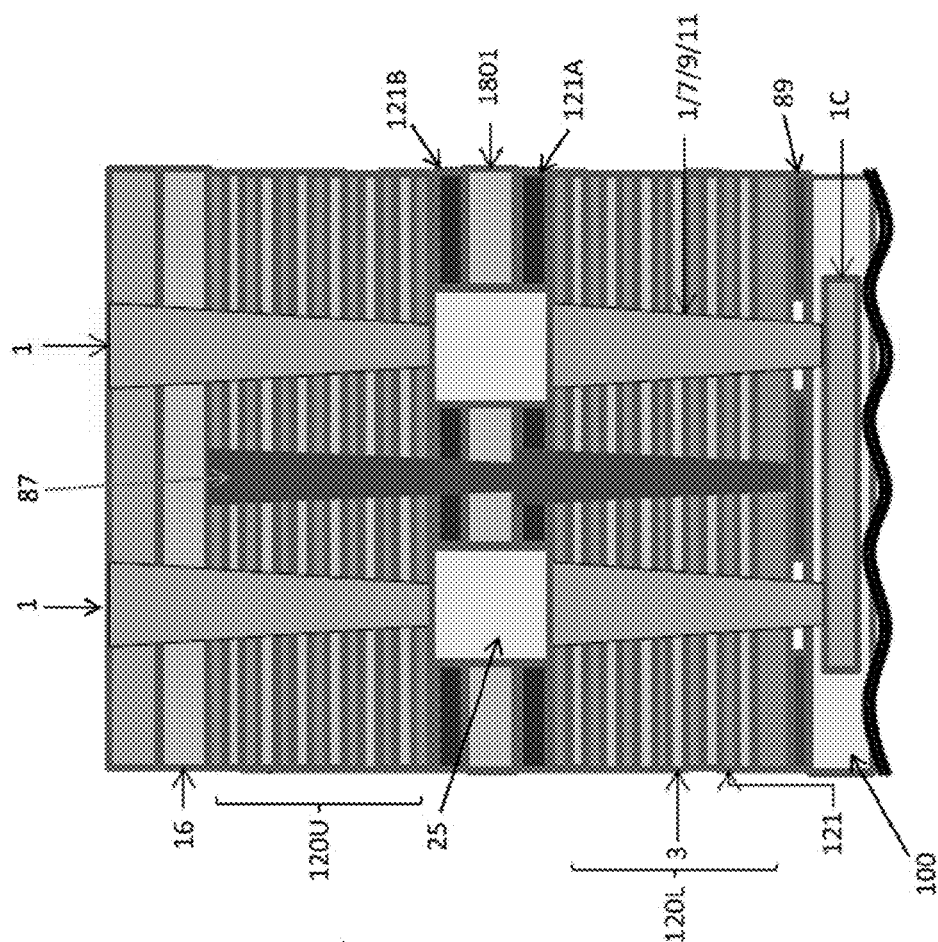
Figure 18E:
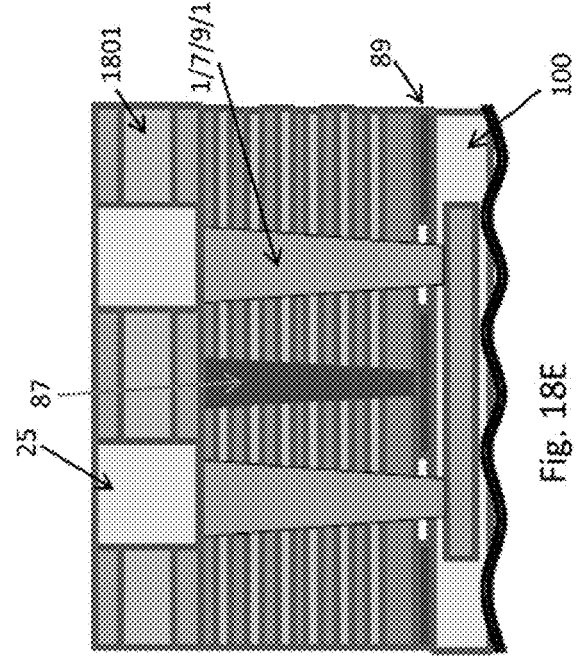

Next, as illustrated in FIG. 18F, the mask may be removed and a second, upper stack 120U of alternating control gate electrodes 3 and dielectric fill material 121 may be deposited over the second insulating layer 121B and the thick landing pads 25. The optional slit trench may then be extended through the upper stack 120U by etching to form a slit trench through the upper stack, the current boosting layer and the first and second insulating layers sandwiching the current boosting layer to the filled slit trench in the lower stack and filling the slit trench with a dielectric. After completing the filled slit trench, the select gates 16 may be formed over the upper stack 120U.

FIG. 18G illustrates another embodiment of a vertical NAND device with a current boosting layer 1801 and landing pad 25. Unlike the vertical NAND device illustrated in FIGS. 18A-18F which have a "U" shaped channel 1, the vertical NAND device illustrated in FIG. 18G has a single vertical pillar shaped channel. The vertical NAND device illustrated in FIG. 18G includes a lower select gate electrode 16L located proximal to the substrate 100 under the memory cells and the control gate electrodes, and an upper select gate electrode 16U located over the memory cells and the control gate electrodes. As in the previous embodiment, the vertical NAND device of this embodiment may have more than two stacks 120 of alternating control gate electrodes 3 and dielectric fill material 121. Further, if the vertical NAND device includes more than two stacks 120, then the device may have more than one current boosting layer 1801 (e.g. if the vertical NAND device has three stacks 120L, 120M, 120U, then the device may include a current boosting layer 1801 between the lower stack 120L and the middle stack 120M and a current boosting layer 1801 between the middle stack 120M and the upper stack 120L).

The current boosting layer 1801 is electrically connected to a voltage or current source and to the landing pad embedded in the semiconductor channel. In operation of the vertical NAND device, current or voltage may be applied to the current boosting layer 1801 during at least one of a read, program or erase steps of the vertical NAND device. In this manner, additional current or voltage may be provided to an interface region containing the landing pad between the upper and lower stacks 120U, 120L (and any intermediate stacks 120, if provided). The applied current or voltage assists in charge carrier (e.g., electron or hole) flow through the landing pad and the interface region. The additional current or voltage improves operation of the device (e.g. provides additional current flow between the select transistors 16L, 16U in each memory string), thereby increasing the reliability of operation by ensuring that sufficient current or voltage is available for proper operation of the stacks 120 of memory device levels in the NAND device.

FIGS. 19A to 19D illustrate a method of making the NAND memory device according to another embodiment. FIG. 19E is a schematic circuit diagram of the device of FIG. 19D. In this embodiment, at least one landing pad is located between a select gate electrode and an end control gate electrode in the stack. For example, the select gate electrode may comprise an upper select gate electrode and the end control gate electrode may comprise a top control gate electrode in the stack, and/or the select gate electrode may comprise a lower select gate electrode and the end control gate electrode may comprise a bottom control gate electrode in the stack.

Figure 19A:
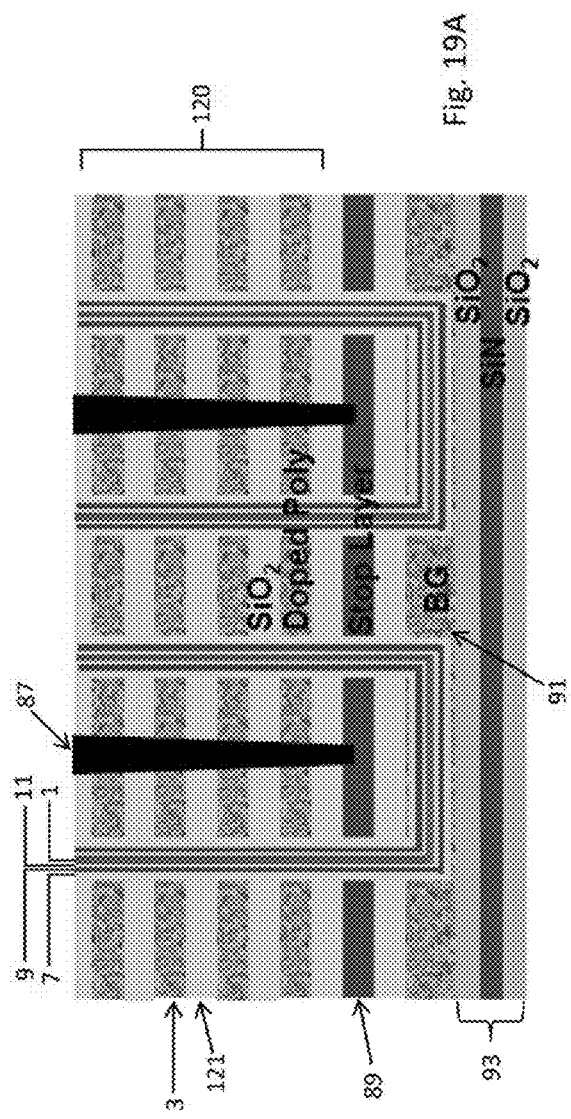
FIGS. 19A to 19D are side cross sectional views of steps in the method of making the NAND memory device according to another embodiment.

As illustrated in FIG. 19A, this embodiment includes a stack 120 of alternating control gate electrodes 3 and dielectric fill material 121 provided over a substrate 100. In an embodiment, the substrate 100 may comprise a silicon on insulator type substrate containing one or more insulating layers 93 (e.g., silicon oxide/silicon nitride/silicon oxide stack) over a silicon wafer, as shown in FIG. 19A. Additionally, the substrate may include a bottom gate 91. To protect the bottom gate 91 during subsequent processing, an etch stop layer 89 may be provided between the bottom gate 91 and the stack 120.

In previous embodiments, landing pads 25 were provided between memory stacks 120. In this embodiment, the device includes at least one semiconductor or electrically conductive landing pad 2001 located between the stack(s) 120 of alternating control gate electrodes 3 and dielectric fill material 121 and at least one select gate electrode 16. Preferably, the landing pad 2001 is located between an upper select gate electrode 16 and an upper most control gate electrode 3 in the stack 120. Alternatively, or in addition the landing pad 2001 may be located between the lower select gate electrode (e.g., 16L in FIG. 18G) and the lower most control gate electrode 3 in a vertical NAND string having a single vertical pillar channel, such as the string shown in FIG. 18G. In an embodiment, a landing pad 2001 is provided between at least one of (1) the source select gate electrode 16S and the first and the second control gate electrodes 3 and (2) the drain select gate electrode 16D and the first and the second control gate electrodes 3. Preferably, landing pads 2001 are provided for both the source select transistor 2003 channel 1S and the drain select transistor 2005 channel 1D for embodiments with U-shaped channels as illustrated in FIGS. 19B-19E. For NAND strings with a vertical channel (e.g., such as the strings shown in FIGS. 2A and 3A), one landing pad 2001 is shown as being provided for the channel of the upper select gate transistor (which may be either the source select transistor or the drain select transistor, depending on the direction of the current flow). Landing pad 2001 allows optimization of the select transistor 16 separate from the rest of the memory string which may improve the inhibit performance of the NAND string. The landing pad 2001 in or below the select gate transistor may be used instead of or in addition to the landing pads 25 located in the stack 120 between control gate electrodes 3, as described above.

Figure 19B:
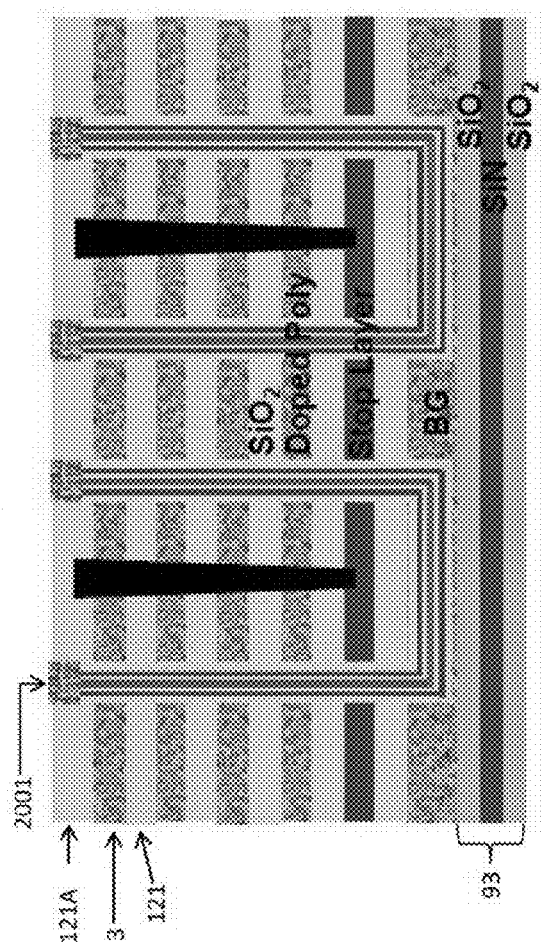

As illustrated in FIG. 19B, after the memory holes 84 filled are with blocking dielectric layer 7, charge storage material 9, tunnel dielectric 11 and channel 1, the surface may be planarized, such as with CMP. A layer of conducting material, such as a metal (e.g. W or Ti), metal nitride (e.g. WN or TiN), silicide or doped polysilicon may be deposited over the stack 120. The layer of conducting material is then patterned to form the landing pads 2001 over the memory holes 84. A layer of dielectric fill material 121A is then deposited over the stack 120 and the landing pads 2001. CMP may then be performed to remove excess material 121A and expose the top surface of the landing pads 2001. Alternatively, layer 121A may be deposited first, followed by formation of a landing pad opening in layer 121A, filling the opening with the landing pad 2001 material and optional planarization of the landing pad material with the upper surfaces of layer 121A.

Figure 19D:
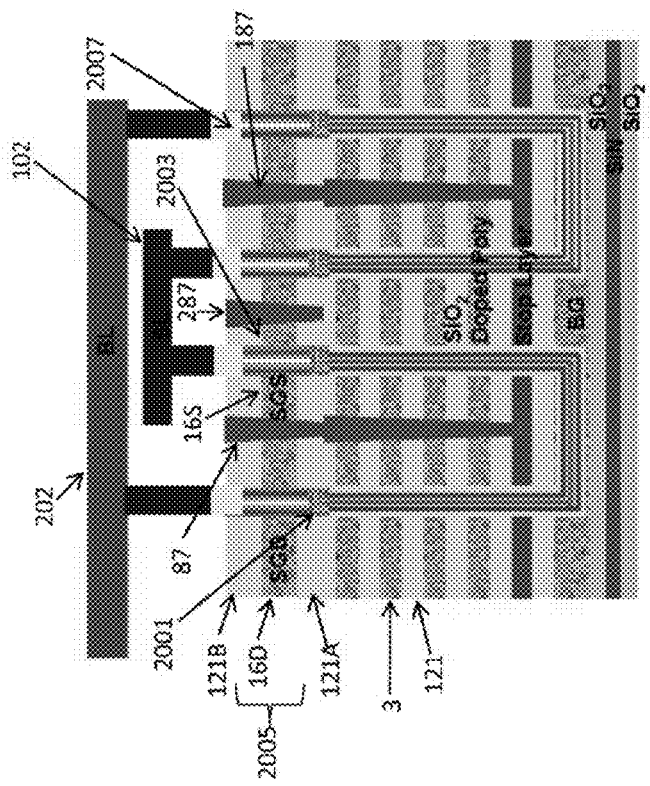
Figure 19C:
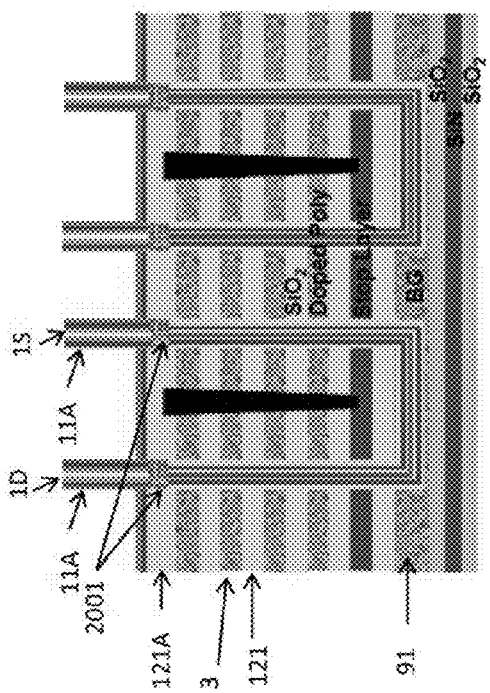
Figure 19E:
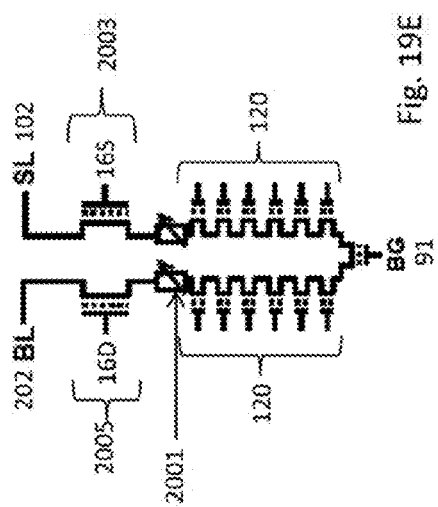
FIG. 19E is a schematic circuit diagram of the device of FIG. 19D.

As illustrated in FIGS. 19C and 19D, the source and drain side select transistors 2003, 2005 (or the upper select transistor 16U for a CVNAND) may then be formed. In the embodiment illustrated in FIGS. 19C and 19D, the transistor channels are formed by a non-damascene process. In this embodiment, a layer of channel material is deposited over the dielectric fill material 121A and the exposed landing pads 2001. Pillar shaped channels 1S, 1D are formed on top of the landing pads 2001 by patterning the layer of channel material (e.g., by photolithography and etching).

Next, a gate insulating layer 11A is formed on the sidewalls of the pillar shaped channels 1S, 1D. The gate insulating layer 11A may be formed by oxidizing the exposed channel sidewalls to form a high quality grown silicon oxide. The top of the channels may be either masked or left unmasked and oxidized. If the top of the channels is oxidized, then the oxide on the top of the channels is removed in a subsequent step. Alternatively, the gate insulating layer 11A may be formed by depositing a layer of silicon oxide, silicon nitride, a combination thereof or another insulating material over the pillar shaped channels.

Next, an optional insulating layer (e.g., the upper portion of insulating layer 121A) and a layer of conducting or doped semiconductor material (e.g., in-situ doped polysilicon) are deposited around the pillar shaped channels 1S, 1D and the gate insulating layer 11A and patterned to form the select gates 16S, 16D (or 16U for a vertical channel string). The patterning may utilize a sacrificial or etch stop layer which is subsequently removed. A second insulating layer 121B is then formed over the select gates and the top of the channels is subsequently exposed in the layer 121B by planarization and/or photolithography and etching.

Dielectric filled slit trench regions 187 and the select gate separation openings 287 are formed by etching the select gate layer and filling the etched trenches and openings with an insulating material (e.g., silicon nitride), as shown in FIG. 19D. This separates the select gate layer into the source and drain select gates 16S, 16D.

As shown in FIG. 19D, bit lines 202 and the source lines 102 (for the U-shaped embodiment) can be fabricated in contact with the select gate transistor channels 1D, 1S as discussed above to complete the NAND string device. If desired, barrier, contact or adhesion regions (e.g., Ti, TiN, metal silicide, etc.) 2007 may be formed between the lines 102, 202 and the respective channels 15, 1D. For example, regions 2007 may comprise metal silicide regions (e.g., titanium silicide or tungsten silicide) formed by contacting the top of the channels with a metal layer and annealing to form the silicide, This step is followed by forming the lines 102 and 202 in contact with the silicide regions 2007. Regions 2007 may be formed before forming the regions 187, 287, while lines 102, 202 may be formed after forming the regions 187, 287.

In an alternative embodiment, the select gates transistor may be formed using a damascene process. In the damascene process, rather than deposit and pattern a layer of channel material, the channel is formed by depositing a channel material and gate insulating layer into an opening in a mini-stack of layers 121A, 16S/16D, 121B.

Figure 20B:
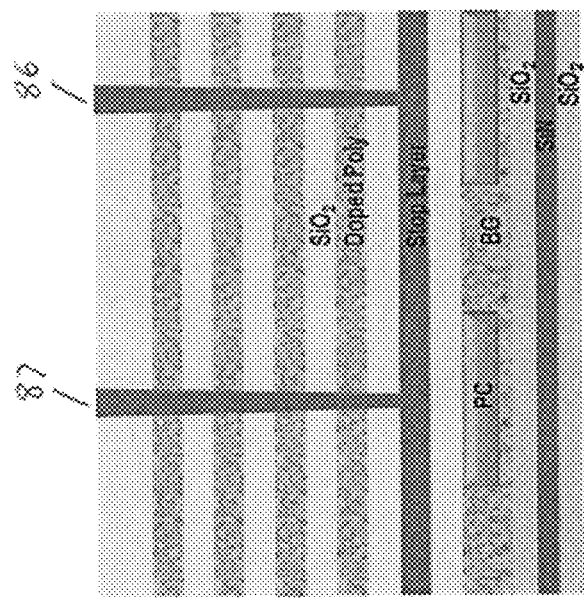
Figure 20A:
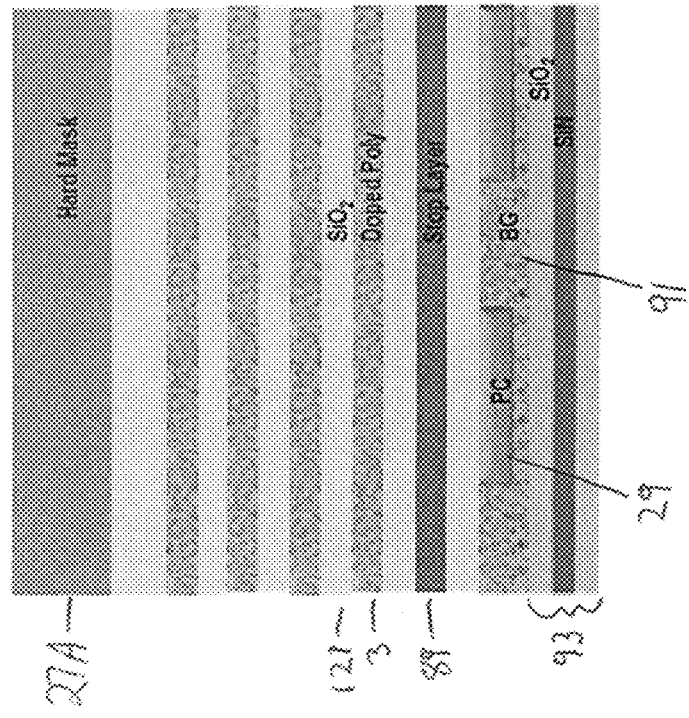
Figure 20C:
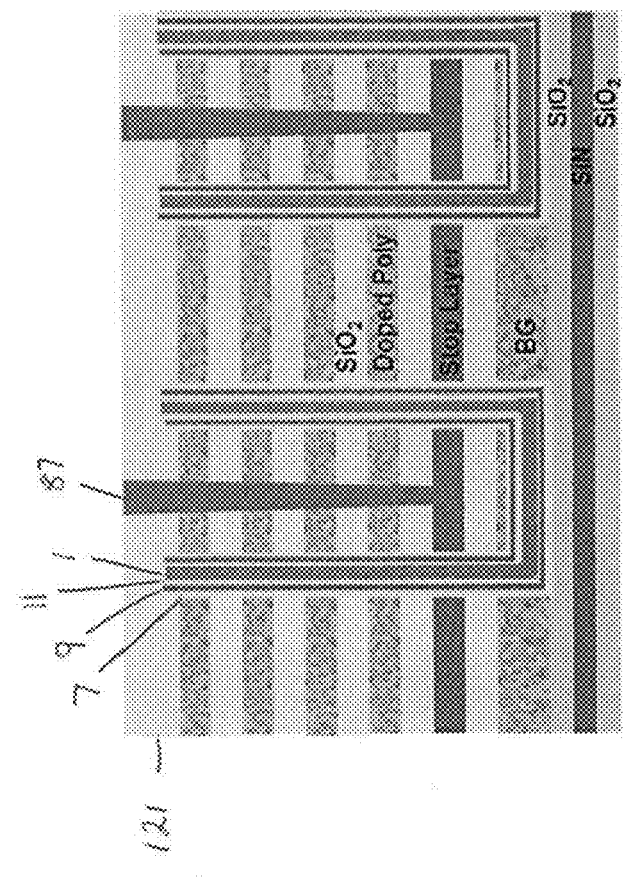

In another embodiment shown in FIGS. 20A-20J, a different method is used to form the P-BiCS type vertical NAND devices, from that illustrated in FIGS. 17A through 17H. As illustrated in FIG. 20A, this embodiment includes a stack 120 of alternating control gate electrodes 3 (e.g. polysilicon) and dielectric fill material 121 (e.g. SiO2) provided over a substrate. In an embodiment, the substrate may comprise a silicon on insulator type substrate containing one or more insulating layers 93 (e.g., silicon oxide/silicon nitride/silicon oxide stack) over a silicon wafer, as shown in FIG. 20A. Additionally, the substrate may include a bottom gate 91. To protect the bottom gate 91 during subsequent processing, an etch stop layer 89 (e.g. SiN) may be provided between the bottom gate 91 and the stack 120. A hard mask 27A (e.g. SiN, amorphous carbon, etc.) is formed over the stack 120.

As illustrated in FIG. 20B, slit trenches 86 are formed in the stack 120 and filled with dielectric 87 using a patterned mask (e.g. patterned hard mask 27A) which is then removed. Preferably, the slit trenches end at the etch stop layer 89. In the next step illustrated in FIG. 20C, the upper most insulating layer 121 in the stack 120 is preferentially etched to reduce its thickness while leaving the dielectric 87 essentially unetched. Another hard mask 27B is then deposited over the upper most insulating layer 120 and the exposed dielectric layer 87.

Figure 20D:
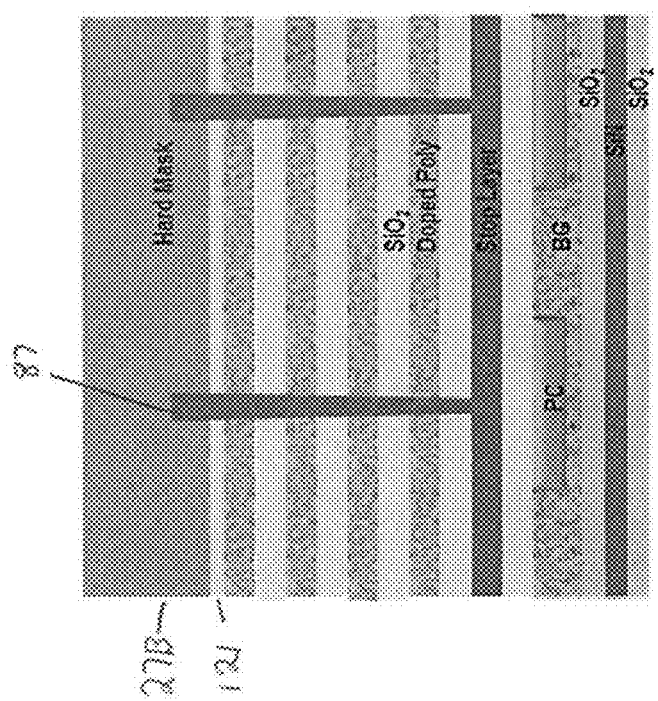

Next, as illustrated in FIG. 20D, memory holes are etched and the sacrificial material region 29 is removed. The memory holes are then filled with blocking dielectric layer 7, charge storage material 9, tunnel dielectric 11 and channel 1. Additionally, another layer of insulating material 121 is deposited to cover the memory holes and the exposed dielectric 87. A CMP process may then be used to planarize the surface of the stack 120 and to expose a top surface of the dielectric 87.

Figure 20F:
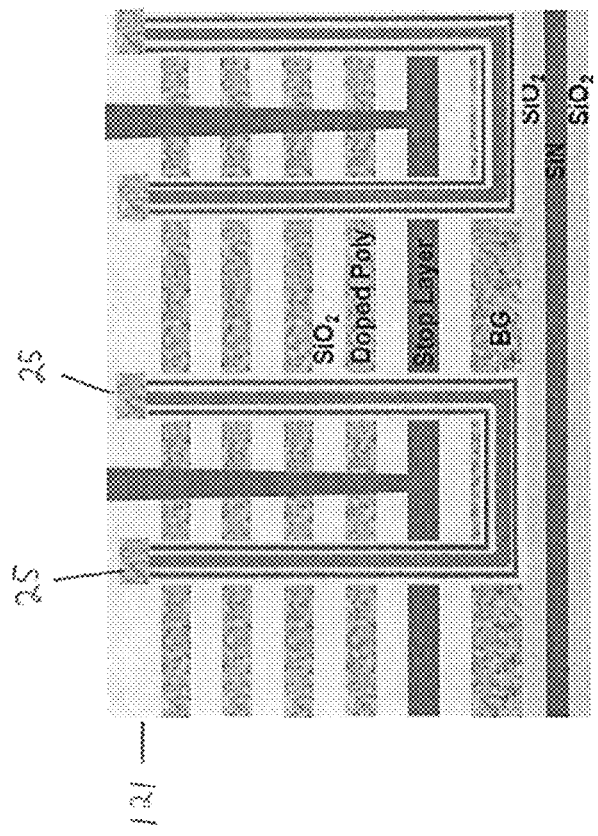
Figure 20E:
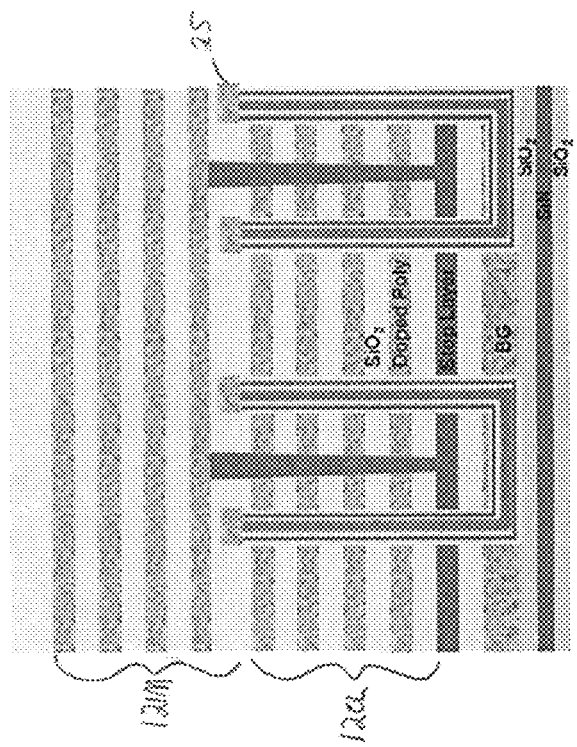

As illustrated in FIG. 20E, holes may be etched in the top insulating layer 121 to expose the top surfaces of the blocking dielectric layer 7, charge storage material 9, tunnel dielectric 11 and channel 1 in the memory holes. A conducting or semiconducting material may then be deposited in the holes to form landing pads 25 on top of the blocking dielectric layer 7, charge storage material 9, tunnel dielectric 11 and channel 1. Again, another layer of insulating material 121 is deposited to cover the landing pads 25 and the exposed dielectric 87. A CMP process may then be used to planarize the surface of the stack 120 and to expose a top surface of the dielectric 87.

Next, as illustrated in FIG. 20F, a second, middle stack 120M of alternating control gate electrodes 3 and dielectric fill material 121 is deposited over the lower stack 120L of alternating control gate electrodes 3 and dielectric fill material 121. Memory holes 84y and slit trenches 86 are formed in the middle stack 120M as illustrated in FIG. 20G. The memory holes 84y are etched until the surface of the landing pads 25 are exposed. The slit trenches 86 are etched until the upper surface of the dielectric 87 in the lower slit trenches 86 are exposed. Next, both the memory holes 84y and the slit trenches 86 are filled with a dielectric material 87, such as silicon nitride.

Figure 20H:
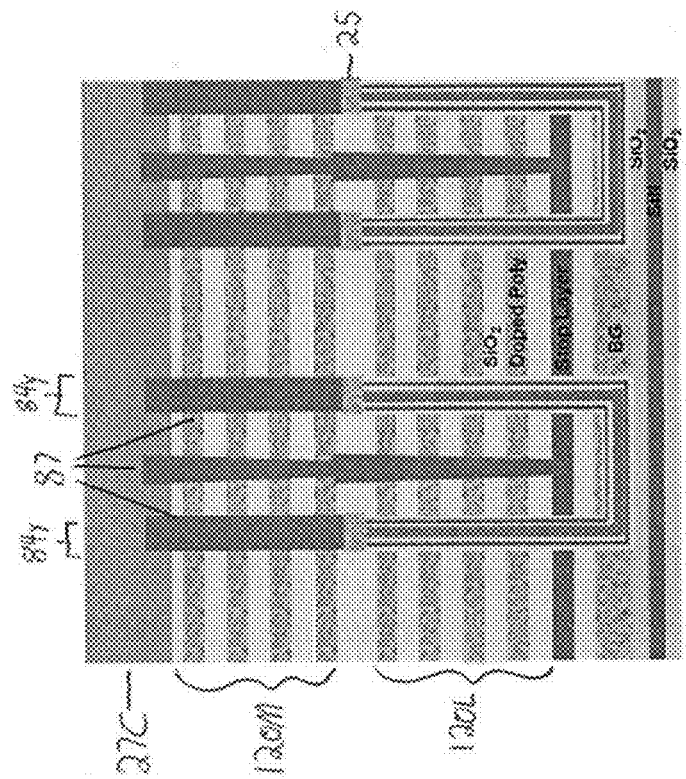
Figure 20G:
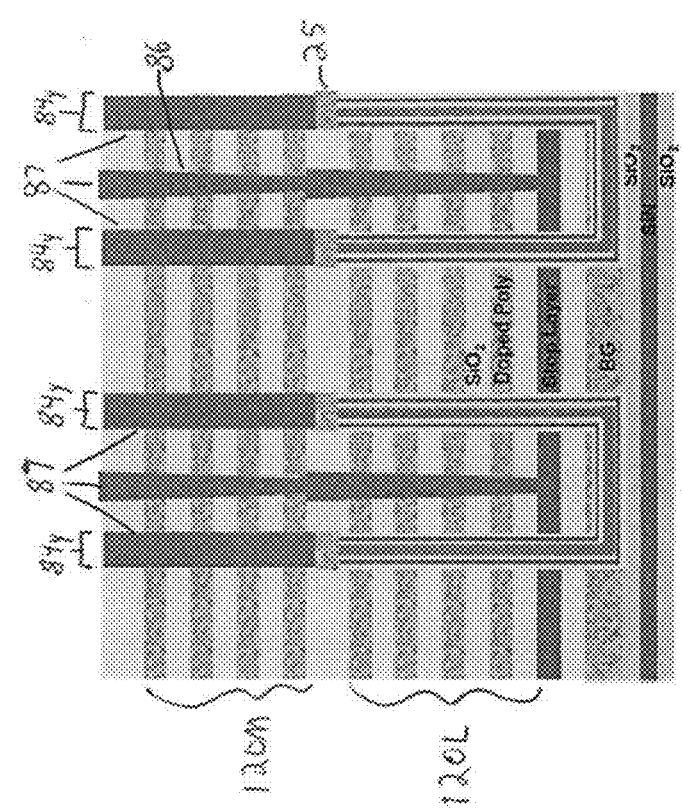

As illustrated in FIG. 20H, the top layer of dielectric fill material 121 on the middle stack 120M is partially removed to form exposed pillars of dielectric material 87 above the memory holes 84y and the slit trenches 86. A hard mask 27C is then deposited over the top layer of dielectric fill material 121 and the exposed pillars of dielectric material. Next, as illustrated in FIG. 20I, the hard mask 27C is patterned to form holes exposing the dielectric material in the memory holes. The dielectric material 87 in the memory holes is removed through the holes in the hard mask 27C. Next, blocking dielectric layer 7, charge storage material 9, tunnel dielectric 11 and channel 1 are deposited in the memory holes. After filling the memory holes, a layer of dielectric material 121 is deposited over the middle stack 120M. A CMP process may then be used to planarize the surface of the middle stack 120M and the expose the surface of the dielectric material 87 in the slit trenches 86 in the middle stack 120M.

Next, as illustrated in FIG. 20J, the top layer of dielectric material 121 on the stack 121M may be patterned and etched with holes to expose the top surfaces of the blocking dielectric layer 7, charge storage material 9, tunnel dielectric 11 and channel 1 in the memory holes. Landing pads 25 may then be formed on the top of the blocking dielectric layer 7, charge storage material 9, tunnel dielectric 11 and channel 1 in the memory holes in the middle stack 120M by depositing a conducting or semiconducting material in the holes in the patterned top layer of dielectric material 121. Additional memory stacks 120 as desired may be formed by repeating the steps above. After forming the last desired memory stack, source lines 102 and bit lines 202 may be formed as described in regards to the embodiment illustrated in FIG. 19D.

Referring to FIG. 21, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 10. The substrate semiconductor layer 10 can be a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 10 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10. While the substrate semiconductor layer 10 is alternatively referred to as the substrate 10 in the present disclosure, it is understood that the substrate 10 may optionally include additional material layers (such as a handle substrate and a buried insulator layer as in the case of a semiconductor-on-insulator substrate).

The exemplary structure includes a device region, in which memory devices can be subsequently formed, and a contact region (not shown), in which stepped surfaces are subsequently formed. As used herein, a "contact region" refers to a region in which contact via structures are to be formed. At least one semiconductor device for a peripheral circuitry can be formed in a peripheral device region (not shown). The at least one semiconductor device can include, for example, one or more field effect transistors. The least one semiconductor device for the peripheral circuitry can contain a driver circuit for memory devices to be subsequently formed, which can include at least one NAND device.

Optionally, a doped semiconductor well (not separately shown) can be provided in an upper portion of the substrate semiconductor layer 10. The doped semiconductor well can be formed, for example, by implantation of electrical dopants (p-type dopants or n-type dopants) into an upper portion of the substrate semiconductor layer 10, or by deposition of a single crystalline semiconductor material, for example, by selective epitaxy. In one embodiment, the doped semiconductor well can include a single crystalline semiconductor material (e.g., p-well).

An alternating stack of first material layers and second material layers is subsequently formed. Each first material layer can include a first material, and each second material layer can include a second material that is different from the first material. The alternating stack is herein referred to as a first alternating stack. In one embodiment, the first material layers and the second material layers can be first insulating layers 131 and first sacrificial material layers 142, respectively. In one embodiment, each first insulating layer 131 can include a first insulating material, and each first sacrificial material layer 142 can include a first sacrificial material. The alternating stack formed by the first insulating layers 131 and the first sacrificial material layers 142 is herein referred to as a first tier structure (131, 142), or a first tier structure (131, 142). Thus, the first tier structure (131, 142) can include an alternating plurality of first insulating layers 131 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first tier structure (131, 142) can include first insulating layers 131 composed of the first material, and first sacrificial material layers 142 composed of the second material, which is different from the first material. The first material of the first insulating layers 131 can be at least one insulating material. Insulating materials that can be employed for the first insulating layers 131 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 131 can be silicon oxide.

The second material of the first sacrificial material layers 142 is a sacrificial material that can be removed selective to the first material of the first insulating layers 131. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride.

In one embodiment, the first insulating layers 131 can include silicon oxide, and sacrificial material layers can include silicon nitride sacrificial material layers. The first material of the first insulating layers 131 can be deposited, for example, by chemical vapor deposition (CVD). For example, if silicon oxide is employed for the first insulating layers 131, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 131 and the first sacrificial material layers 142 can be in a range from 20 nm to 50 nm, although lesser and greater thicknesses can be employed for each first insulating layer 131 and for each first sacrificial material layer 142. The number of repetitions of the pairs of a first insulating layer 131 and a first sacrificial material layer 142 can be in a range from 2 to 1,024, and typically from 8 to 256, although a greater number of repetitions can also be employed. In one embodiment, each first sacrificial material layer 142 in the first tier structure (131, 142) can have a uniform thickness that is substantially invariant within each respective first sacrificial material layer 142.

A dielectric cap layer 170 can be sequentially formed. The dielectric cap layer 170 includes a dielectric material, which can be any dielectric material that can be employed for the first insulating layers 131. In one embodiment, the dielectric cap layer 170 includes the same dielectric material as the first insulating layers 131. The thickness of the dielectric cap layer 170 can be in a range from 20 nm to 400 nm, although lesser and greater thicknesses can also be employed.

Optionally, the dielectric cap layer 170 and the first tier structure (131, 142) can be patterned to form first stepped surfaces in a contact region (not shown). The contact region includes a first stepped area in which the first stepped surfaces are formed, and a second stepped area in which additional stepped surfaces are to be subsequently formed in an second tier structure (to be subsequently formed over the first tier structure). The first stepped surfaces can be formed, for example, by forming a mask layer with an opening therein, etching a cavity within the levels of the dielectric cap layer 170, and iteratively expanding the etched area and vertically recessing the cavity by etching each pair of a first insulating layer 131 and a first sacrificial material layer 142 located directly underneath the bottom surface of the etched cavity within the etched area. A dielectric material can be deposited to fill the first stepped cavity to form a first retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present. The first tier structure can comprise the first alternating stack (131, 142) and the first retro-stepped dielectric material portion.

Figure 22:
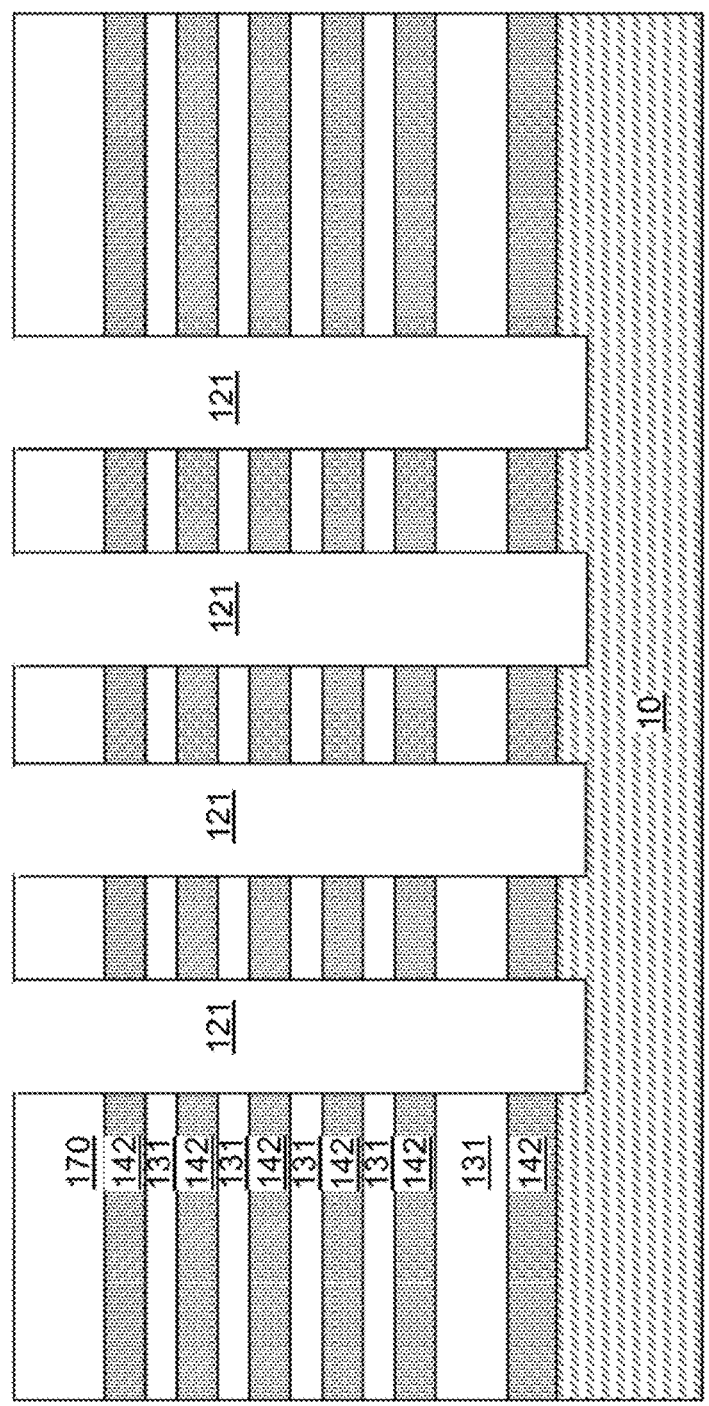
FIG. 22 is a vertical cross-sectional view of the exemplary structure after formation of first memory openings according to an embodiment of the present disclosure.

Referring to FIG. 22, first memory openings 121 extending to a top surface of the substrate 10 are formed through the first tier structure (131, 142). The first memory openings 121 can be formed in the device region. For example, a lithographic material stack (not shown) including at least a photoresist layer can be formed over the dielectric cap layer 170, and can be lithographically patterned to form openings within the lithographic material stack. The pattern in the lithographic material stack can be transferred through the dielectric cap layer 170 and through the entirety of the first tier structure (131, 142) by at least one anisotropic etch that employs the patterned lithographic material stack as an etch mask. Portions of the dielectric cap layer 170 and the first tier structure (131, 142) underlying the openings in the patterned lithographic material stack are etched to form the first memory openings 121. In other words, the transfer of the pattern in the patterned lithographic material stack through the dielectric cap layer 170 and the first tier structure (131, 142) forms the first memory openings 121.

In one embodiment, the chemistry of the anisotropic etch process employed to etch through the materials of the first alternating stack (131, 142) can alternate to optimize etching of the first and second materials in the first alternating stack (131, 142). The anisotropic etch can be, for example, a series of reactive ion etches. The sidewalls of the first memory openings 121 can be substantially vertical, or can be tapered. Subsequently, the patterned lithographic material stack can be subsequently removed, for example, by ashing.

Figure 23:
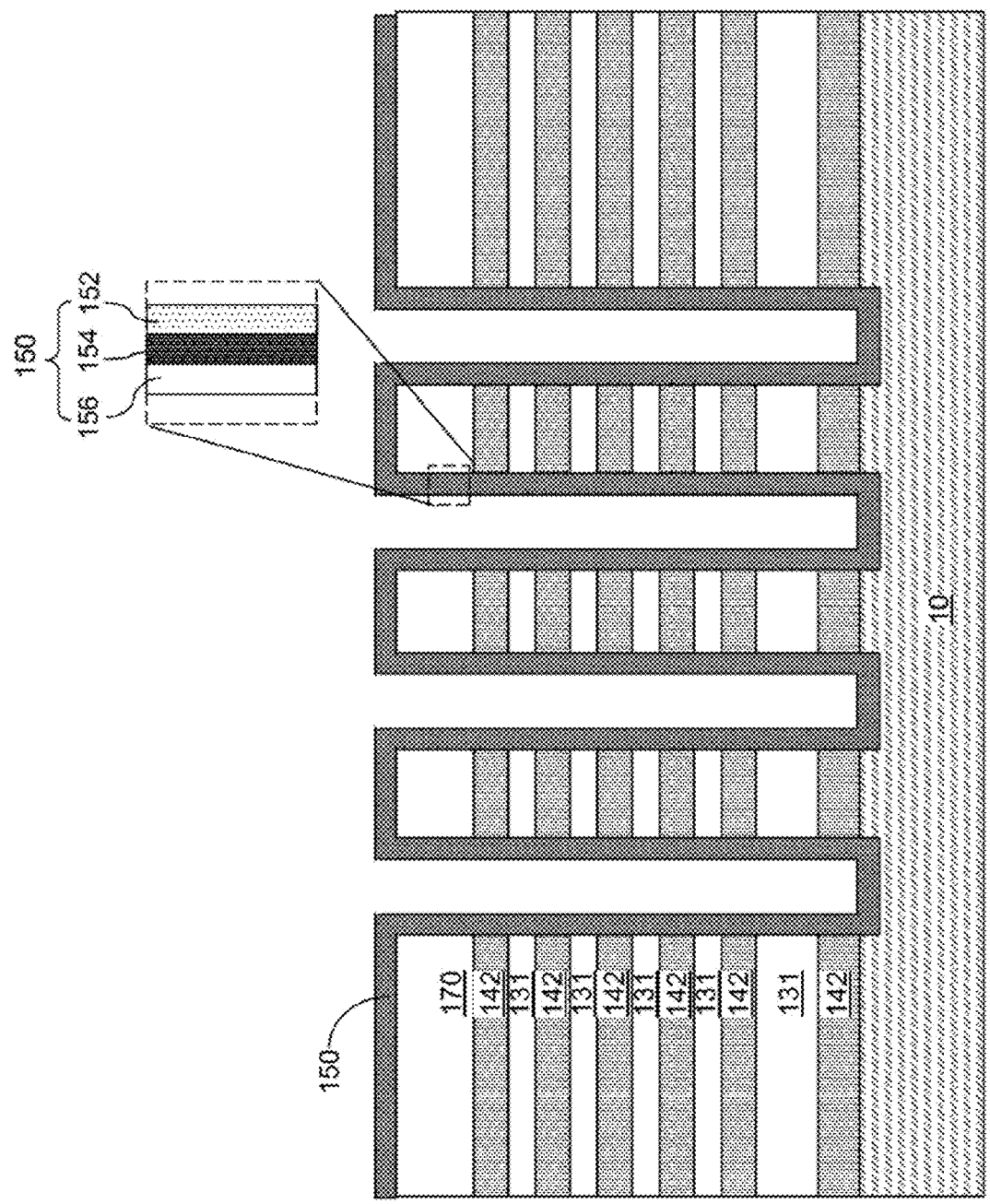
FIG. 23 is a vertical cross-sectional view of the exemplary structure after formation of a first memory film layer according to an embodiment of the present disclosure.

Referring to FIG. 23, a first memory film 150 can be formed as a stack of continuous material layers. The first memory film 150 can include an optional first blocking dielectric layer 152, a first charge trapping layer 154, and a first tunneling dielectric layer 156.

The first blocking dielectric layer 152 can include a single dielectric material layer or a layer stack of multiple dielectric material layers. The first blocking dielectric layer 152 can be deposited on the sidewalls of each first memory opening 121 by a conformal deposition method. The first blocking dielectric layer 152 can be deposited, for example, by chemical vapor deposition (CVD), atomic layer deposition (ALD), pulsed laser deposition (PLD), liquid source misted chemical deposition, or a combination thereof. The thickness of the first blocking dielectric layer 152 can be in a range from 1 nm to 20 nm, although lesser and greater thicknesses can also be employed. The first blocking dielectric layer 152 can subsequently function as a dielectric material portion that blocks leakage of stored electrical charges to control gate electrodes.

In one embodiment, the first blocking dielectric layer 152 includes a dielectric metal oxide. As used herein, a dielectric metal oxide refers to a dielectric material that includes at least one metallic element and at least oxygen. Alternatively or additionally, the first blocking dielectric layer 152 can include silicon oxide, silicon oxynitride, silicon nitride, or a combination thereof. In one embodiment, the first blocking dielectric layer 152 can include silicon oxide. The first blocking dielectric layer 152 can be formed by a conformal deposition method such as low pressure chemical vapor deposition, atomic layer deposition, or a combination thereof. The thickness of the first blocking dielectric layer 152 can be in a range from 1 nm to 20 nm, although lesser and greater thicknesses can also be employed.

Subsequently, the first charge trapping layer 154 can be deposited as a continuous material layer over the first blocking dielectric layer 152. In one embodiment, the first charge trapping layer 154 can be deposited as a conformal layer having a substantially same thickness throughout. As used herein, an element has a substantially same thickness throughout if the thickness of the element does not deviate from the average thickness of the element by more than 20% at all locations of the element. In one embodiment, the first charge trapping layer 154 can be a charge trapping material including a dielectric charge trapping material, which can be, for example, silicon nitride. In one embodiment, the first charge trapping layer 154 includes a silicon nitride layer.

A first tunneling dielectric layer 156 can be deposited on the physically exposed surfaces of the first blocking dielectric layer 152 and the first charge trapping layer 154. The first tunneling dielectric layer 156 can be formed directly on the physically exposed inner sidewall of the upper portion of the first blocking dielectric layer 152 and directly on a sidewall of the remaining lower portions of the first charge trapping layer 154. The first tunneling dielectric layer 156 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The first tunneling dielectric layer 156 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the first tunneling dielectric layer 156 can include a stack of a first silicon oxide layer, a silicon oxynitride layer, and a second silicon oxide layer, which is commonly known as an ONO stack. In one embodiment, the first tunneling dielectric layer 156 can include a silicon oxide layer that is substantially free of carbon or a silicon oxynitride layer that is substantially free of carbon. The thickness of the first tunneling dielectric layer 156 can be in a range from 2 nm to 20 nm, although lesser and greater thicknesses can also be employed.

Figure 24:
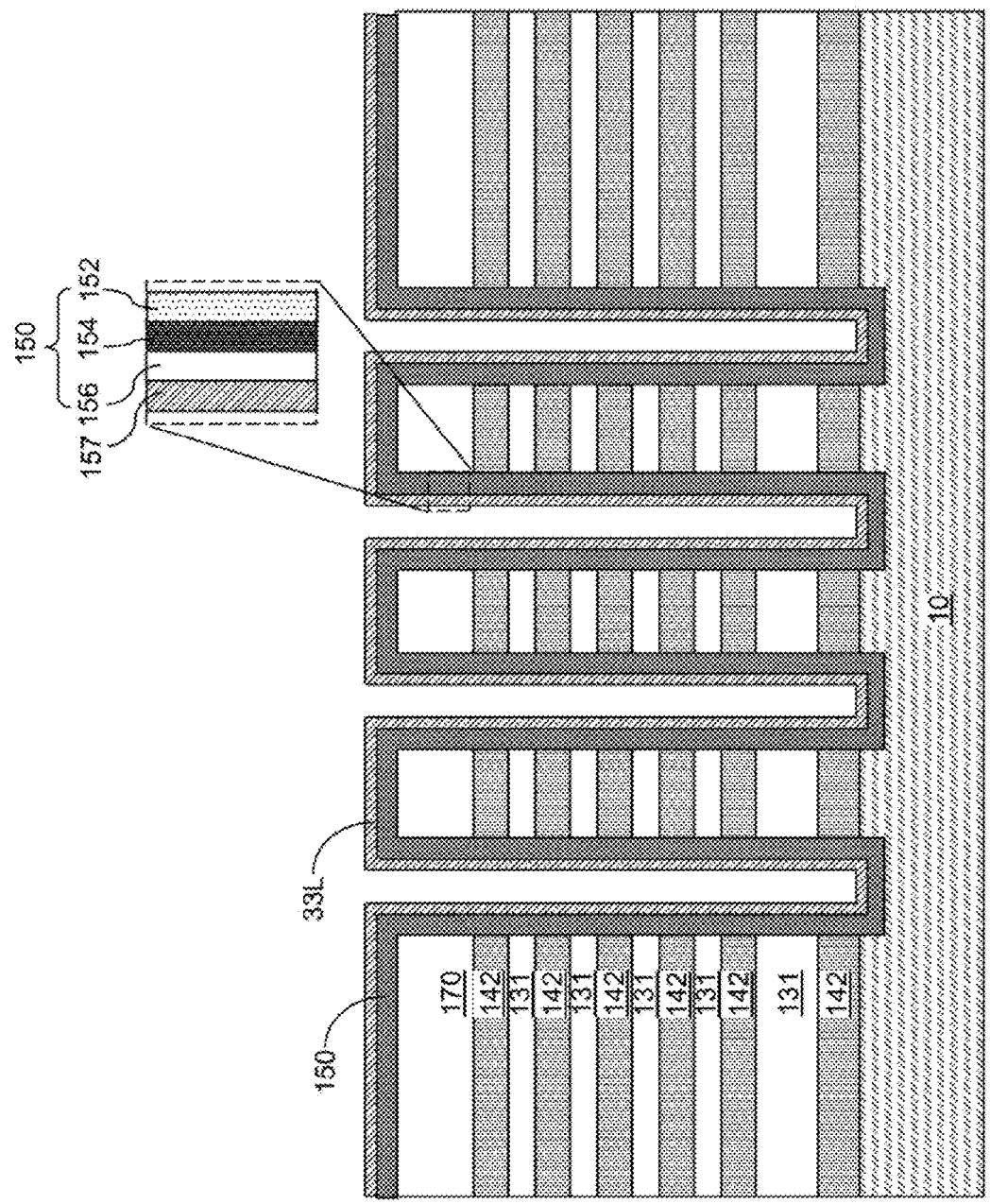
FIG. 24 is a vertical cross-sectional view of the exemplary structure after formation of a first sacrificial material liner according to an embodiment of the present disclosure.

Referring to FIG. 24, an optional first sacrificial protective liner 33L can be formed over the first memory film 150. The first sacrificial protective liner 33L includes a first sacrificial material that can protects inner sidewalls of the first tunneling dielectric layer 156 during a subsequent anisotropic etch process that forms openings through the first memory film 150 at the bottom of each first memory opening 121, and can be subsequently removed selective to the first tunneling dielectric layer 156. In one embodiment, the first sacrificial protective liner 33L can include a semiconductor material (such as polysilicon or amorphous silicon) or a dielectric material such as organosilicate glass, amorphous carbon, or diamond-like carbon (DLC). The thickness of the first sacrificial protective liner 33L can be in a range from 1 nm to 3 nm, although lesser and greater thicknesses can also be employed.

Figure 25:
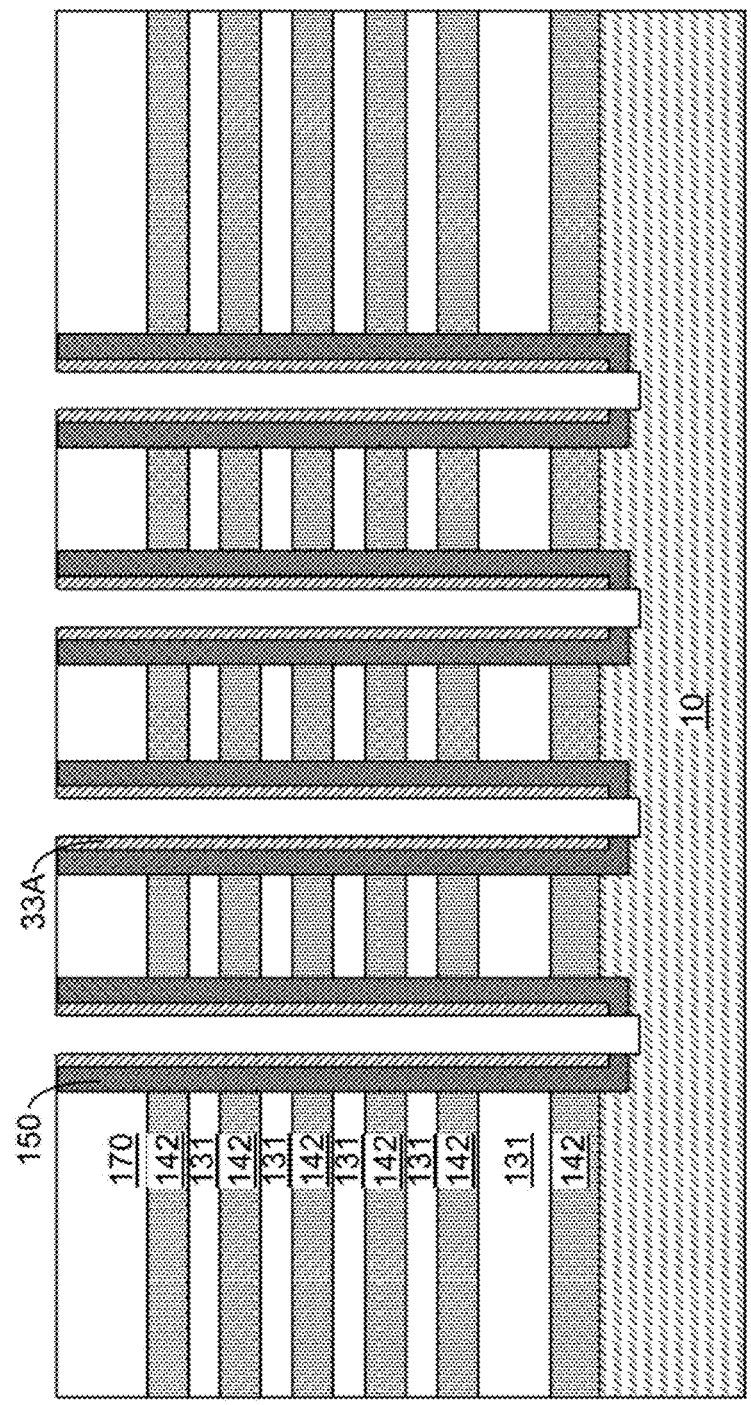
FIG. 25 is a vertical cross-sectional view of the exemplary structure after formation of first memory films according to an embodiment of the present disclosure.

Referring to FIG. 25, an anisotropic etch can be performed to remove horizontal portions of the first sacrificial protective liner 33L and the first memory film 150. A combination of etch chemistries can be employed to sequentially etch the various materials of the first sacrificial protective liner 33L and the first memory film 150. Openings are formed through the first sacrificial protective liner 33L and the first memory film 150 at the bottom of each first memory opening 121 to physically expose a semiconductor underneath, which may be the semiconductor material of the substrate semiconductor layer 10. The vertical portions of the first sacrificial protective liner 33L protect the first tunneling dielectric layer 156 during the anisotropic etch. Each remaining portion of the first sacrificial protective liner 33L constitutes a first sacrificial spacer 33A, which includes a sacrificial material and including the sacrificial material of the first sacrificial protective liner 33L. The first sacrificial spacers 33A are sacrificial fill material portions, which are herein referred to as first sacrificial fill material portions. In one embodiment, the first sacrificial spacers 33A can include a semiconductor material such as polysilicon or amorphous silicon. The first memory film 150 is divided into multiple cylindrical portions that are located within respective memory openings. As such, each first memory opening 121 includes a first memory film 150, which is a portion of the initial first memory film 150 as formed at the processing steps of FIG. 23.

Figure 26:
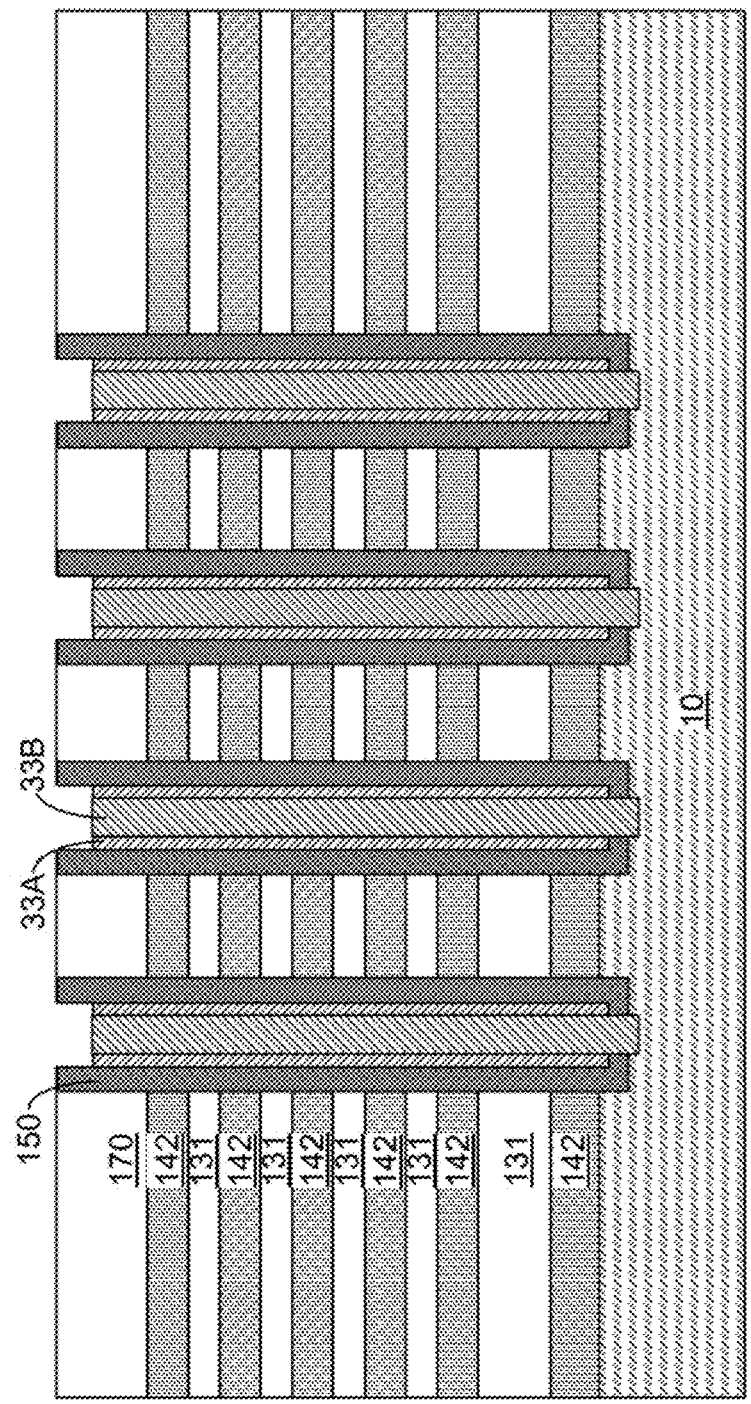
FIG. 26 is a vertical cross-sectional view of the exemplary structure after formation of sacrificial fill material portions according to an embodiment of the present disclosure.

Referring to FIG. 26, a sacrificial fill material is deposited in the cavities within the first memory films 150 that are located at peripheral portions of the memory openings. The sacrificial fill material is another sacrificial material that is subsequently removed, and is herein referred to as a second sacrificial material. The second sacrificial material may be the same as, or different from, the first sacrificial material. In one embodiment, the second sacrificial material may include a semiconductor material such as polysilicon or amorphous silicon, or a dielectric material such as organosilicate glass, amorphous carbon, or diamond-like carbon (DLC). In one embodiment, the first and second sacrificial materials can include semiconductor materials. In one embodiment, the sacrificial fill material (the second sacrificial material) can be deposited employing a conformal deposition process such as chemical vapor deposition.

Excess portions of the sacrificial fill material can be removed from above the horizontal plane including the top surface of the first insulating cap layer 170 employing a planarization process, which can include a recess etch and/or chemical mechanical planarization. Further, the top surface of each remaining portion of the sacrificial fill material can be recessed below the horizontal plane including the top surface of the first insulating cap layer 170 by a recess etch process, which may be an anisotropic etch process or an isotropic etch process. The recess depth, as measured between the top surfaces of the remaining portions of the sacrificial fill material and the horizontal plane including the top surface of the first insulating cap layer 170, is less than the thickness of the first insulating cap layer 170. In one embodiment, the recess depth can be in a range from 10 nm to 300 nm, although lesser and greater recess depths can also be employed. Each remaining portion of the sacrificial fill material after the recess process constitutes a sacrificial pillar structure 33B. Each sacrificial pillar structure 33B is a sacrificial fill material portion, which is herein referred to as a second sacrificial fill material portion.

The top surface of each first sacrificial spacer 33A can be collaterally vertically recessed during the recessing of the sacrificial fill material. In this case, the first sacrificial spacers 33A and the sacrificial pillar structures 33B can have recessed top surfaces that are located below the horizontal plane including the top surface of the first insulating cap layer 170. In one embodiment, the first sacrificial spacers 33A can have top surfaces that are located at, or about, the level of the top surfaces of the sacrificial pillar structures 33B. A cavity is formed above each combination of a first sacrificial spacer 33A and a sacrificial pillar structure 33B.

Figure 27:
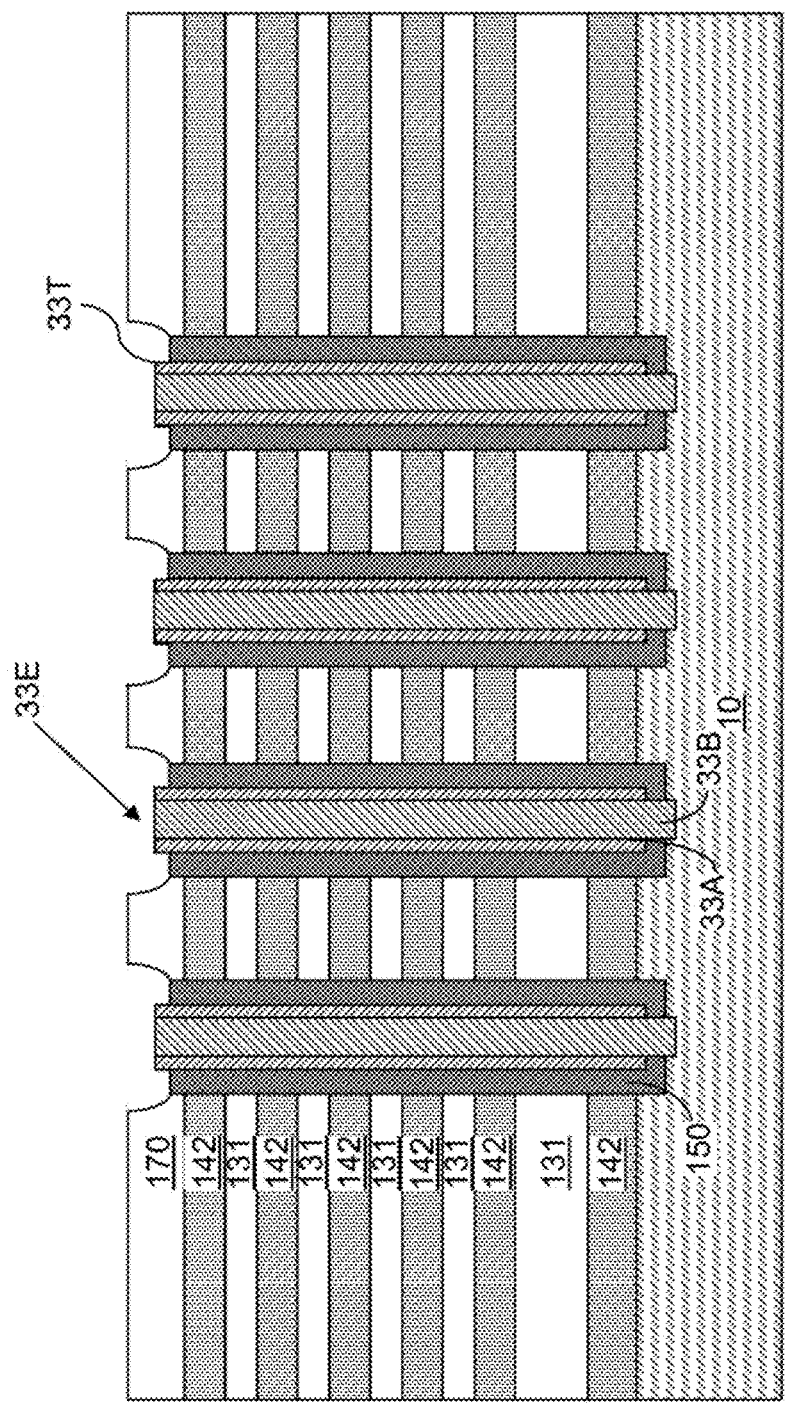
FIG. 27 is a vertical cross-sectional view of the exemplar structure after formation of recess cavities according to an embodiment of the present disclosure.

Referring to FIG. 27, a recess cavity 33E can be formed around the spacer 33A and pillar structure 33B by laterally expanding each cavity above the first sacrificial spacers 33A and the sacrificial pillar structures 33B. In one embodiment, the lateral recess cavities 33E can be formed by removing an upper end portion of each first memory film 150, and by laterally recessing physically exposed sidewalls of the first insulating cap layer 170. In one embodiment, physically exposed portions of the first memory films 150 can be isotropically etched by a combination of etchants that etch the materials of the first memory films 150. For example, if the first tunneling dielectric layer 156 includes silicon oxide, the first charge trapping layer 154 includes silicon nitride, and the first blocking dielectric layer 152 includes silicon oxide, a sequence of wet etches employing first hydrofluoric acid, phosphoric acid, and second hydrofluoric acid can be employed to etch the physically exposed portions of the first memory films 150. Subsequently, physically exposed portions of the first insulating cap layer 170 can be isotropically etched employing a wet etch. For example, if the first insulating cap layer 170 includes silicon oxide, a wet etch or a vapor phase etch employing hydrofluoric acid can be employed to isotropically recess physically exposed surface portions of the first insulating cap layer 170. Each recess cavity 33E laterally protrudes farther than an underlying sidewall of a respective first memory opening because the recess cavity 33E is formed by removing sidewall portions of the first insulating cap layer 170. The tip portion 33T of the sacrificial material (e.g., spacer 33A and pillar structure 33B) protrudes above a top surface of the first memory film 150 after the recess etch recesses the first memory film 150 relative to the sacrificial material.

Figure 28:
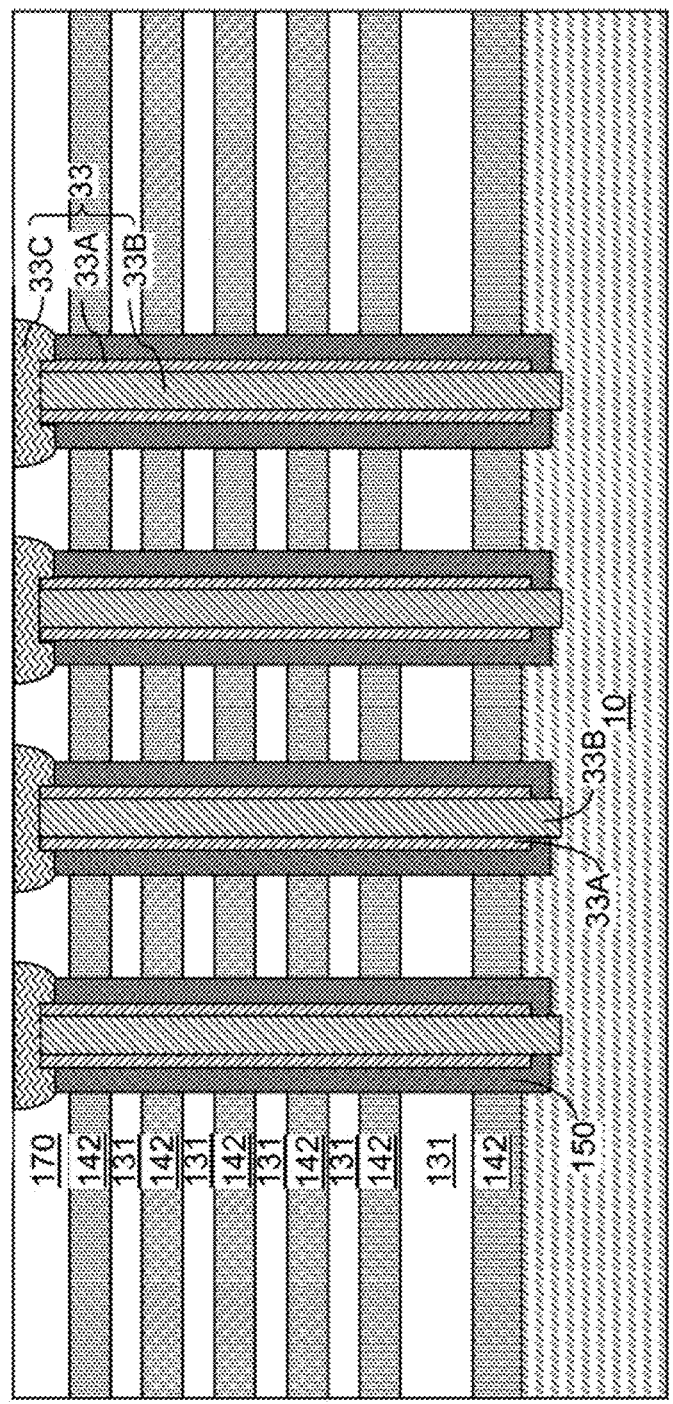
FIG. 28 is a vertical cross-sectional view of the exemplary structure after formation of temporary landing pads according to an embodiment of the present disclosure.

Referring to FIG. 28, a temporary landing pad 33C can be formed within each recess cavity 33E by filling the recess cavities 33E with a disposable fill material, which is herein referred to as a third sacrificial material. The disposable fill material is another sacrificial material, which is herein referred to as third sacrificial material. The disposable fill material can include a semiconductor material (such as polysilicon or amorphous silicon) or a dielectric material such as organosilicate glass, amorphous carbon, or diamond-like carbon (DLC). Excess portions of the disposable fill material can be removed from above the horizontal plane including the top surface of the first insulating cap layer 170. Each remaining portion of the disposable fill material filling a recess cavity 33E constitutes a temporary landing pad 33C. Each temporary landing pad 33C is a sacrificial fill material portion, which is herein referred to as a third sacrificial fill material portion.

The sacrificial material of the temporary landing pads 33C may be the same as, or may be different from, the sacrificial materials of the first sacrificial spacers 33A and the sacrificial pillar structures 33B. Each first memory opening, as expanded through formation of recess cavities 33E at the processing steps of FIG. 27, includes a first sacrificial spacer 33A (a first sacrificial fill material portion), a sacrificial pillar structure 33B (a second sacrificial fill material portion), and a temporary landing pad 33C (a third sacrificial fill material portions). A set of a first sacrificial spacer 33A, a sacrificial pillar structure 33B, and a temporary landing pad 33C located within the same first memory opening constitutes a set of contiguous sacrificial fill material portions 33.

Figure 29:
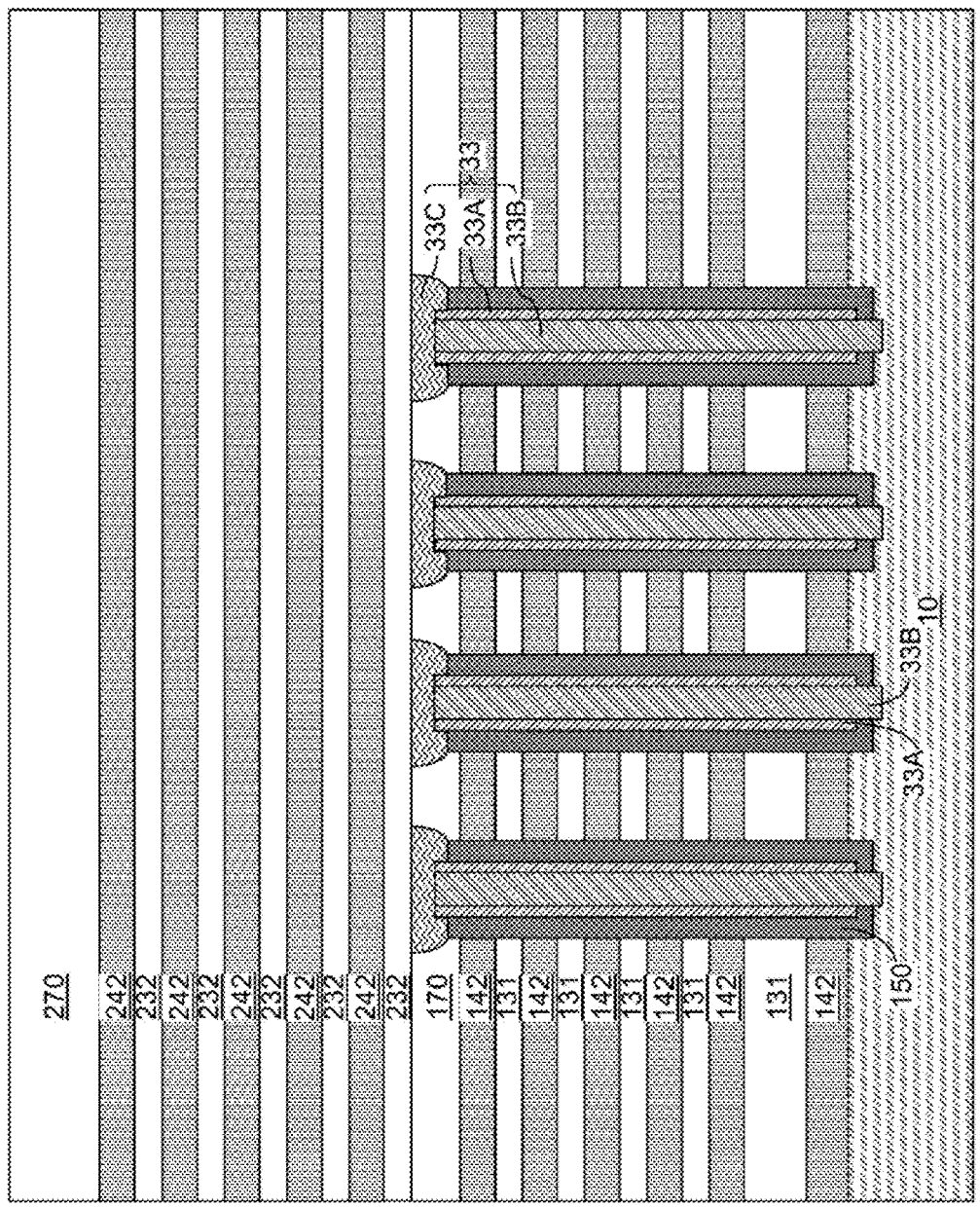
FIG. 29 is a vertical cross-sectional view of the exemplary structure after formation of a second alternating stack of second insulating layers and second spacer material layers according to an embodiment of the present disclosure.

Referring to FIG. 29, at least one additional tier structure can be formed over the first tier structure (131, 142). Each of the at least one additional tier structure can include an alternating stack of insulating layers and sacrificial material layers. For example, a second alternating stack (232, 242) of material layers can be subsequently formed on the top surface of the first tier structure (131, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 131, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 131. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second dielectric cap layer 270 can be subsequently formed over the second stack (232, 242). The dielectric cap layer 270 includes a dielectric material that is different from the material of the second sacrificial material layers 242. In one embodiment, the dielectric cap layer 270 can include silicon oxide. In one embodiment, the first and second sacrificial material layers (142, 242) can comprise silicon nitride. Optionally, second stepped surfaces (not shown) can be region in the contact region in the same manner as formation of the first stepped surfaces. A second retrostepped dielectric material portion may be formed over the second stepped surfaces.

Figure 30A:
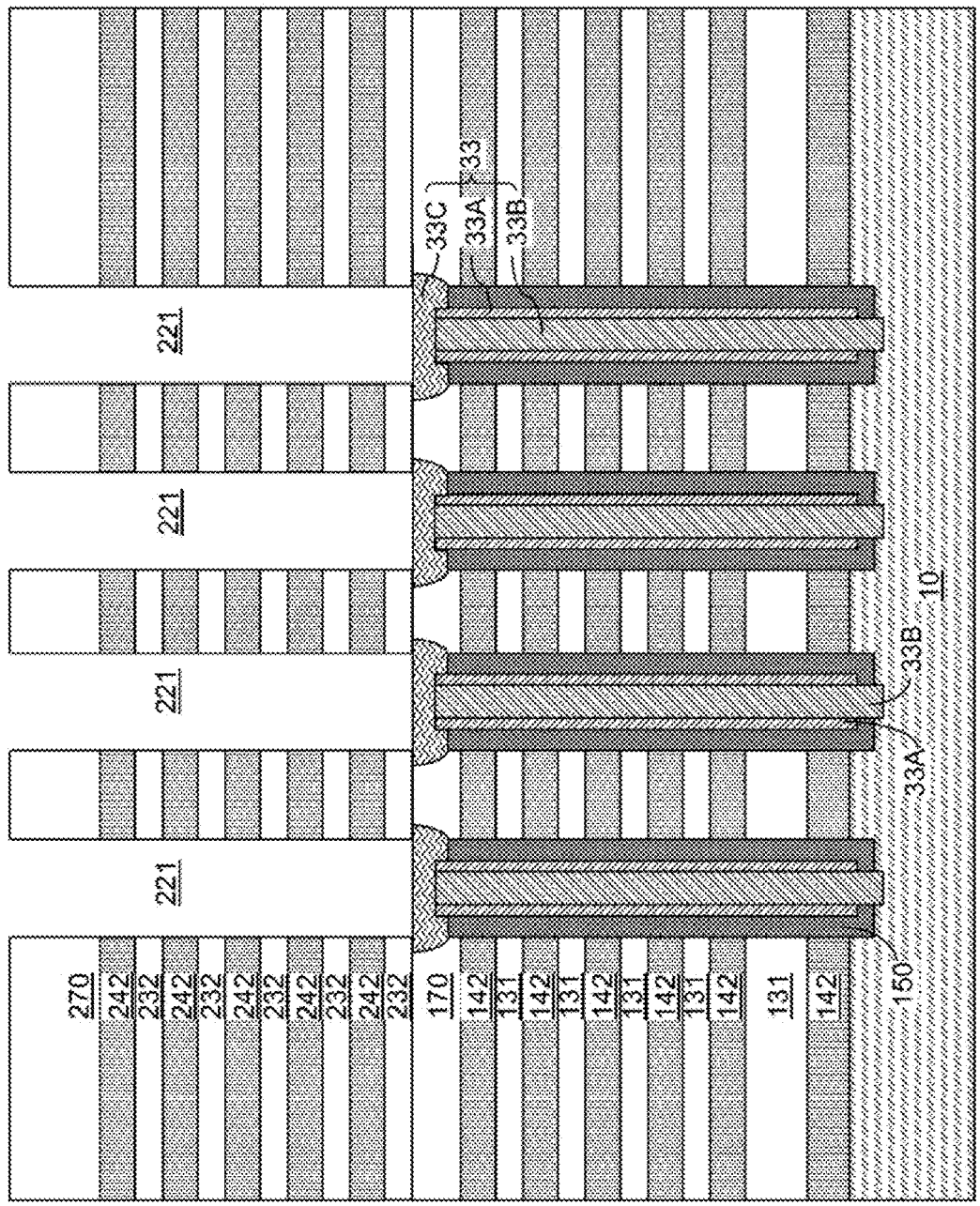
FIGS. 30A and 30B are vertical cross-sectional views of exemplary structures after formation of second memory openings according to alternative embodiments of the present disclosure.

Referring to FIG. 30A, second memory openings 221 can be formed through the second tier structure (232, 242) in an area overlying the first memory openings 121, i.e., in areas that substantially coincides with the areas of the first memory openings 121. The second memory openings 221 can be formed to the top surface of the temporary landing pads 33C. For example, a lithographic material stack (not shown) including at least a photoresist layer can be formed over the second dielectric cap layer 270 and the second tier structure (232, 242), and can be lithographically patterned to form openings within the lithographic material stack. The pattern in the lithographic material stack can be transferred through the entirety of the second tier structure (232, 242) by at least one anisotropic etch that employs the patterned lithographic material stack as an etch mask. Portions of the second dielectric cap layer 270 and the second tier structure (232, 242) underlying the openings in the patterned lithographic material stack are etched to form the second memory openings 221. In other words, the transfer of the pattern in the patterned lithographic material stack through the second dielectric cap layer 270 and the second tier structure (232, 242) forms the second memory openings 221.

In one embodiment, the chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the second memory openings 221 can be substantially vertical, or can be tapered. In one embodiment, the temporary landing pads 33C may be employed as stopping structures for the anisotropic etch process that forms the second memory openings 221. The temporary landing pads 33C increase the overlay tolerance window for the lithography process that aligns the pattern for the openings in the photoresist layer for forming the second memory openings 221 to the underlying pattern of the first memory openings, which are filled with the sets of contiguous sacrificial fill material portions 33. Thus, provided that the overlay variation between the pattern for the opening in the photoresist layer for forming the second memory openings 221 with respect to the underlying pattern of the first memory openings is less than the nominal distance between a sidewall of a second memory opening 221 and an outer periphery of an underlying temporary landing pad 33C, the second memory openings 221 can be laterally contained within the regions that overlie the temporary landing pads 33C, and the possibility of accidental extension of the second memory openings 221 into portions of the first insulating cap layer 170 or the first tier structure (131, 142) can be minimized.

Figure 30B:
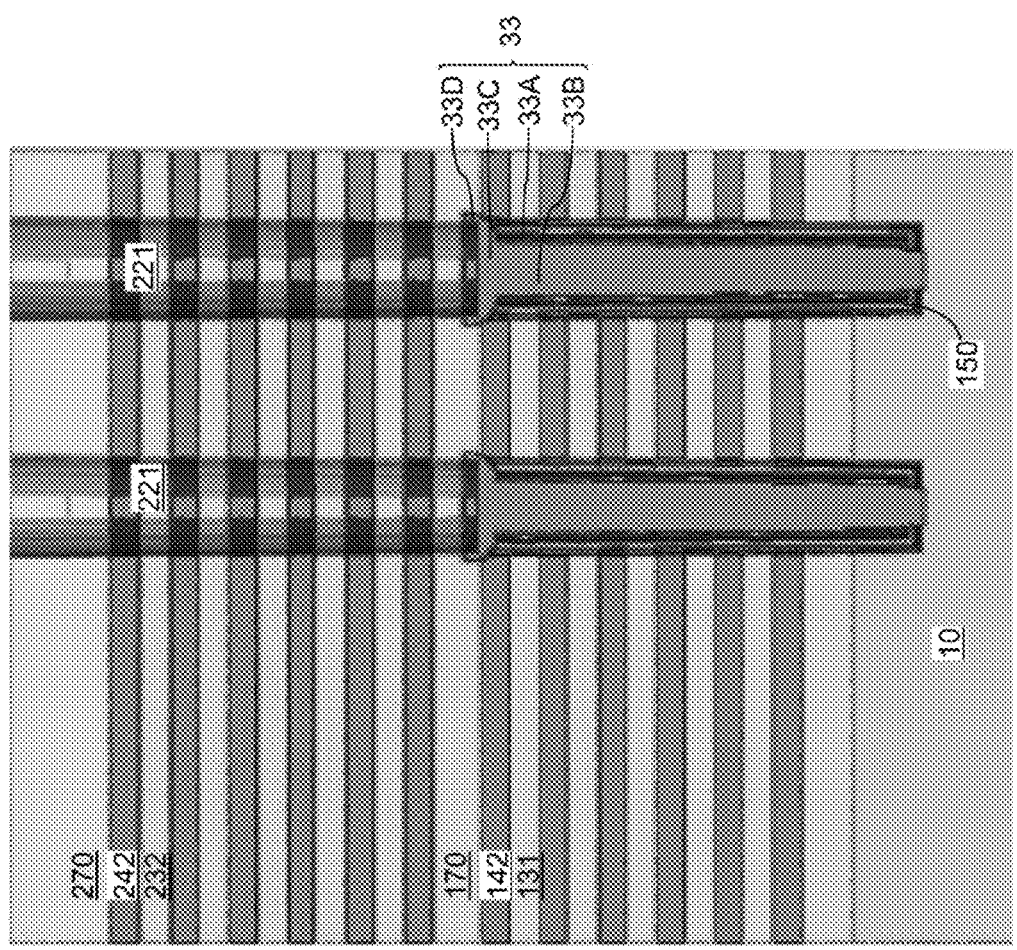

FIG. 30B illustrates an exemplary structure according to an alternative embodiment of the present disclosure. In this embodiment, the etch of the second memory opening 221 extends into the temporary landing pad 33C. This forms an annular rim 33D at the top outer edge of the temporary landing pad 33C which surrounds the bottom part of the second memory opening 221.

Figure 31:
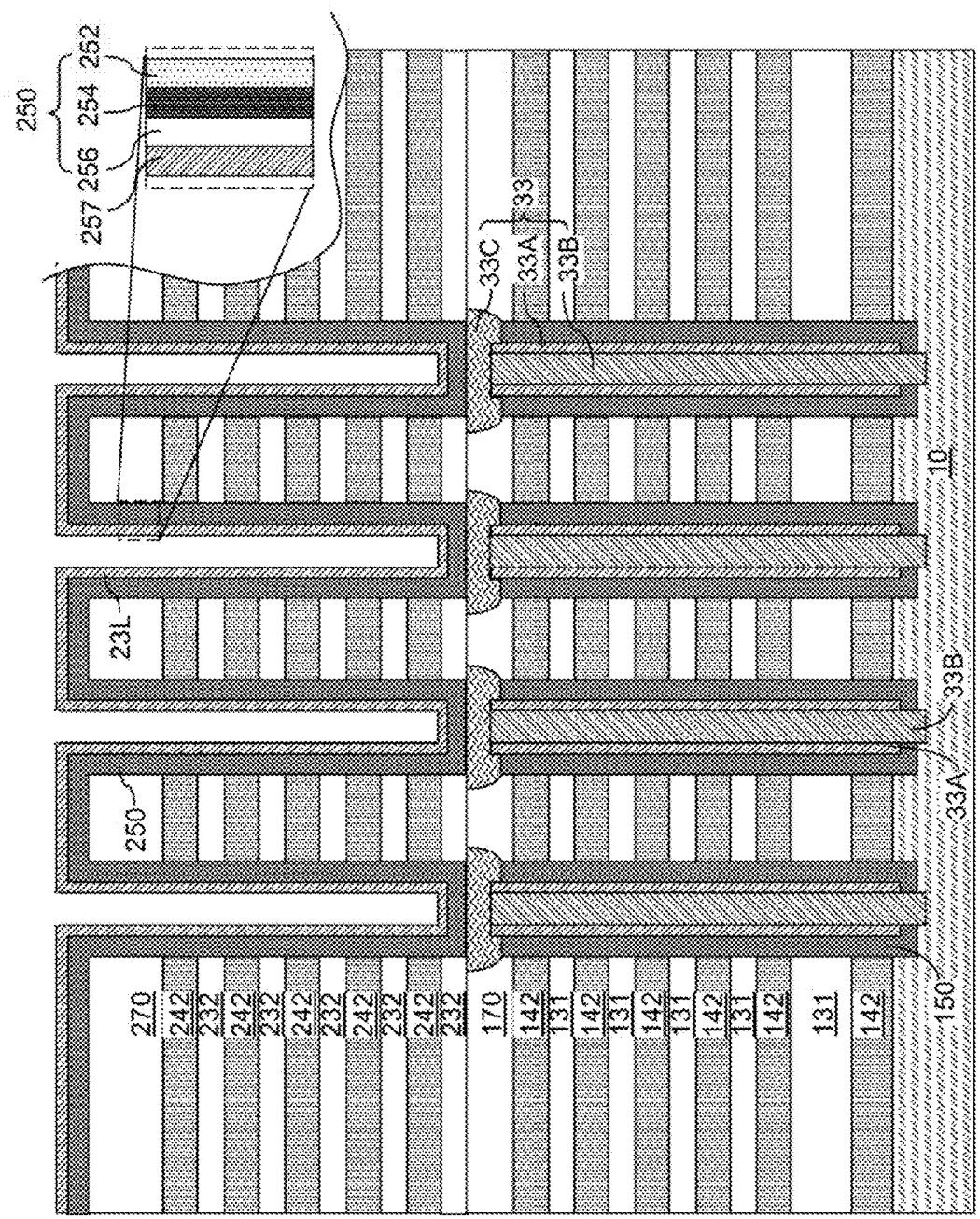
FIG. 31 is a vertical cross-sectional view of the exemplary structure after formation of a second memory film layer and a second sacrificial material liner according to an embodiment of the present disclosure.

Referring to FIG. 31, a second memory film 250 can be formed in the second memory openings 221. The second memory film 250 can have a layer stack of a same type as the first memory film 150. For example, the second memory film 250 can include an optional second blocking dielectric layer 252, a second charge trapping layer 254, and a second tunneling dielectric layer 256. The second blocking dielectric layer 252 can include any material that can be employed for the first blocking dielectric layer 152, and can have the same thickness range as the range of thicknesses that can be employed for the first blocking dielectric layer 152. The second charge trapping layer 254 can include any material that can be employed for the first charge trapping layer 154, and can have the same thickness range as the range of thicknesses that can be employed for the first charge trapping layer 154. The second tunneling dielectric layer 256 can include any material that can be employed for the first tunneling dielectric layer 156, and can have the same thickness range as the range of thicknesses that can be employed for the first tunneling dielectric layer 156. In one embodiment, the second memory film 250 can have the same layer stack as the first memory film 150, and may be formed employing the same deposition methods as the first memory film 150.

A second sacrificial protective liner 23L can be formed over the second memory film 250. The second sacrificial protective liner 23L includes a sacrificial material that can protects inner sidewalls of the second tunneling dielectric layer 256 during a subsequent anisotropic etch process that forms openings through the second memory film 250 at the bottom of each second memory opening 221, and can be subsequently removed selective to the second tunneling dielectric layer 256. In one embodiment, the second sacrificial protective liner 23L can include a semiconductor material (such as polysilicon or amorphous silicon) or a dielectric material such as organosilicate glass, amorphous carbon, or diamond-like carbon (DLC). The thickness of the sacrificial protective liner can be in a range from 1 nm to 3 nm, although lesser and greater thicknesses can also be employed. If the second memory opening 221 extends into the temporary landing pad 33 as shown in FIG. 30D, then the bottom of the second memory film 250 is surrounded by the annular rim 33D of the temporary landing pad 33C.

Figure 32:
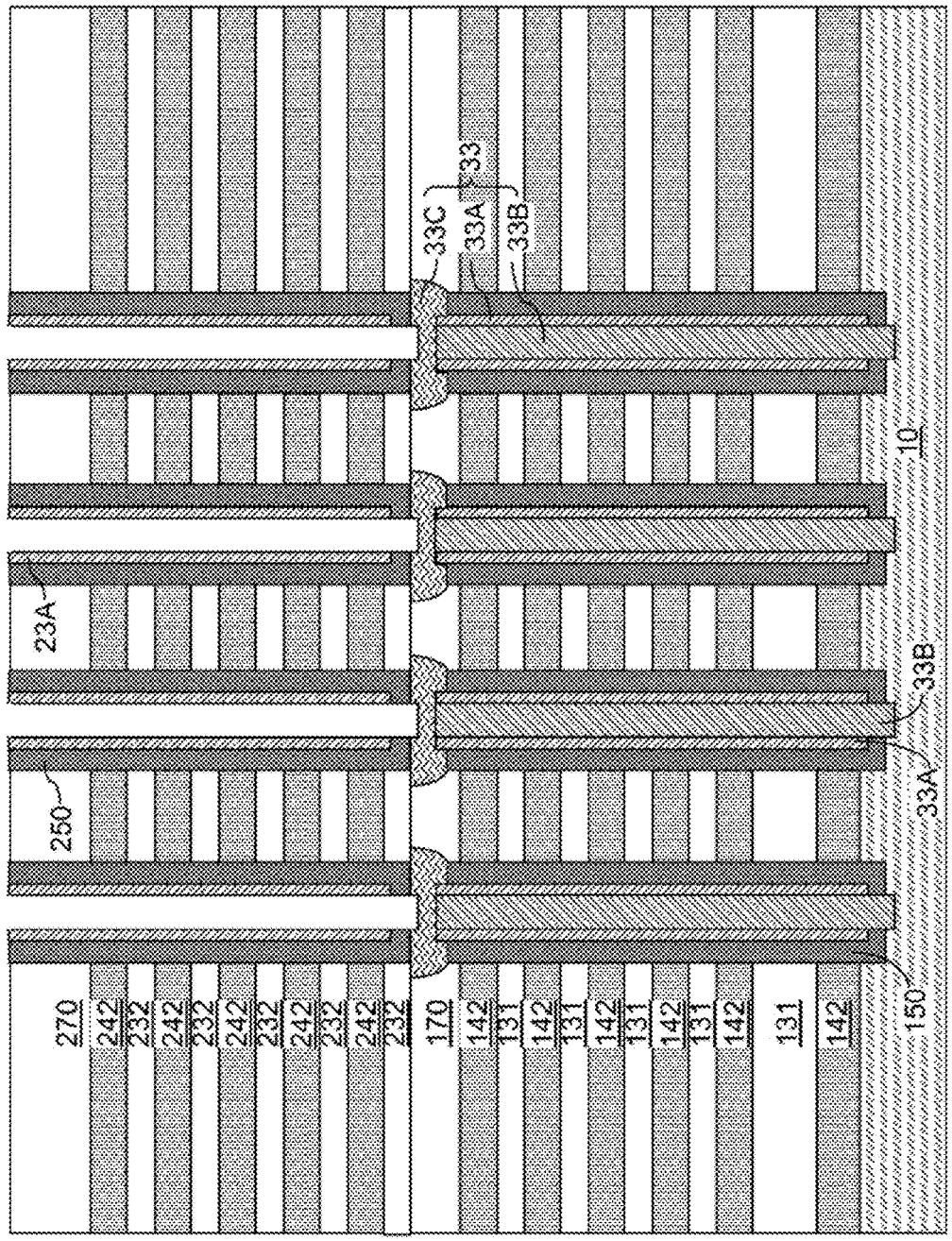
FIG. 32 is a vertical cross-sectional view of the exemplary structure after formation of second memory films according to an embodiment of the present disclosure.

Referring to FIG. 32, an anisotropic etch can be performed to remove horizontal portions of the second sacrificial protective liner 23L and the second memory film 250. A combination of etch chemistries can be employed to sequentially etch the various materials of the second sacrificial protective liner 23L and the second memory film 250. Openings are formed through the second sacrificial protective liner 23L and the second memory film 250 at the bottom of each memory opening to physically expose the temporary landing pad 33. The vertical portions of the second sacrificial protective liner 23L protect the second tunneling dielectric layer 256 during the anisotropic etch. Each remaining portion of the second sacrificial protective liner 23L constitutes a second sacrificial spacer 23A, which includes a sacrificial material and including the sacrificial material of the second sacrificial protective liner 23L. The second sacrificial spacers 23A are cylindrical sacrificial material portions. In one embodiment, the second sacrificial spacers 23A can include a semiconductor material such as polysilicon or amorphous silicon. The second memory film 250 is divided into multiple cylindrical portions that are located within respective memory openings. As such, each second memory opening 221 includes a second memory film 250, which is a portion of the initial second memory film 250 as formed at the processing steps of FIG. 31.

Figure 33:
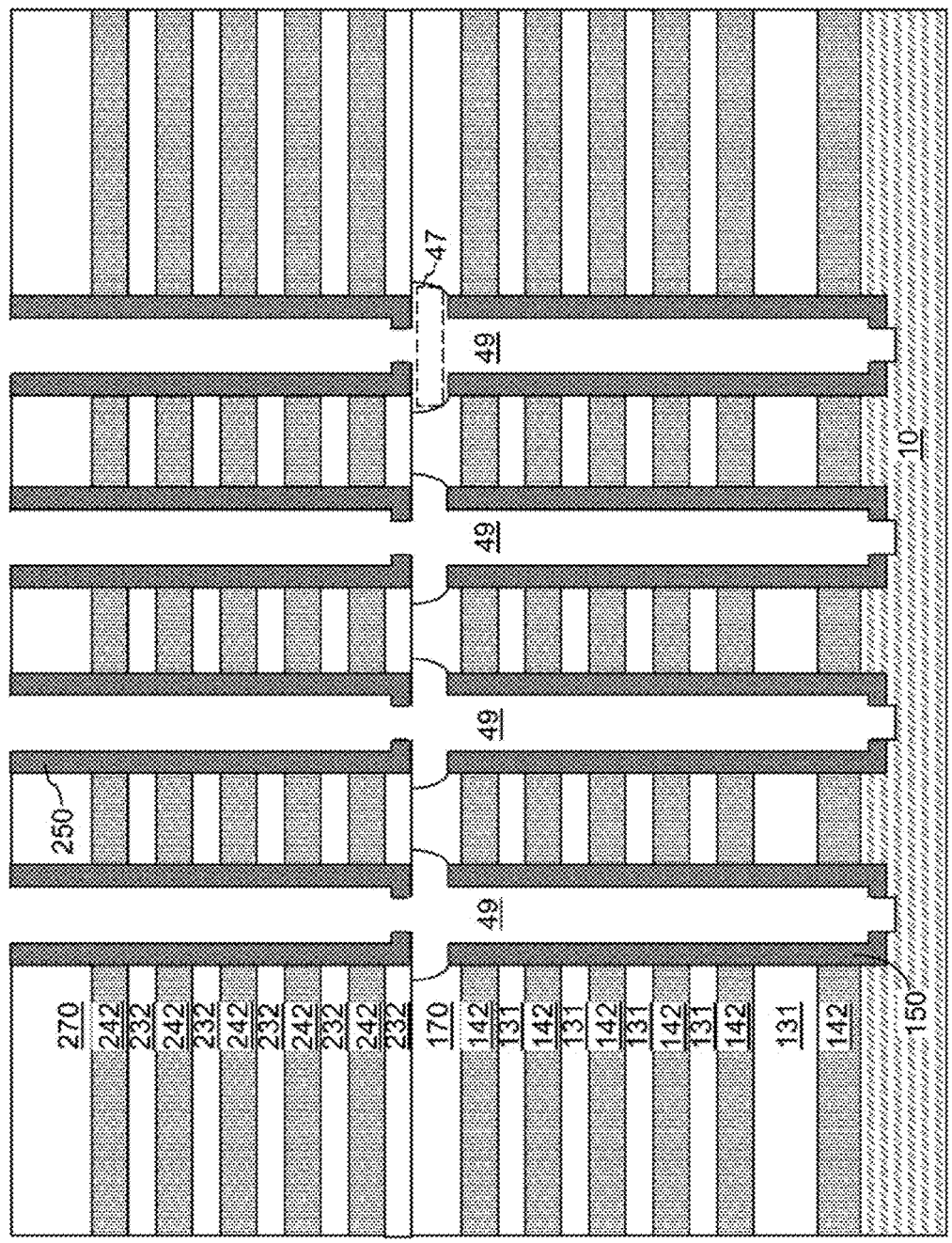
FIG. 33 is a vertical cross-sectional view of the exemplary structure after formation of memory cavities according to an embodiment of the present disclosure.

Referring to FIG. 33, the second sacrificial spacers 23A and the sets of contiguous sacrificial fill material portions 33 can be removed. Specifically, the second sacrificial spacers 23A can be removed from within the second memory openings 221, and the temporary landing pads 33C, the sacrificial pillar structures 33B, and the first sacrificial spacers 33A can be removed from underneath the second memory openings 221 through the openings 221. Laterally protruding cavities 47 are formed in the volumes from which the temporary landing pads 33C are removed. If the temporary landing pads 33C contain the annular rim 33D as shown in FIG. 30B, then the rim 33D is removed together with the pads 33C to leave an annular space around the bottom of the second memory film 250.

In case the second sacrificial spacers 23A and/or the sets of contiguous sacrificial fill material portions 33 comprise a semiconductor material (such as polysilicon or amorphous silicon), an etch chemistry that removes the semiconductor material selective to dielectric materials can be employed. For example, a dry etch employing HCl or any wet etch process can be employed to remove the semiconductor materials of the second sacrificial spacers 23A and/or the sets of contiguous sacrificial fill material portions 33 selective to the dielectric materials of the first and second memory films (150, 250). Alternatively, if the second sacrificial spacers 23A and/or the sets of contiguous sacrificial fill material portions 33 comprise a dielectric material such as organosilicate glass, amorphous carbon, or diamond-like carbon (DLC), a wet etch employing dilute hydrofluoric acid or an ashing process can be employed to remove the second sacrificial spacers 23A and/or the sets of contiguous sacrificial fill material portions 33 selective to the dielectric materials of the first and second memory films (150, 250). A plurality of inter-tier memory openings 49 can be formed through the first and second tier structures (131, 142, 232, 242). As used herein, an inter-tier memory opening 49 refers to a memory opening that extends through at least two tier structures. Each inter-tier memory opening 49 is a combination of a first memory opening 121, a laterally protruding cavity 47, and a second memory opening 221.

Figure 34:
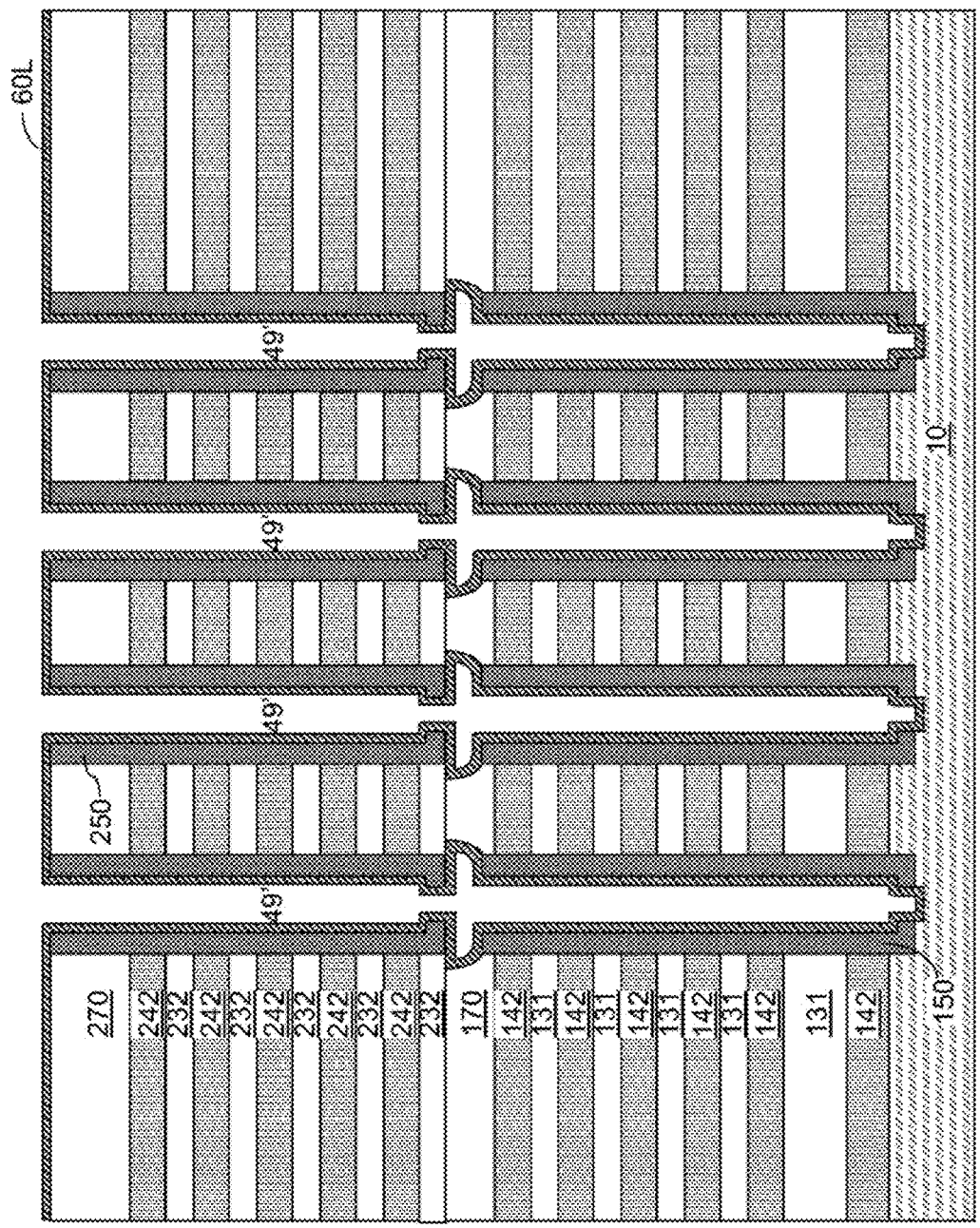
FIG. 34 is a vertical cross-sectional view of the exemplary structure after formation of a semiconductor channel layer according to an embodiment of the present disclosure.

Referring to FIG. 34, a semiconductor channel layer 60L can be deposited on the physically exposed surfaces of the first memory films 150 and the second memory films 250, and directly on the physically exposed sidewalls of the first insulating cap layer 170 (which may include concave sidewalls). The semiconductor channel layer 60L can be formed directly on a bottom surface of a second memory film 250 in an upper portion of each laterally protruding cavity 47 and a top surface of a first memory film at a top portion of each laterally protruding cavity 47.

The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD).

The semiconductor channel layer 60L can have a doping of the first conductivity type (i.e., the same conductivity type as the substrate semiconductor layer 10) or can be substantially intrinsic. As used herein, a semiconductor material is substantially intrinsic if the dopant concentration does not exceed $1.0 \times 10^{16}/cm^3$. In one embodiment, the semiconductor channel layer 60L can include amorphous silicon or polysilicon. The thickness of the semiconductor channel layer 60L can be in a range from 2 nm to 10 nm, although lesser and greater thicknesses can also be employed. A memory cavity 49' is present in each memory opening after formation of the semiconductor channel layer 60L.

Figure 35A:
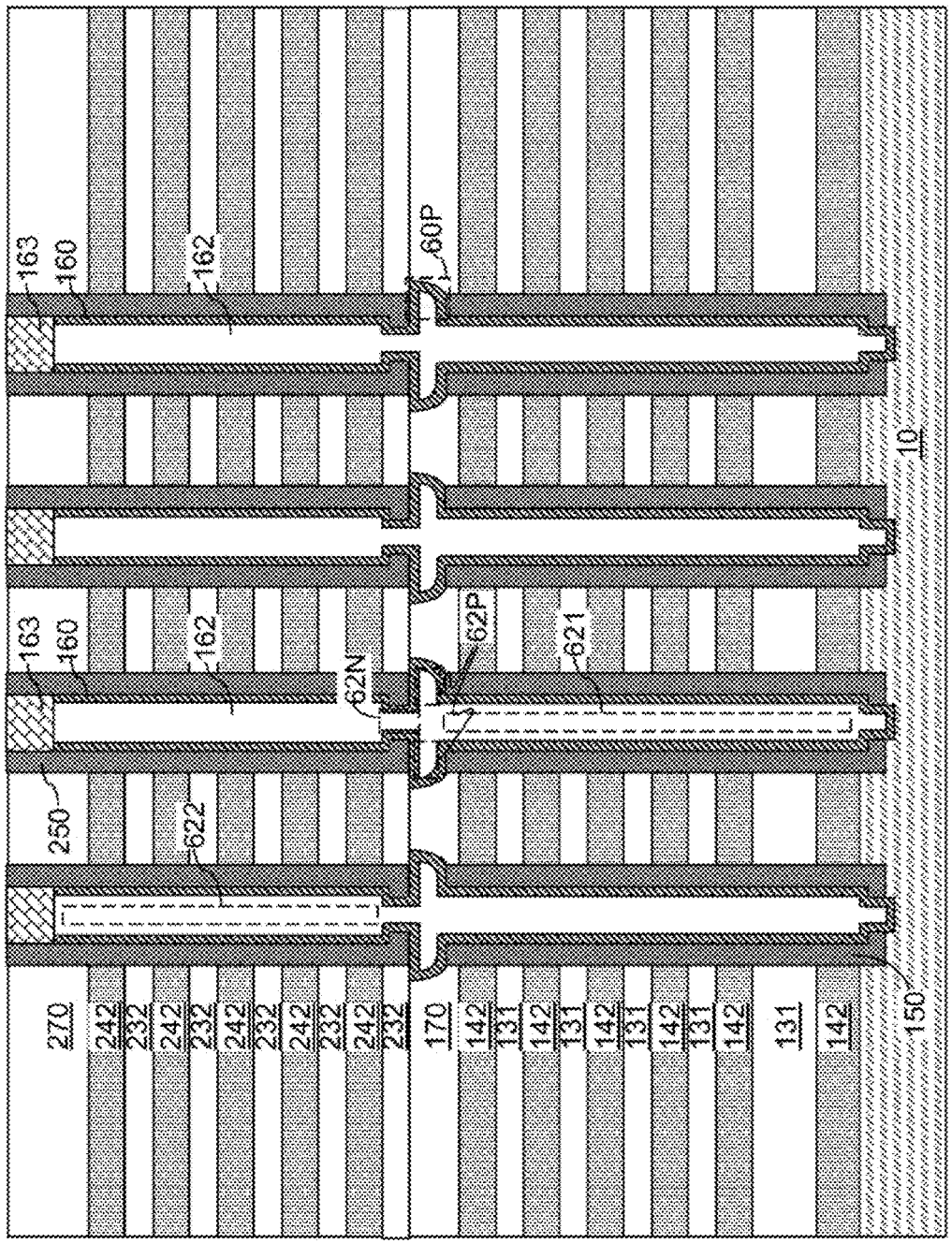
FIGS. 35A and 35B are vertical cross-sectional views of exemplary structures after formation of memory stack structures, dielectric cores, and drain regions according to alternative embodiments of the present disclosure.

Referring to FIG. 35A, a dielectric material is deposited in the memory cavities 49' and over the semiconductor channel layer 60L. The dielectric material can include doped silicate glass, undoped silicate glass, or organosilicate glass. The dielectric material may be deposited employing a conformal deposition process (such as chemical vapor deposition) or a self-planarizing deposition process such as spin-coating. In some embodiments, encapsulated cavities (not shown) may be present in portions of the memory cavities 49' that are not filled with the dielectric material. The encapsulated cavities may include vacuum, air, or inert gas depending on the environment in which the dielectric material is deposited. Each encapsulated cavity can be encapsulated by the dielectric material. In other words, there may not be any path that continuously connects the inside of an encapsulated cavity to a volume outside of the dielectric material.

The portions of the dielectric material and the semiconductor channel layer 60L located above the horizontal plane including the top surface of the second insulating cap layer 270 by a planarization process. The planarization process can employ a recess etch or chemical mechanical planarization. Subsequently, the dielectric material can be vertically recessed selective to the second insulating cap layer 270 employing a recess etch. In one embodiment, the dielectric material can include a doped silicate glass (such as borosilicate glass or phosphosilicate glass) and the second insulating cap layer 270 can include undoped silicate glass, and a wet etch that etches the doped silicate glass faster than the undoped silicate glass can be employed to recess the top surfaces of the remaining portions of the deposited dielectric material relative to the top surface of the second insulating cap layer 270. Each remaining dielectric material portion in the inter-tier memory openings 49 constitutes a dielectric core 162, which may, or may not, include encapsulated cavities therein as discussed above. The top surface of each dielectric core 162 can be located between a first horizontal plane including the top surface of the second insulating cap layer 270 and a second horizontal plane including the bottom surface of the second insulating cap layer 270. A recessed region is formed above each dielectric core 162.

Drain region 163 can be formed by depositing a doped semiconductor material within each recessed region above the dielectric cores 162. The doped semiconductor material can be, for example, doped polysilicon. In one embodiment, the semiconductor material of the semiconductor channel layer 60L can have a doping of the first conductivity type, the doped semiconductor material can have a doping of a second conductivity type that is the opposite of the first conductivity type. For example, if the first conductivity type is p-type, the second conductivity type can be n-type, and vice versa. Excess portions of the deposited semiconductor material can be removed from above the top surface of the second dielectric cap layer 270, for example, by chemical mechanical planarization (CMP) or a recess etch. Each remaining portion of the deposited doped semiconductor material constitutes a drain region 163. Each remaining portion of the semiconductor channel layer 60L constitutes a semiconductor channel 160.

Electrical current can flow through the semiconductor channel 160 when a vertical NAND device including the semiconductor channel 160 is turned on. Each first memory film 150 and each second memory film 250 can store electrical charges with a macroscopic retention time. As used herein, a macroscopic retention time refers to a retention time suitable for operation of a memory device as a permanent memory device such as a retention time in excess of 24 hours. Each adjoining set of a first memory film 150, a second memory film 250, and a semiconductor channel 160 constitutes a memory stack structure (150, 250, 160). The memory stack structure (150, 250, 160) is formed in an inter-tier memory opening 49, which is a combination of a first memory opening 121, a laterally protruding cavity 47, and a second memory opening 221. A first memory film 150 is located inside the first memory opening 121. A second memory film 250 is located inside the second memory opening 221. A semiconductor channel 160 contacts inner sidewalls of the first memory film 150 and the second memory film 250.

Figure 35B:
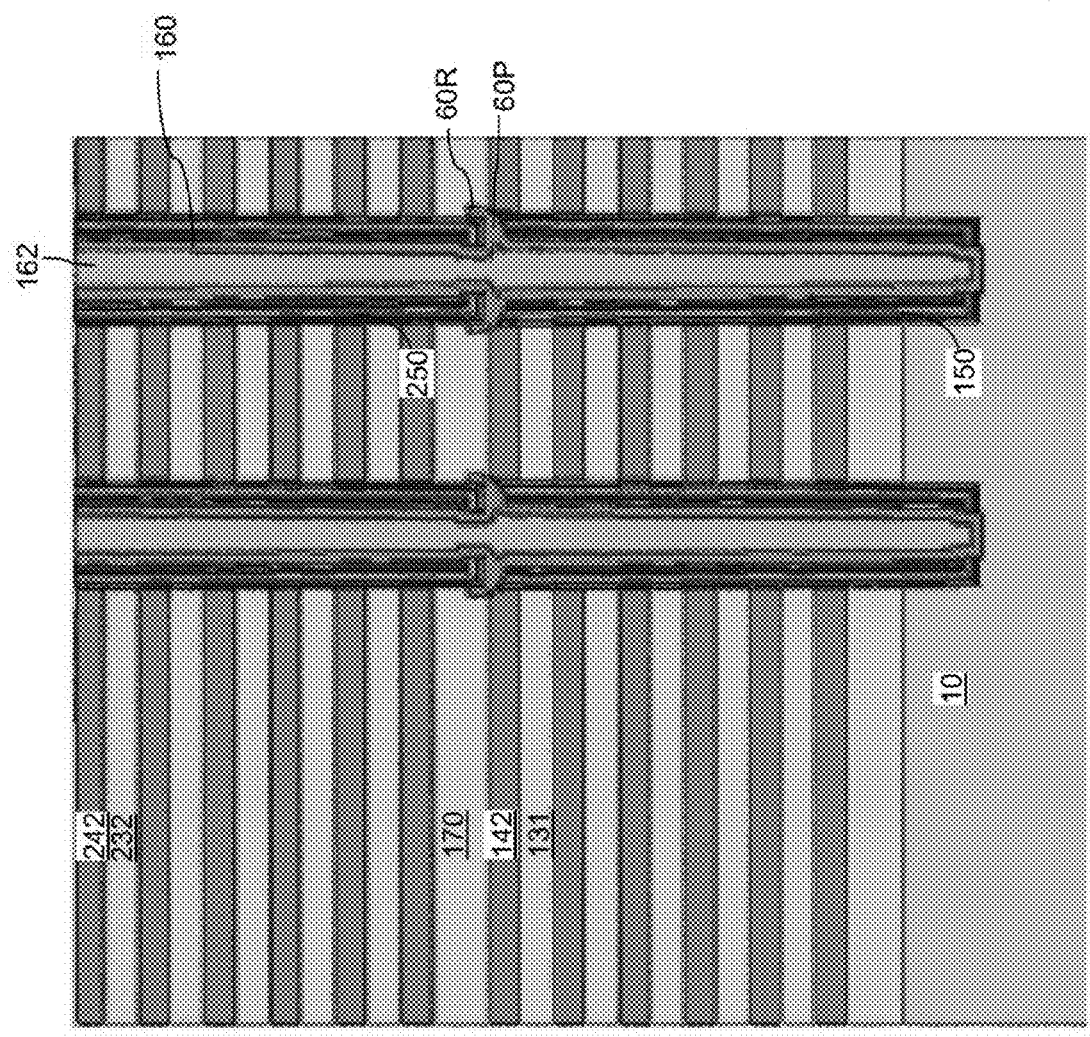

In one embodiment, the first memory film 150 is vertically spaced from the second memory film 250 by a laterally protruding portion 60P of the semiconductor channel 160 such that the first memory film 150 does not contact the second memory film 250. If the temporary landing pads 33C contained the annular rim 33D as shown in FIG. 30B, then the annular space around the bottom of the second memory film 250 comprises a part of the laterally protruding cavity 47. The semiconductor channel 160 is also filled into the annular space of the cavity 47 such that the laterally protruding portion 60P of the semiconductor channel 160 contains an annular rim 60R which surrounds the bottom portion of the second memory film 250 and contacts the insulating cap layer 170, as shown in FIG. 35B.

A dielectric core 162 is located inside the semiconductor channel 160. The dielectric core 162 comprises a laterally protruding portion 62P that laterally extends farther outward than a first portion 62l of the dielectric core 162 surrounded by the first memory film 150 and a second portion 62Z of the dielectric core 162 surrounded by the second memory film 250. Each dielectric core 162 can include a neck portion 62N adjoined to the laterally protruding portion 62P and having a lesser lateral extent than the first portion 62l of the dielectric core 162 and the second portion 62Z of the dielectric core 162.

Figure 36:
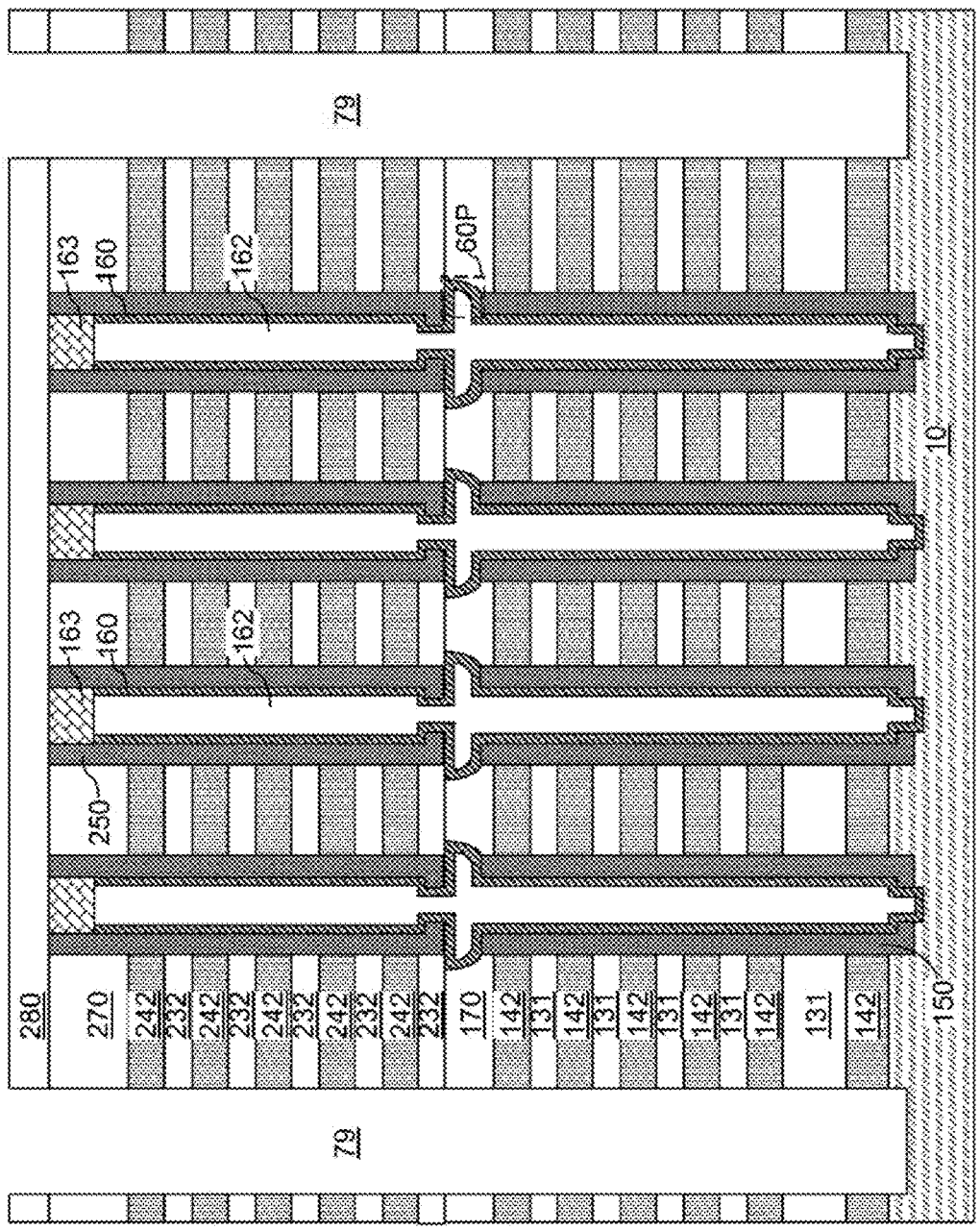
FIG. 36 is a vertical cross-sectional view of the exemplary structure after formation of a planarization material layer and backside trenches according to an embodiment of the present disclosure.

Referring to FIG. 36, a planarization material layer 280 can be formed over the second dielectric cap layer 270. The planarization material layer 280 may be selected as an in-process structure that is consumed during subsequent planarization processes. In one embodiment, the planarization material layer 280 can include a silicon oxide material deposited by chemical vapor deposition such as tetraethylorthosilicate (TEOS) silicon oxide. The thickness of the planarization material layer 280 can be in a range from 50 nm to 300 nm, although lesser and greater thicknesses can also be employed.

At least one backside trench 79 can be formed through the upper and first tier structures, for example, by applying a photoresist layer (not shown), lithographically patterning the photoresist layer, and transferring the pattern in the photoresist layer through the upper and first tier structures employing an anisotropic etch. The anisotropic etch that forms the at least one backside trench 79 can stop on the substrate 10. The photoresist layer can be subsequently removed, for example, by ashing.

Figure 37:
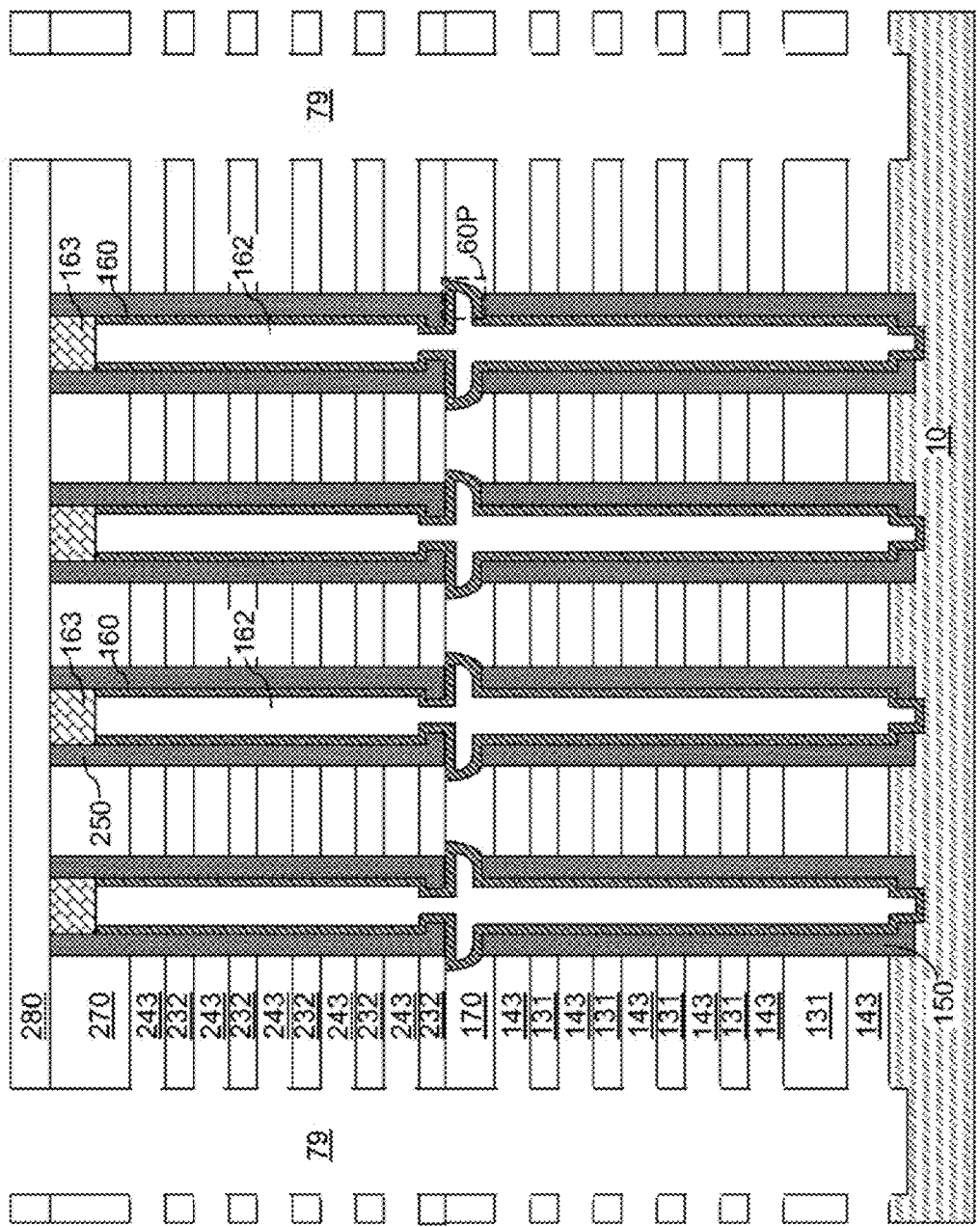
FIG. 37 is a vertical cross-sectional view of the exemplary structure after formation of backside recesses by removal of the sacrificial material layers according to an embodiment of the present disclosure.

Referring to FIG. 37, an etchant that selectively etches the materials of the first and second sacrificial material layers (142, 242) with respect to the materials of the first and second insulating layers (131, 232), the material of the substrate semiconductor layer 10, and the first and second dielectric cap layers (170, 270) can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. In one embodiment, the first and second sacrificial material layers (142, 242) can include silicon nitride, and the materials of the first and second insulating layers (131, 232), can be silicon oxide. In another embodiment, the first and second sacrificial material layers (142, 242) can include a semiconductor material such as germanium or a silicon-germanium alloy, and the materials of the first and second insulating layers (131, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 10. A backside recess (143, 243) can be vertically bounded by a top surface of an underlying insulating layer (131 or 232) and a bottom surface of an overlying insulating layer (131 or 232). In one embodiment, each of the first and second backside recesses (143, 243) can have a uniform height throughout. In some other embodiments, the first and second backside recesses (143, 243) may have height variations therein.

Figure 38:
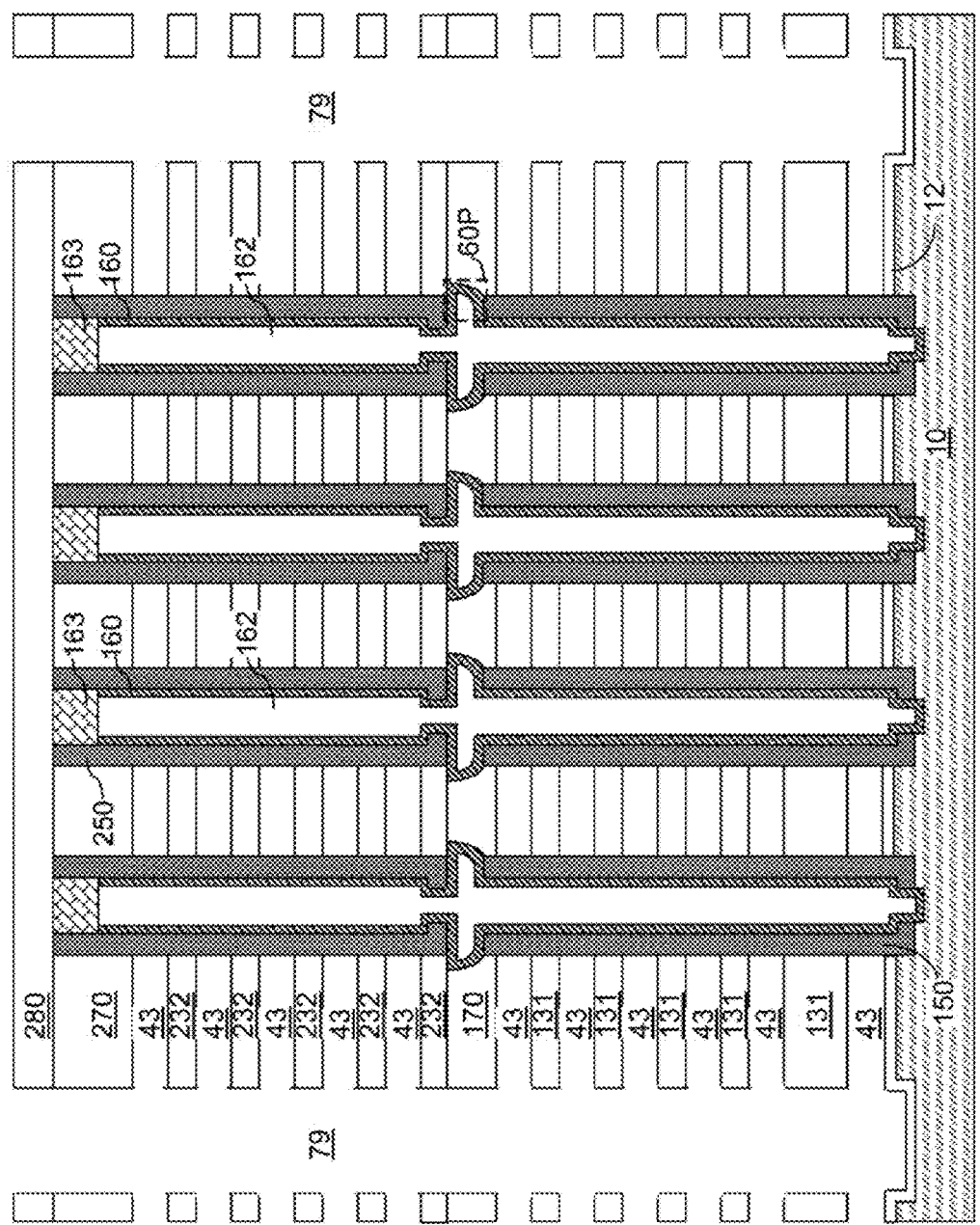
FIG. 38 is a vertical cross-sectional view of the exemplary structure after formation of a gate dielectric layer according to an embodiment of the present disclosure.

Referring to FIG. 38, a gate dielectric layer 12 can be formed by converting surface portions of the substrate semiconductor layer 10 into a continuous dielectric material layer. In one embodiment, the gate dielectric layer 12 can be formed by thermal conversion of the surface portions of the substrate semiconductor layer 10. In one embodiment, the thermal conversion process can include a thermal oxidation process and/or a thermal nitridation process. In one embodiment, the gate dielectric layer 12 can include a thermal oxide of the semiconductor material of the substrate semiconductor layer 10. The gate dielectric layer 12 can be formed as a single continuous layer.

Figure 39:
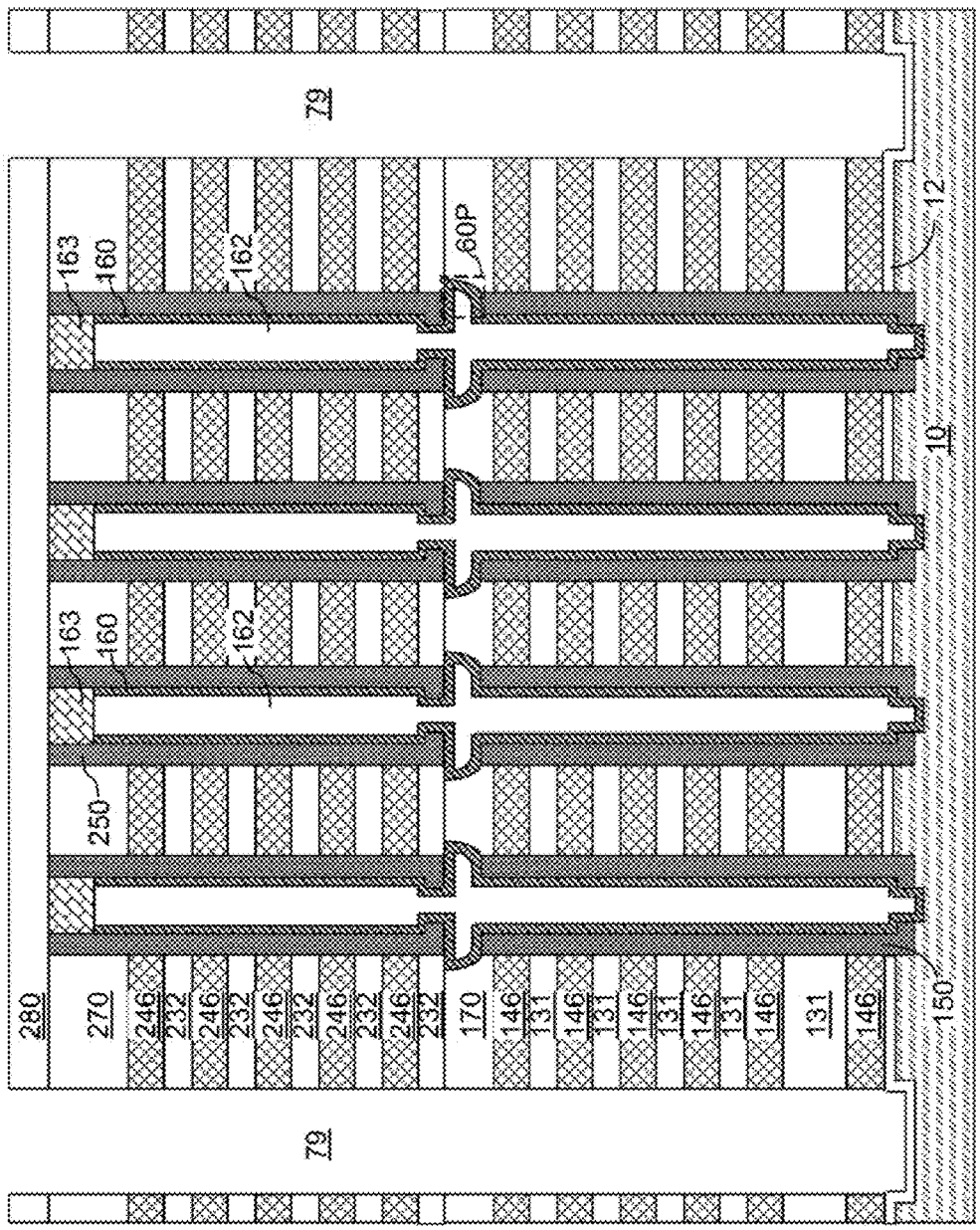
FIG. 39 is a vertical cross-sectional view of the exemplary structure after formation of electrically conductive layers according to an embodiment of the present disclosure.

Referring to FIG. 39, an optional backside blocking dielectric layer (not shown) can be deposited in the backside recesses (143, 243) and the backside trenches 79 and over the planarization dielectric layer 280. The backside blocking dielectric layer includes a dielectric material such as a dielectric metal oxide, silicon oxide, or a combination thereof. In one embodiment, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), over the sidewalls of the backside trench 79, and over the planarization dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer can be formed on the sidewalls of each backside trench 79 and over the planarization dielectric layer 280. In embodiments in which the first spacer material layers and the second spacer material layers are provided as first sacrificial material layers 142 and second sacrificial material layers 242, the first and second sacrificial material layers (142, 242) can be replaced with the first and second conductive material layers (146, 246), respectively. Specifically, each first sacrificial material layer 142 can be replaced with a portion of the backside blocking dielectric layer and a first electrically conductive layer 146, and each second sacrificial material layer 242 can be replaced with a portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Residual material can be removed from each backside trench 79. Specifically, the deposited metallic material of the continuous metallic material layer can be etched back from the sidewalls of each backside trench 79 and from above the planarization dielectric layer 280, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

Each electrically conductive layer (146, 246) except the bottommost electrically conductive layer (i.e., the bottommost first electrically conductive layer 146) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including the memory stack structures (150, 250, 160).

The bottommost first electrically conductive layer 146 can be a source select gate electrode located over the gate dielectric layer 12, which can control activation of a horizontal channel portion of a semiconductor channel that extends between a source region to be subsequently formed underneath each backside trench 79 and a drain region 163 connected to an activated memory stack structure (150, 250, 160). In one embodiment, the backside blocking dielectric layer may be present as a single continuous material layer. In another embodiment, the vertical portions of the backside blocking dielectric layer may be removed from within the backside trenches 79, and the backside blocking dielectric layer can have a plurality of physically disjoined backside blocking dielectric layer portions that are located at each level of the electrically conductive layers (146, 246).

Figure 40:
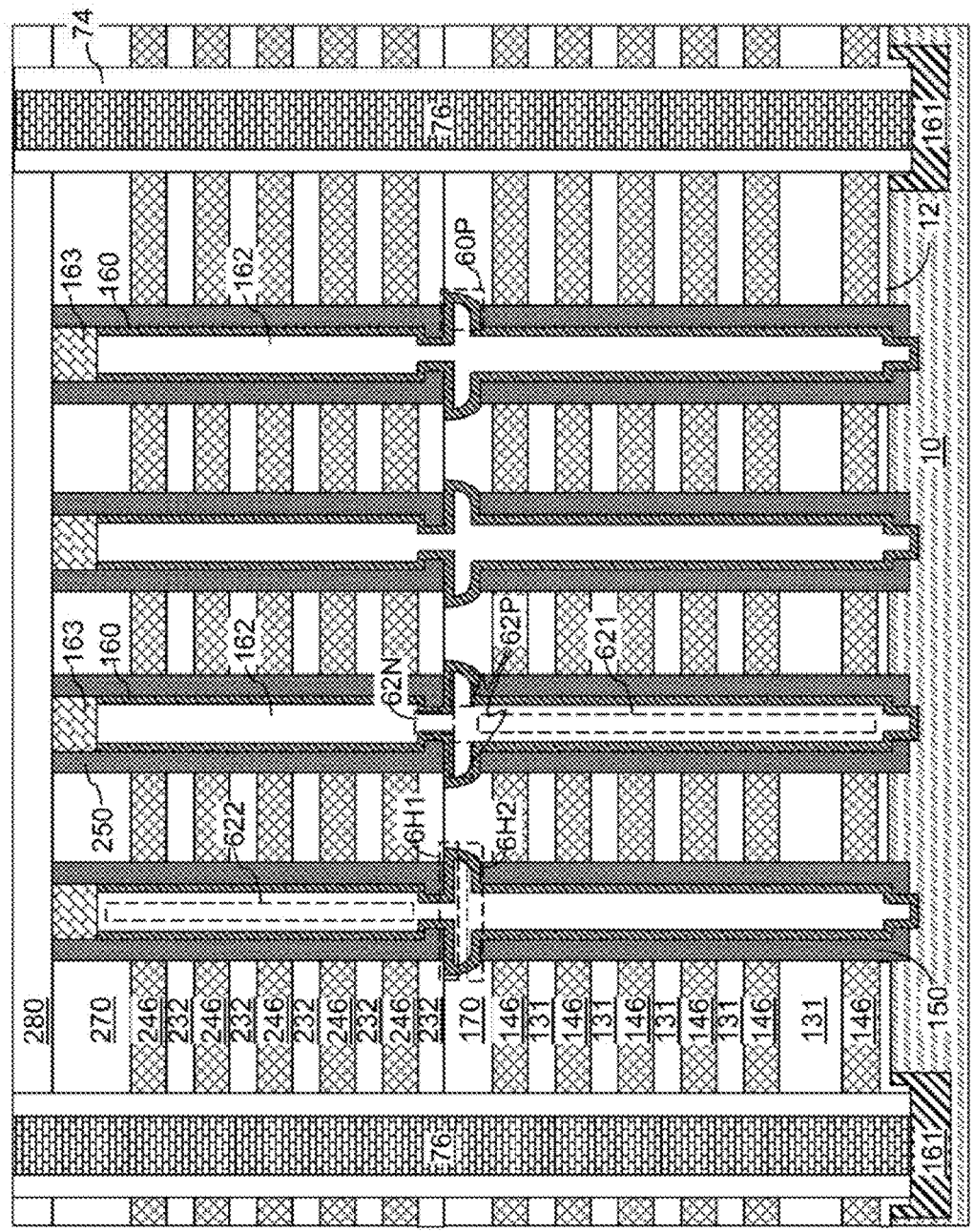
FIG. 40 is vertical cross-sectional view of the exemplary structure after formation of source regions, insulating spacers, and backside contact via structures according to an embodiment of the present disclosure.

Referring to FIG. 40, dopants of a second conductivity type, which is the opposite of the first conductivity type of the substrate semiconductor layer 10, can be implanted into a surface portion of the substrate semiconductor layer 10 to form a first active region 61 underneath the bottom surface of each backside trench 79. As used herein, an "active region" refers to a source region, a drain region, an emitter, or a collector of a transistor. An insulating spacer 74 including a dielectric material can be formed at the periphery of each backside trench 79, for example, by deposition of a conformal insulating material (such as silicon oxide) and a subsequent anisotropic etch. The planarization dielectric layer 280 may be thinned due to a collateral etch during the anisotropic etch that removes the vertical portions of horizontal portions of the deposited conformal insulating material.

A backside contact via structure 76 can be formed in the remaining volume of each backside trench 79, for example, by deposition of at least one conductive material and removal of excess portions of the deposited at least one conductive material from above a horizontal plane including the top surface of the planarization dielectric layer 280 by a planarization process such as chemical mechanical planarization or a recess etch. Each backside contact via structure 76 can include a metallic liner (which may include TiN, TaN, or WN) and a metal fill material portion including a metal (such as W, Ru, Cu, or Co). The planarization dielectric layer 280 can be thinned and/or removed during a latter part of the planarization process, which may employ chemical mechanical planarization (CMP), a recess etch, or a combination thereof. Each backside contact via structure 76 can be formed through the at least one tier structure (131, 146, 232, 246) and on a source region 61.

Subsequently, suitable contact via structures can be formed on various nodes of the memory device, which can include, for example, drain contact via structures (not shown) that contact respective drain regions 163 and word line contact via structures (not shown) that contact a subset of the electrically conductive layers (146, 246) that function as the word lines of the memory device.

According to an aspect of the present disclosure, the memory device can be a monolithic three-dimensional memory device that comprises a first tier structure (131, 146) located over a top surface of a substrate 10 and comprising a first alternating stack of first insulating layers 131 and first electrically conductive layers 146; an insulating cap layer (i.e., a first insulating cap layer 170) overlying the first tier structure (131, 146); a second tier structure (232, 246) located over the insulating cap layer 170 and comprising a second alternating stack of second insulating layers 232 and second electrically conductive layers 246; and a memory stack structure (150, 250, 160) comprising a first memory film 150 located within the first tier structure (131, 146), a second memory film 250 located within the second tier structure (232, 246), and a semiconductor channel 160 that extends through the second tier structure (232, 246), the insulating cap layer 170, and the first tier structure (131, 146). The semiconductor channel 160 contacts the insulating cap layer 170. The first memory film 150 does not contact the second memory film 250.

In one embodiment, the semiconductor channel 160 is laterally spaced from the first tier structure (131, 146) by the first memory film 150, and is laterally spaced from the second tier structure (232, 246) by the second memory film 250. In one embodiment, the first memory film 150 is vertically spaced from the second memory film 250 by a laterally protruding portion 60P of the semiconductor channel 160 such that the first memory film 150 does not contact the second memory film 250. In one embodiment, the laterally protruding portion 60P of the semiconductor channel 160 comprises a convex sidewall in physical contact with a concave sidewall of the insulating cap layer 170. In one embodiment, the laterally protruding portion 60P of the semiconductor channel 160 protrudes farther outward than outer sidewalls of the first memory film 150 and the second memory film 250.

In one embodiment, a first horizontal portion 6H1 (which can be a first annular horizontal portion) of the semiconductor channel 160 can be in contact with a horizontal annular bottom surface of the second memory film 250. In one embodiment, a second horizontal portion 6H2 (which can be a second annular horizontal portion) of the semiconductor channel 160 can be in contact with an annular top surface of the first memory film 150.

In one embodiment, each of the first and second memory films (150, 250) can comprise a tunneling dielectric layer (156 or 256) laterally surrounding the semiconductor channel 160, a plurality of charge storage regions laterally surrounding (i.e., located on the outside) of the tunneling dielectric layer (256 or 256) (as embodied as portions of a charge trapping layer (154 or 254) that are located at the levels of the electrically conductive layers (146, 246); and a blocking dielectric layer (152 or 252) laterally surrounding a respective plurality of charge storage regions.

In one embodiment, a dielectric core 162 can be located within (i.e., surrounded by) the semiconductor channel 160. The dielectric core 162 comprises a laterally protruding portion 62P that laterally extends farther outward than a first portion 621 of the dielectric core 162 surrounded by the first memory film 150 and a second portion 622 of the dielectric core 162 surrounded by the second memory film 250. In one embodiment, the dielectric core 162 comprises a neck portion 62N adjoined to the laterally protruding portion 62P and having a lesser lateral extent than the first portion of the dielectric core 621 and the second portion of the dielectric core 622.

In one embodiment, the monolithic three-dimensional memory structure comprises a monolithic three-dimensional NAND memory device. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

The embodiments of the present disclosure can be employed to provide temporary landing pads 33C that are self-aligned to the underlying first memory opening 121. Formation of the temporary landing pads 33C does not require any lithographic patterning because an isotropic etch is employed to form the recess cavities 33E. The temporary landing pads 33C laterally protrude from the sidewalls of the first memory openings 121 by a same lateral distance, which is determined by the extent of the isotropic etch employed to form the recess cavities 33E. Thus, use of the temporary landing pads 33C of the present disclosure can increase the lithographic overlay process window for alignment of the second memory openings 221 to the first memory openings 121, and thus, increase the yield and/or decrease the manufacturing cost during fabrication of a three-dimensional NAND memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   a first tier structure located over a top surface of a substrate and comprising a first alternating stack of first insulating layers and first electrically conductive layers;
   an insulating cap layer overlying the first tier structure;
   a second tier structure located over the insulating cap layer and comprising a second alternating stack of second insulating layers and second electrically conductive layers; and
   a memory stack structure comprising a first memory film located within the first tier structure, a second memory film located within the second tier structure, and a semiconductor channel that extends through the second tier structure, the insulating cap layer, and the first tier structure, wherein the semiconductor channel contacts the insulating cap layer.

2. The monolithic three-dimensional memory device of claim 1, wherein the semiconductor channel is laterally spaced from the first tier structure by the first memory film, and is laterally spaced from the second tier structure by the second memory film.

3. The monolithic three-dimensional memory device of claim 1, wherein the first memory film is vertically spaced from the second memory film by a laterally protruding portion of the semiconductor channel such that the first memory film does not contact the second memory film.

4. The monolithic three-dimensional memory device of claim 3, wherein the laterally protruding portion of the semiconductor channel comprises a convex sidewall in physical contact with a concave sidewall of the insulating cap layer and an annular rim which surrounds a bottom portion of the second memory film and contacts the insulating cap layer.

5. The monolithic three-dimensional memory device of claim 3, wherein the laterally protruding portion of the semiconductor channel protrudes farther outward than outer sidewalls of the first memory film and the second memory film.

6. The monolithic three-dimensional memory device of claim 1, wherein a first horizontal portion of the semiconductor channel is in contact with a horizontal annular bottom surface of the second memory film.

7. The monolithic three-dimensional memory device of claim 6, wherein a second horizontal portion of the semiconductor channel is in contact with an annular top surface of the first memory film.

8. The monolithic three-dimensional memory device of claim 1, wherein each of the first and second memory films comprises:
   a tunneling dielectric layer laterally surrounding the semiconductor channel;
   a plurality of charge storage regions located outside of the tunneling dielectric layer; and
   a blocking dielectric layer laterally surrounding a respective plurality of charge storage regions.

9. The monolithic three-dimensional memory device of claim 1, further comprising a dielectric core located within the semiconductor channel and comprising a laterally protruding portion that laterally extends farther outward than a first portion of the dielectric core surrounded by the first memory film and a second portion of the dielectric core surrounded by the second memory film.

10. The monolithic three-dimensional memory device of claim 1, wherein the dielectric core comprises a neck portion adjoined to the laterally protruding portion and having a lesser lateral extent than the first portion of the dielectric core and the second portion of the dielectric core.

11. The monolithic three-dimensional memory device of claim 1, wherein:
   the monolithic three-dimensional memory device comprises a monolithic three-dimensional NAND memory device;
   the first and second electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
   a plurality of semiconductor channels, wherein at least one end portion of each of the plurality of semiconductor channels extends substantially perpendicular to a top surface of the substrate;
   a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *